US010020115B2

(12) United States Patent
Wang et al.

(10) Patent No.: US 10,020,115 B2
(45) Date of Patent: Jul. 10, 2018

(54) HIGH TEMPERATURE DIELECTRIC MATERIALS, METHOD OF MANUFACTURE THEREOF AND ARTICLES COMPRISING THE SAME

(71) Applicant: The Penn State Research Foundation, University Park, PA (US)

(72) Inventors: Qing Wang, Collegeville, PA (US); Qi Li, State College, PA (US)

(73) Assignee: THE PENN STATE RESEARCH FOUNDATION, University Park, PA (US)

(*) Notice: Subject to any disclaimer, the term of this patent is extended or adjusted under 35 U.S.C. 154(b) by 145 days.

(21) Appl. No.: 15/165,087

(22) Filed: May 26, 2016

(65) Prior Publication Data
US 2017/0162325 A1   Jun. 8, 2017

Related U.S. Application Data

(60) Provisional application No. 62/166,355, filed on May 26, 2015.

(51) Int. Cl.
| | |
|---|---|
| *H01G 4/14* | (2006.01) |
| *C08L 65/00* | (2006.01) |
| *C08L 83/14* | (2006.01) |
| *H01G 4/005* | (2006.01) |
| *C08K 3/38* | (2006.01) |
| *C08K 3/20* | (2006.01) |
| *C08K 3/28* | (2006.01) |
| *C08G 61/12* | (2006.01) |
| *C08G 77/48* | (2006.01) |

(52) U.S. Cl.
CPC .............. *H01G 4/14* (2013.01); *C08K 3/20* (2013.01); *C08K 3/28* (2013.01); *C08K 3/38* (2013.01); *C08L 65/00* (2013.01); *C08L 83/14* (2013.01); *H01G 4/005* (2013.01); *C08G 61/12* (2013.01); *C08G 77/48* (2013.01); *C08K 2003/385* (2013.01)

(58) Field of Classification Search
None
See application file for complete search history.

(56) References Cited

U.S. PATENT DOCUMENTS

| | | | | |
|---|---|---|---|---|
| 5,739,193 | A * | 4/1998 | Walpita | C08K 3/22 361/321.4 |
| 6,510,456 | B1 * | 1/2003 | Ikegaya | G06F 11/1456 707/999.01 |
| 2002/0078793 | A1 * | 6/2002 | Holl | C08K 3/01 75/230 |
| 2007/0085194 | A1 | 4/2007 | Mao et al. | |
| 2010/0079926 | A1 * | 4/2010 | Tan | H01G 4/06 361/311 |
| 2010/0240804 | A1 * | 9/2010 | Irwin | B82Y 30/00 523/216 |
| 2011/0045223 | A1 | 2/2011 | Lin et al. | |
| 2012/0081833 | A1 * | 4/2012 | Cao | C08G 73/1042 361/301.5 |
| 2014/0355173 | A1 * | 12/2014 | Odle | H01G 4/18 361/301.5 |

FOREIGN PATENT DOCUMENTS

WO    2006100545 A1    9/2006

OTHER PUBLICATIONS

Coleman et al., "Two-Dimensional Nanosheets Produced by Liquid Exfoliation of Layered Materials";Science 331; 2011; pp. 568-571.
Chon et al.; "High-K Dielectric Sol-Gel Hybrid Materials Containing Barium Titanate Nanoparticles"; Chem. Mater.; vol. 22, 2010, pp. 5445-5452.
International Search Report for International Application No. PCT/US2016/034248; International Filing Date May 26, 2016; dated Aug. 29, 2016, 6 pages.
Written Opinion for International Application No. PCT/US2016/034248; International Filing Date May 26, 2016; dated Aug. 29, 2016, 6 pages.

* cited by examiner

Primary Examiner — Marc S Zimmer
(74) Attorney, Agent, or Firm — Cantor Colburn LLP

(57) ABSTRACT

Disclosed herein is a dielectric composite comprising an organic polymer that has a glass transition temperature greater than or equal to about 250° C.; and a dielectric filler present in an amount effective to impart to the dielectric composite a dielectric constant that varies by less than 5% over a temperature range of 25° C. to 300° C., with an applied alternating electric field having a frequency of $10^4$ Hz and a maximum operating electric field strength of at least 250 megavolt per meter. Disclosed herein too is a method of manufacturing the dielectric composite and articles that contain the dielectric composite.

17 Claims, 50 Drawing Sheets

HIGH TEMPERATURE DIELECTRIC MATERIALS, METHOD OF MANUFACTURE THEREOF AND ARTICLES COMPRISING THE SAME

This application claims the benefit of U.S. provisional application Ser. No. 62/166,355, filed May 26, 2015, the content of which is incorporated by reference herein in its entirety.

STATEMENT REGARDING FEDERALLY SPONSORED RESEARCH OR SUPPORT

This invention was made with government support under Contract No. N00014-11-1-0342, awarded by the Office of Naval Research. The Government has certain rights in the invention.

BACKGROUND

Disclosed herein are high temperature dielectric composites, methods of manufacture thereof and articles comprising the same.

Dielectric materials that contain polymers have long been regarded as ideal choices for many power electronics, power conditioning, and pulsed power applications. Dielectric materials that store energy electrostatically are ubiquitous in advanced electronics and electric power systems. Compared to their ceramic counterparts, polymer dielectrics enjoy inherent advantages of scalability, low density and the ability to be shaped into intricate configurations in addition to their higher breakdown strengths. However, the best commercially available dielectric polymer represented by bi-axially oriented polypropylene (BOPP) can operate only at temperatures below 105° C.

In general, polymers begin to undergo thermal deformation and degradation at relatively low temperatures and hence fail to meet the ever-rising demand for electricity under extreme environmental conditions experienced in applications such as hybrid and electric vehicles, aerospace power electronics, and downhole oil and gas exploration.

Because of the inability of dielectric composites containing polymers to operate at high temperatures, thermal management is always used in order to deploy polymers in high-temperature dielectric applications. For example, to accommodate BOPP film capacitors in power inverters of hybrid and electric vehicles cooling systems have to be employed to decrease the environmental temperature from ~140 to ~70° C.

This increases the weight, volume and energy consumption to the integrated power system and reduces system reliability and efficiency. The upsurge in lightweight and flexible electronic devices has also created a tremendous demand for high-temperature dielectric polymers, as the heat generated by electronic devices and circuitry increases exponentially with miniaturization and functionality.

It is therefore desirable to have dielectric composites that contain polymers but that can withstand elevated temperatures and other extreme conditions experienced in certain applications.

SUMMARY

Disclosed herein is a composite comprising an organic polymer that has a glass transition temperature greater than or equal to about 250° C.; and a dielectric filler present in an amount effective to impart to the dielectric composite a dielectric constant that varies by less than 5% over a temperature range of 25° C. to 300° C., with an applied alternating electric field having a frequency of $10^4$ Hz and a maximum operating electric field strength of at least 250 megavolt per meter.

Disclosed herein too is a method of manufacturing a dielectric composite comprising blending an organic polymer that has a glass transition temperature greater than or equal to about 250° C.; and a dielectric filler to produce the dielectric composite; where the dielectric filler is present in an amount effective to impart to the dielectric composite a dielectric constant that varies by less than 5% over a temperature range of 25° C. to 300° C., with an applied alternating electric field having a frequency of $10^4$ Hz and a maximum operating electric field strength of at least 250 megavolt per meter.

Disclosed herein too is a capacitor comprising a first electrode; a second electrode; and a dielectric composite comprising an organic polymer that has a glass transition temperature greater than or equal to about 250° C.; and a dielectric filler present in an amount effective to impart to the dielectric composite a dielectric constant that varies by less than 5% over a temperature range of 25° C. to 300° C., with an applied alternating electric field having a frequency of $10^4$ Hz and a maximum operating electric field strength of at least 250 megavolt per meter.

BRIEF DESCRIPTION OF THE FIGURES

FIG. 23b is a graph of discharged energy density and charge-discharge efficiency, respectively, versus electric field, for the conventional high-Tg polymer dielectric of FIG. 23a;

FIG. 23c is a graph of discharged energy density and charge-discharge efficiency, respectively, versus electric field, for the conventional high-Tg polymer dielectric of FIG. 23a;

FIG. 24b is a graph of discharged energy density and charge-discharge efficiency, respectively, versus electric field, for the conventional high-Tg polymer dielectric of FIG. 24a;

FIG. 24c is a graph of discharged energy density and charge-discharge efficiency, respectively, versus electric field, for the conventional high-Tg polymer dielectric of FIG. 24a;

DETAILED DESCRIPTION

Figure 1:
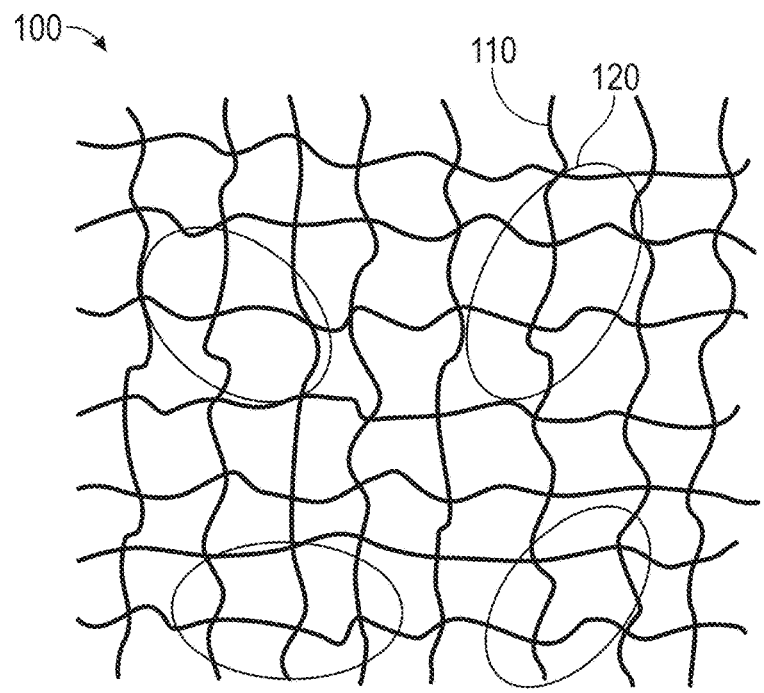
FIG. 1 depicts a schematic representation of a polymer composite according to one aspect of the present disclosure.

Disclosed herein are dielectric composites that can function at elevated temperatures and that comprise polymers and dielectric fillers. The polymers advantageously not degrade or undergo flow at temperatures below 250° C. The fillers are preferably ceramic fillers. The dielectric composites are characterized by an operating temperature of greater than 250° C. to a temperature of 350° C. and an operating electrical field strength of at least 250 megavolt (mV)/meter.

Disclosed herein too is a method for manufacturing the dielectric composites. The dielectric composites are manufactured by blending the polymer with the dielectric filler to form the dielectric composites. The dielectric composites are then shaped to form objects that may be used in articles such as capacitors.

Disclosed herein too are articles that comprise the dielectric composites. In an embodiment, an article comprises a capacitor that comprises a first electrode and a second electrode that is opposedly disposed to the first electrode. Disposed between the two opposing electrode surfaces is the disclosed dielectric composite.

The polymer is an organic polymer and has a softening point or flow point that is greater than 250° C., preferably greater than 300° C. and more preferably greater than 325° C. The softening point or flow point is preferably the glass transition temperature (Tg) of the polymer measured in a differential scanning calorimeter at rate of temperature change of 5° C./minute in a nitrogen atmosphere. The organic polymers may comprise a crosslinked polymer, a thermoplastic polymer or a combination comprising a crosslinked polymer and a thermoplastic polymer. The organic polymer may comprise a block copolymer, a diblock copolymer, a star block copolymer, a triblock copolymer, a dendrimer, an ionic copolymer, a polyelectrolyte, or the like.

Examples of thermoplastic polymers are polybenzoxazoles, polyphthalamides, polyimides, polyamide-imides, polysulfonamides, polyarylates, polyaramids, polyetherketones, polyether ether ketones, or the like, or a combination thereof. Copolymers of these thermoplastic polymers with polysiloxanes may be used if desirable.

Examples of crosslinked polymers are epoxy polymers, unsaturated polyester polymers, polyimide polymers, bismaleimide polymers, bismaleimide triazine polymers, cyanate ester polymers, benzoxazine polymers, benzocyclobutene polymers, acrylics, polyalkyds, phenol-formaldehyde polymers, novolacs, resoles, melamine-formaldehyde polymers, urea-formaldehyde polymers, hydroxymethylfurans, unsaturated polyesterimides, or the like, or a combination thereof.

Exemplary organic polymers are crosslinked polymers. An exemplary organic polymer for use in the dielectric composite is crosslinked benzocyclobutene. An even more preferred organic polymer is crosslinked divinyltetramethyldisiloxane-bis(benzocyclobutene). The structure of divinyltetramethyldisiloxane-bis(benzocyclobutene) prior to crosslinking is shown in the formula (1)

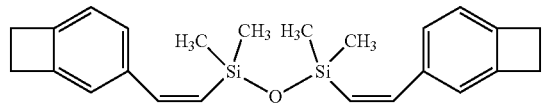

The structure of divinyltetramethyldisiloxane-bis(benzocyclobutene) after the crosslinking reaction is shown in the formula (2) below:

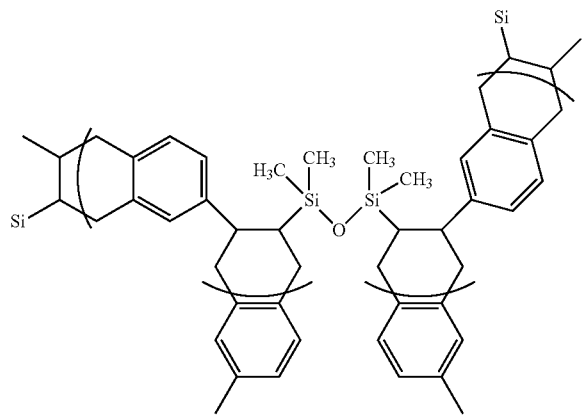

The organic polymer is used in amounts of 70 to 95 weight percent (wt %), preferably 80 to 93 wt % and more preferably 85 to 92 wt %, based on a total weight of the dielectric composite.

The dielectric fillers may include ceramics. It is desirable for the dielectric fillers to be nanometer or micrometer sized fillers. Nanometer sized fillers are those having a largest dimension that ranges from 5 to 100 nanometers, preferably 10 to 90 nanometers and preferably 20 to 75 nanometers. Nanometer sized fillers are termed nanofillers. A term prefaced with "nano" have a largest dimension of 5 to 100 nanometers. Micrometer sized fillers are those having a largest dimension that ranges from 101 nanometers to 5000 nanometers (5 micrometers), preferably 150 to 3000 nanometers and more preferably 200 to 2000 nanometers. Micrometer sized fillers are termed microfillers and are prefaced with the term "micro".

The dielectric fillers may have any shape and can be a 1-dimensional filler (e.g., a nanowire), a 2-dimensional geometry (e.g., a platelet) or a three dimensional geometry (e.g., a spherical particle such as a buckyball). Examples of dielectric filler shapes include wires, tubes, platelets, spheres, ellipsoids, pyramids, cones, or the like, or a combination thereof. The dielectric fillers may be nanowires, nanotubes, nanodots, nanoplatelets, nanorods, nanoparticles that have spherical shapes, nanosheets, microwires, microtubes, microdots, microplatelets, microrods, microparticles that have spherical shapes, microsheets, or the like, or a combination thereof.

In an embodiment, the 1-dimensional fillers and 2-dimensional fillers can have aspect ratios of 5 to 100,000, preferably 10 to 50,000 and more preferably 100 to 5,000.

The dielectric fillers may be a metal oxide, a metal carbide, a metal oxycarbide, a metal nitride, a metal oxynitride, a metal boride, a metal borocarbide, a boronitride, a metal silicide, a metal iodide, a metal bromide, a metal sulfide, a metal selenide, a metal telluride, a metal fluoride, a metal borosilicide, or the like, or a combination thereof. Examples of dielectric fillers include alumina, magnesia, zirconia, titania, antimony tin oxide, barium titanate, calcium copper titanate, lead titanate, lead magnesium titanate, barium neodymium titanate, lead zirconium titanate, strontium titanate, calcium titanate, boron nitride, hexagonal boron nitride, aluminum nitride, silicon nitride, silicon carbide, diamond of natural or synthetic origin, or the like, or a combination thereof. The filler particles can be of the various physical forms of each type listed above and the particles may be hybrids of the materials mentioned and have stoichiometric and non-stoichiometric mixed oxides, nitrides and carbides. More specific examples of these include $Al_2O_3$, AlN, MgO, ZnO, BeO, BN, $Si_3N_4$, SiC, SiO, and $SiO_2$ with mixed stoichiometric and non-stoichiometric combinations. A preferred dielectric filler are boron nitride nanosheets.

These dielectric fillers can also contain reactive surfaces to form intimate covalently bonded hybrid organic-inorganic homogeneous materials. In an embodiment, the inorganic filler particles have been surface treated to introduce surface functional groups that allow for the essentially complete co-reactivity with the organic polymer. The functional groups may comprise at least one of hydroxyl, carboxylic, amine, epoxide, silane and vinyl groups.

The dielectric fillers may be present in the dielectric composite in an amount of 5 to 30 wt %, preferably 7 to 20 wt % and more preferably 8 to 15 wt %, based on the total weight of the dielectric composite.

In one embodiment, in one method of manufacturing the dielectric composite, the organic polymer along with the dielectric filler may be blended in the appropriate blending equipment to produce the dielectric composite. The organic polymer along with the dielectric filler may be dry blended, melt blended and/or solution blended in the equipment to produce the composite in the form of a powder, pellets, briquettes, or the like.

In an embodiment, the dielectric composite can be dry blended to form a mixture in a device such as a Henschel mixer or a Waring blender prior to being fed to an extruder, where the mixture is melt blended. In another embodiment, a portion of the organic polymer can be premixed with the dielectric filler to form a dry preblend. The dry preblend is then melt blended with the remainder of the organic polymer in an extruder. In an embodiment, some of dielectric composite can be fed initially at the mouth of the extruder while the remaining portion of the dielectric composite is fed through a port downstream of the mouth.

Blending of the dielectric composite involves the use of shear force, extensional force, compressive force, ultrasonic energy, electromagnetic energy, thermal energy or combinations comprising at least one of the foregoing forces or forms of energy and is conducted in processing equipment wherein the aforementioned forces are exerted by a single screw, multiple screws, intermeshing co-rotating or counter rotating screws, non-intermeshing co-rotating or counter rotating screws, reciprocating screws, screws with pins, barrels with pins, rolls, rams, helical rotors, or combinations comprising at least one of the foregoing.

Blending involving the aforementioned forces or forms of energy may be conducted in machines such as single or multiple screw extruders, Buss kneader, Henschel, helicones, Ross mixer, Banbury, roll mills, molding machines such as injection molding machines, vacuum forming machines, blow molding machine, or then like, or combinations comprising at least one of the foregoing machines.

The dielectric composite may then be molded to take its desired shape and subjected to crosslinking. Crosslinking may be brought about by subjecting the dielectric composite to thermal energy, electromagnetic radiation or to a combination of electromagnetic radiation and thermal energy. Electromagnetic radiation can include UV radiation, electron beam energy, x-ray radiation, infrared radiation, microwave radiation, or a combination thereof. The crosslinked dielectric composite may be used in articles such as, for example, a capacitor.

In an embodiment, when boron nitride nanosheets are the dielectric filler used in the dielectric composite, the boron nitride nanosheets are exfoliated using the organic polymer that is solvated in a solvent. The dielectric composite is prepared by first manufacturing the boron nitride nanosheets from boron nitride powders using a known solution phase exfoliation method, as described in Coleman, J. N. et al. Two-dimensional nanosheets produced by liquid exfoliation of layered materials. *Science* 331, 568-571 (2011). The boron nitride nanosheets are dispersed in a solvent to form a first solution at an appropriate concentration. To this first solution is added a second solution comprising the divinyltetramethyldisiloxane-bis(benzocyclobutene) of the formula (1) above. The first solution and the second solution is mixed for a period of time effective to facilitate exfoliation of the boron nitride nanosheets. During the mixing of the first solution with the second solution, the solution mixture may be subjected to sonication to facilitate exfoliation. In an embodiment, mixing of the first and the second solution may be conducted in an extruder. In an alternative embodiment, the dielectric composite may be melt blended by blending the divinyltetramethyldisiloxane-bis(benzocyclobutene) with the boron nitride nanosheets to produce exfoliation of the boron nitride nanosheets.

The exfoliated dielectric composite may then be disposed onto a substrate and subjected to curing using thermal energy or electromagnetic radiation.

FIG. 1 depicts a schematic representation of a polymer composite according to one aspect of the present disclosure. For example, in some embodiments, the dielectric composite 100 includes polymer matrix comprising cross-linked divinyltetramethyldisiloxane-bis(benzocyclobutene) (c-BCB) 102 and a plurality of boron nitride nanosheets (BNNS) 104 dispersed in the polymer matrix. In one embodiment, the concentration of BNNS in a c-BCB and BNNS composite (referred to herein as c-BCB/BNNS) is approximately 10% by volume. Alternatively, the concentration of the BNNS may be less than 20% by volume, less than 15% by volume, less than 10% by volume, or any other suitable concentration.

Depending on the particular embodiment, the c-BCB polymer matrix may be cross linked in any suitable manner. For example, in some embodiments, the first solution and the second solution described above may be thermally cross-linked, such as with a solvent baking and a curing process. Alternatively, a c-BCB polymer matrix may be photo-cross-linked by exposure to UV radiation. Without wishing to be bound by any theory, photo-crosslinking may allow for a c-BCB/BNNS polymer composite to be photo-patternable such that a desired pattern may be formed by using an optical mask during crosslinking.

According to another embodiment, the dielectric composites described herein exhibit a stable dielectric response at high temperatures and under high applied electric fields. Specifically, a polymer composite including BNNS, which help to reduce electrical conduction, may allow the polymer composite to have a higher working temperature than conventional polymers, especially when under high applied electric fields. Accordingly, the dielectric composite may be used in applications and/or environments in which the operating temperature and/or electric field strength exceed the limits of other commercially available polymeric dielectric materials. For example, in some embodiments, the dielectric composite disclosed herein may have a an operating temperature of at least 350° C. and may be used with applied electric fields of at least 250 MVm$^{-1}$; in other embodiments, the maximum operating electric field strength may be at least 350 MVm$^{-1}$.

Moreover, the dielectric composites disclosed herein may have a stable dielectric constant over a wide range of operating temperatures and varying applied electric fields. For example, in one embodiment, the dielectric composite has a dielectric constant that varies by less than 2% over a temperature range of 25° C. to 300° C., with an applied alternating electric field having a frequency of $10^4$ Hz. In contrast, the dielectric constant of other commercially available dielectric composites varies by 8% or more over the same temperature range. In another embodiment, the dielectric composite has a dielectric constant that varies by less than 2% over a temperature range of 25° C. to 300° C., with an applied direct current (DC) bias with an electric field strength of 50 MVm$^{-1}$.

Figure 2:
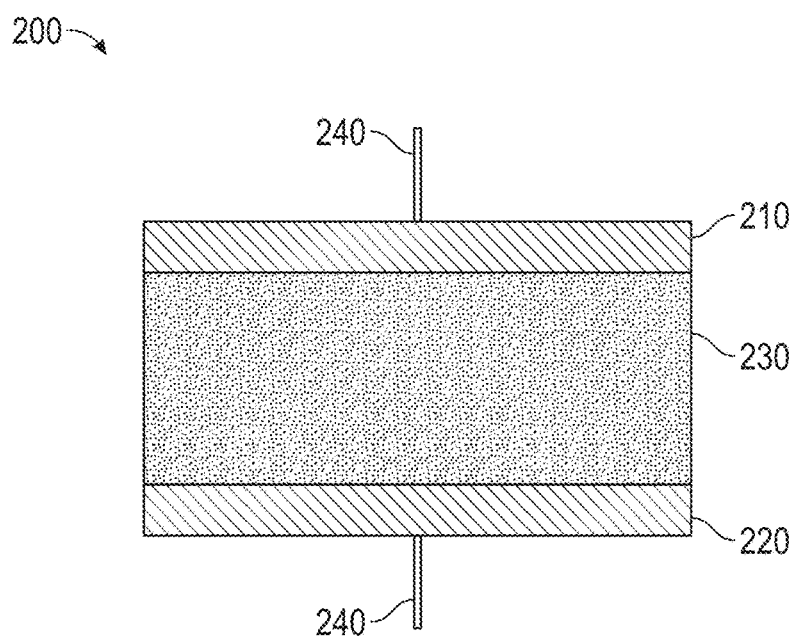
FIG. 2 is a schematic representation of one embodiment of a capacitor according to some aspects of the present disclosure.

FIG. 2 is a schematic representation of one embodiment of a capacitor according to some aspects of the present disclosure. The capacitor 200 includes a first electrode 210, a second electrode 220, and a polymer dielectric 230 disposed between the electrodes. In some embodiments, the dielectric composite described herein may be incorporated into the capacitor. For example, a capacitor may include a first metal electrode, a second metal electrode, and a dielectric composite such as a c-BCB/BNNS dielectric composite disposed between the electrodes. Leads 240 are attached to the electrodes to electrically couple the capacitor to a suitable electronic system. It should be understood that a capacitor may have any suitable configuration, including, but not limited to a flat or parallel plate geometry including one or more layers, or a rolled or wound configuration.

The dielectric composite and the method of manufacturing the composite is now detailed in the following non-limiting example.

EXAMPLE

This example was conducted to determine the dielectric properties of the dielectric composites disclosed herein. It also demonstrates the method of manufacturing the dielectric composites disclosed herein. The dielectric composites disclosed herein are also compared with high temperature polymer dielectrics.

Dipropylene glycol dimethyl ether (DMM), benzocyclobutene (BCB) monomers and b-staged BCBs (partially polymerized) with the number average molecular weight of ~25 k were provided by Dow Chemical. Boron nitride powders were purchased from Sigma-Aldrich. The high-$T_g$ polymer dielectric films were provided by PolyK Technologies. The polyimide)(Kapton®) films were vacuum dried overnight at 70° C. before use. All the other materials were used as received.

The boron nitride nanosheets (BNNSs) were prepared from boron nitride powders using a solution phase exfoliation method. To make the nanocomposites, BNNSs were first dispersed in DMM at a concentration of 5 mg mL$^{-1}$ to form the first solution 100 mg BCB monomers were dissolved in 2 mL DMM and stirred for 2 hours to form the second solution. Afterwards the first solution was mixed with the second solution (i.e., the DMM solution of BNNSs was mixed with BCB solution in proportion), and the mixture was first stirred for 10 minutes and then sonicated for 5 minutes using a tip-type sonicator (175 W).

To cross-link the material, the mixture was drop-cast on a glass slide and subject to a soft solvent baking at 120° C. for 30 minutes, which was followed by a hard curing at 250° C. for 2 hours under a nitrogen ($N_2$) atmosphere. The film was peeled off after soaking in water for 5 minutes. The film thickness can be varied by tuning the concentration of the cast solution. The thickness of films used for electrical characterizations is within the range of 6-12 μm. For UV induced cross-linking of the material, DMM solution of b-staged BCB mixed with BNNSs was used to cast a film on Si wafer by spin-coating. Then the spin-coated film was subject to a 20-min UV-exposure in an UV cross-linker (XL-1500, Spectroline) equipped with UV tubes (BLE-1T155, Spectroline). The thickness of the film can be varied by changing the solution concentration and parameters of spin-coating. Typically, a 30 wt % solution spin-coated at 700 rpm yields a 4-μm-thick film, which, after curing at 250° C. for 15 min under $N_2$, achieves the same level of performance to the thermally cross-linked films. For a typical procedure of photo-patterning, the material was spin-coated on Si wafer from a 20 wt % solution of b-staged BCB mixed with BNNSs at 3,000 rpm, and then covered with an optical mask before UV irradiation. Afterwards, the material was developed by using DMM and dried.

Fourier-transform infrared (FTIR) spectra were obtained in the attenuated total reflectance (ATR) mode using a ZnSe crystal as a contact to the samples with a Varian Digilab FTS-8010 spectrometer. Differential scanning calorimetry (DSC) was conducted by using a TA Instrument Q100 differential scanning calorimeter at a heating/cooling rate of 10° C. min$^{-1}$. X-ray diffraction (XRD) analysis was studied by use of PANalytical X'pert Pro MPD theta-theta diffractometer. Thermogravimetric analysis (TGA) was performed with a TGA 2050 Analyzer at a heating rate of 10° C. min$^{-1}$. Transmission electron microscopy (TEM) images were obtained on a JEOL JEM-2001F transmission electron microscope. Scanning electron microscopy (SEM) measurements were performed with a FEI Nova NanoSEM 630 field emission electron microscope. Gold electrodes of a diameter of 6 mm and a thickness of 60 nm were sputtered on both sides of the polymer films for the electrical measurements. Dielectric spectra were acquired over a broad temperature range using a Hewlett Packard 4284A LCR meter in conjunction with a Delta Design oven model 2300. Dielectric spectra under DC bias were collected with the same equipment along with a Hewlett Packard 4140B pA meter/voltage source, a KEPCO BOP 1000M amplifier and a protective circuit. Conduction currents were obtained under an electric field provided by a Hewlett Packard 4140B pA meter/voltage source and TREK model 2210 amplifier. High-field electric displacement-electric field loops were collected using a modified Sawyer-Tower circuit, where the samples were subject to a triangular unipolar wave with a frequency of 10 Hz. Dielectric breakdown strength measurements were performed on a TREK P0621P instrument using the electrostatic pull-down method under a DC voltage ramp of 500 V s$^{-1}$. Young's moduli were derived from strain-stress curves measured with a TA RSA-G2 Solids Analyzer, using a constant linear stretching rate of 0.02% s$^{-1}$.

Two-parameter Weibull statistic. Dielectric breakdown strength is analyzed within the framework of a two-parameter Weibull statistic described as, $$P(E)=1-\exp(-(E/\alpha)^\beta)$$

where P(E) is the cumulative probability of electric failure, E is the measured breakdown field, the scale parameter $\alpha$ is the field strength for which there is a 63% probability for the sample to breakdown (Weibull breakdown strength), and the shape parameter $\beta$ evaluates the scatter of data and a higher value of $\beta$ represents greater dielectric reliability. Temperature coefficient of dielectric constant. The temperature coefficient of dielectric constant, $\tau_{\varepsilon r}$, for a given temperature range (from $T_i$ to $T_f$), is defined as, $$\tau_{\varepsilon r}=(K_f-K_i)/(K_{ref}(T_f-T_i))$$

where $K_{ref}$ is the dielectric constant at room temperature, $T_i$ and $T_f$ are the low end and high end temperatures, respectively, and $K_i$ and $K_f$ are the dielectric constants at $T_i$ and $T_f$, respectively.

The full-field temperature evolution in the metallized thin film capacitor during joule heating is mathematically governed by $$\rho_m C \frac{\partial T(x)}{\partial t} = K\nabla^2 T(x) + \sigma(x,T)E^2 \quad (1)$$

where $\rho_m$ and C are the density and heat capacity respectively. K is the thermal conductivity and E stands for the applied electrical field. In particular, evidenced by the experimental measurements, the electrical conductivity $\sigma$ depends on the temperature T, having the characteristic form of $$\sigma = \sigma_0 \exp\left(-\frac{A}{K_R T}\right) \quad (2)$$

where the coefficients $\sigma_0$ and A for each material at one specific applied electric field are calculated by fitting the measured data. Setting $\partial T(x)/\partial t=0$ yields the steady-state temperature solution of Eq. (1), as $$K\nabla^2 T(x)+\sigma(x,T)E(x)^2=0 \quad (3)$$

The governing equation is then solved by finite element (FE) simulations using the commercial software COMSOl4.4. When the capacitor works, the thin slices of structures are packed by an enclosure, with the surrounding cooling liquid. Therefore, the capacitor is treated as an integrated body with a uniform applied electric field for each calculation. The geometries arising from the experimental setup are used in the FE model. As a result of laminar structure of capacitor in which the polymer has the relatively low thermal conductivity compared to the metallization, anisotropy in thermal conductivity is considered in the model. During the FE simulation, the heat flux at all the enclosure surfaces of the capacitor is contributed by both convective and radiative heat transfer arising from the surrounding cooling, with the form of $$n\cdot(-K\nabla T)=h(T-T_{ext})+\sigma_{sb}\varepsilon(T^4-T_{ext}^4) \quad (4)$$

Where $T_{ext}$ is the surrounding temperature, h is convective heat transfer coefficient, $\sigma_{sb}$ is Stefan-Boltzmann constant, and $\varepsilon$ is emissivity of the surfaces. Due to symmetry only $\frac{1}{8}$ of the volume is modeled. On the mesh sensitive study, the system mesh size is set as 120×120×30 with a grid spacing of 0.33 mm.

Figure 3:
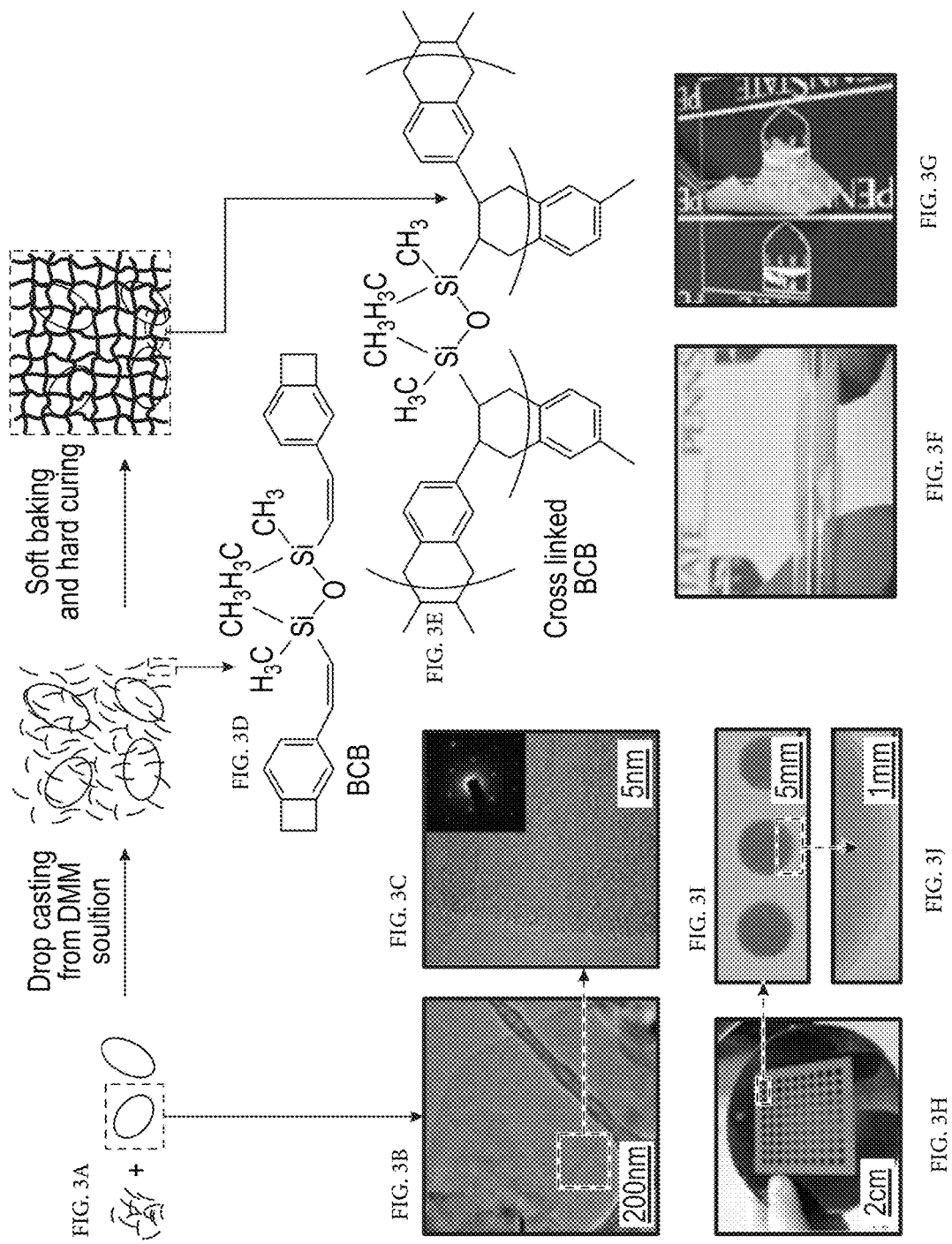
FIG. 3a is a schematic representation of the materials and preparation techniques for an exemplary experimental study according to some embodiments.
FIG. 3b depicts TEM images of boron nitride nanosheets included in some embodiments.
FIG. 3c depicts TEM images of boron nitride nanosheets included in some embodiments.
FIG. 3d depicts schematic representations of the chemical structures of the polymers included in some embodiments.
FIG. 3e depicts schematic representations of the chemical structures of the polymers included in some embodiments.
FIG. 3f is a photograph of polymer dielectric films according to some embodiments.
FIG. 3g is a photograph of polymer dielectric films according to some embodiments.
FIG. 3h is a photograph of photo-patterned polymer dielectric films according to some embodiments.
FIG. 3i is a photograph of photo-patterned polymer dielectric films according to some embodiments.
FIG. 3j is a photograph of photo-patterned polymer dielectric films according to some embodiments.

FIG. 3a is a schematic representation of one embodiment of the preparation of a c-BCB/BNNS polymer dielectric film. FIGS. 3b-3c are transmission electron microscope (TEM) images of BNNSs exfoliated from h-BN powders. The inset shows the electron diffraction pattern of BNNSs showing the hexagonal symmetry. FIG. 3d depicts the chemical structures of BCB monomers, and FIG. 3e depicts the repeating unit of cross-linked BCB. FIGS. 3f-3g are photographs of a 10 flm thick c-BCB/BNNS film wrapped on a glass tube with a 4 mm diameter, and a deformed 10 f.Lm thick c-BCB/BNNS film, respectively. FIGS. 3h-3j show a photo-patterned c-BCB/BNNS film on a Si wafer; dark regions correspond to the c-BCB/BNNS.

Structural and Thermal Properties of c-BCB/BNNS Films

Figure 4:
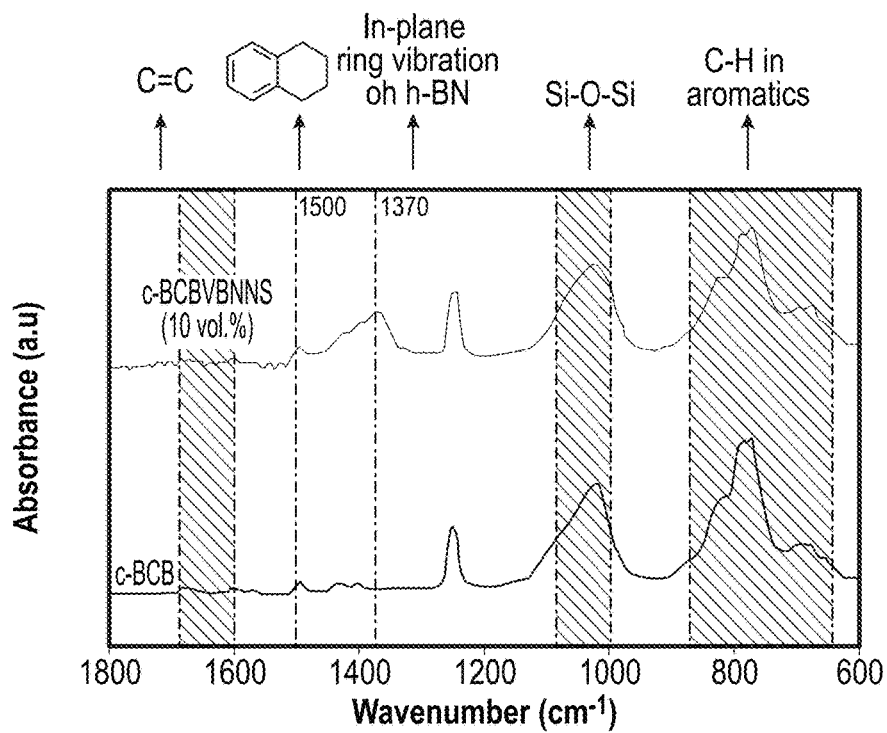
FIG. 4 is a graph of the FTIR spectrum of a polymer dielectric according to some embodiments.

FIG. 4 shows an ATR-FTIR spectrum of c-BCB and c-BCB/BNNS according to some embodiments. The presence of BNNSs is confirmed by the emerging characteristic peak centered at 1370 cm$^{-1}$ in the spectrum of c-BCB/BNNS (the dielectric composite), which is attributed to the in-plane ring vibration of h-BN. The absorption bands located at around 1,500, 1,000-1,080 and 640-880 cm$^{-1}$ are attributed to the vibrations of tetrahydronaphthalene, Si—O—Si and C—H structures, respectively, in c-BCB. These characteristic peaks are present in c-BCB both with and without BNNSs, suggesting that BNNSs do not affect the chemical structure of BCBs. The absence of pronounced characteristic peaks in the range of 1,600-1,680 cm$^{-1}$ that correspond to the absorption of C═C bonds indicates that the cross-linking reaction is close to completion in both cases.

Figure 5:
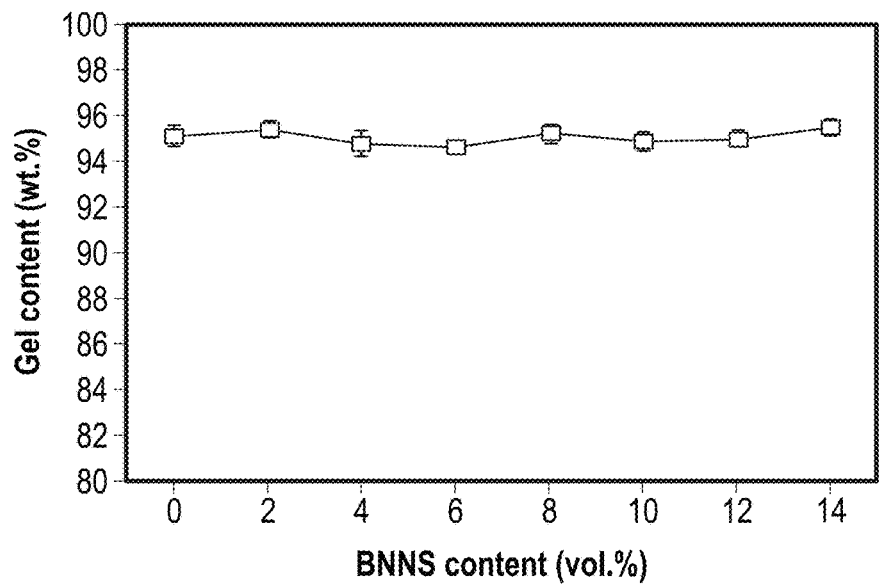
FIG. 5 is a graph of the gel content of a polymer dielectric according to some embodiments.

FIG. 5 is a graph of the gel content of c-BCB in c-BCB/BNNS as a function of BNNS content according to some embodiments. The analysis was performed by solvent swelling and extraction of samples in DMM heated to reflux for 12 hours. The gels were then dried at 90° C. in vacuum to give the dry weight of the insoluble component. The gel contents were a fraction of dry insoluble weight to the initial weight. The gel content of c-BCB is independent of the BNNS content, indicating that the presence of BNNSs does not affect the cross-linking of BCB.

Figure 6A:
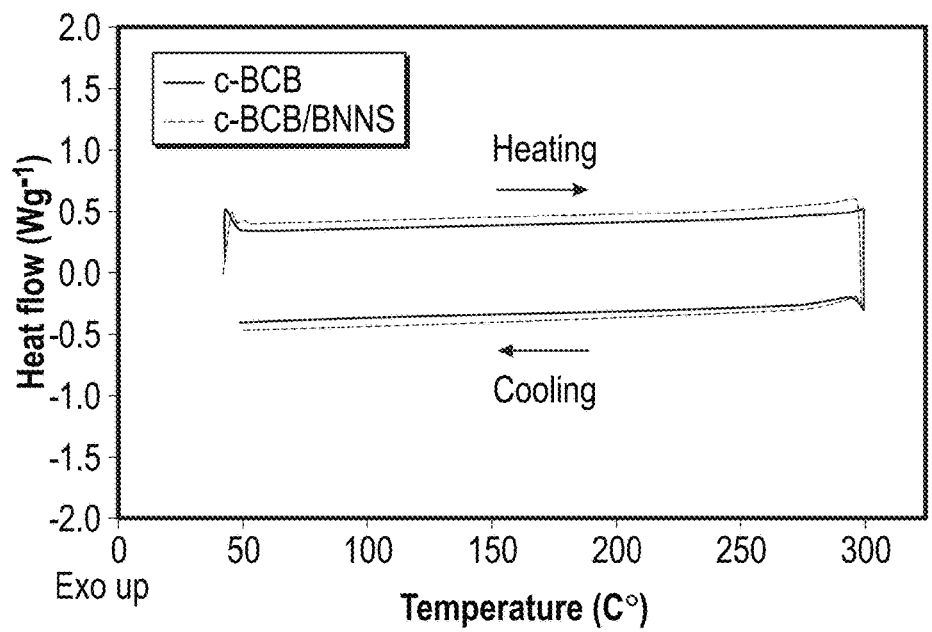
FIG. 6a depicts DSC curves for polymer dielectrics according to some embodiments.
Figure 6B:
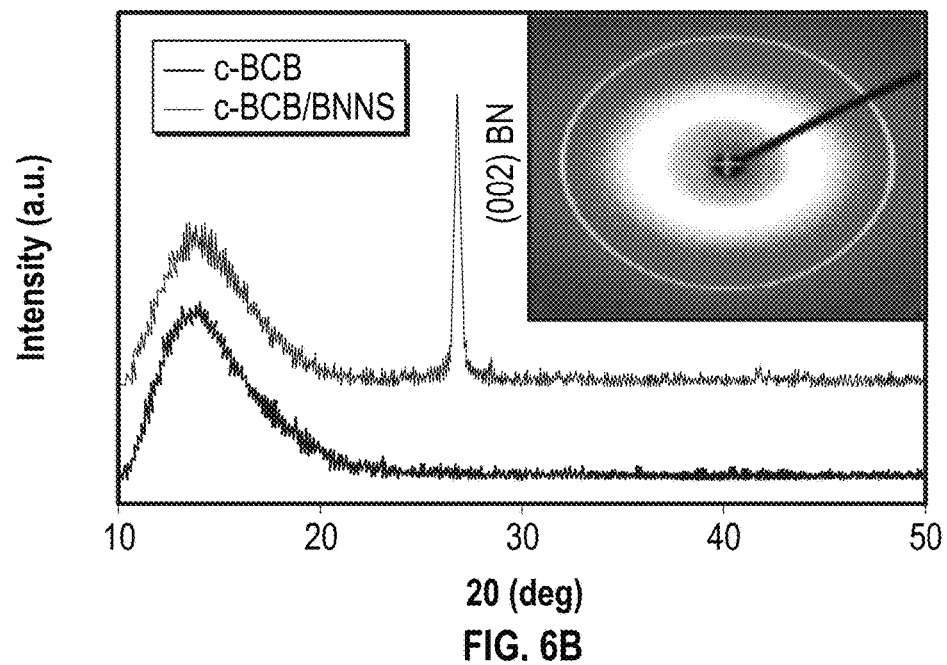
FIG. 6b depicts XRD patterns for polymer dielectrics according to some embodiments.

FIGS. 6a and 6b show differential scanning calorimetry (DSC) curves and x-ray diffraction (XRD) patterns, respectively, of c-BCB and c-BCB/BNNS 10 vol % of BNNSs, according to one embodiment. The inset shows a 2-D X-ray pattern of the c-BCB/BNNS with 10 vol % (volume percent) of BNNSs. There are no endo- or exo-thermal peaks observed in the DSC curves for both c-BCB and c-BCB/BNNS dielectric composite within the temperature range studied, suggesting no phase change occurs. XRD patterns confirm amorphous structures for c-BCB in both cases, and the uniform diffraction ring shown in the 2-D X-ray diffraction indicates a random orientation of BNNSs in the polymer matrix.

Figure 7A:
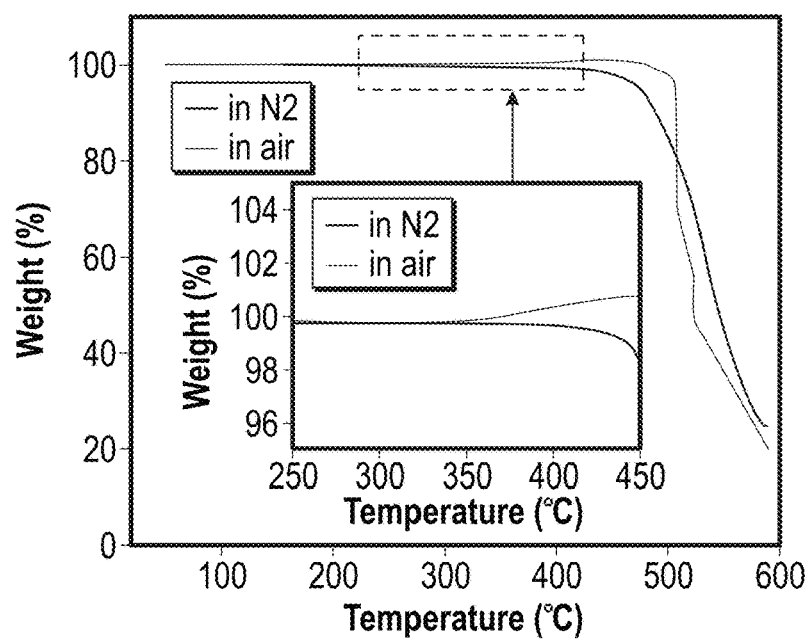
FIG. 7a depicts TGA curves for polymer dielectrics according to some embodiments.
Figure 7B:
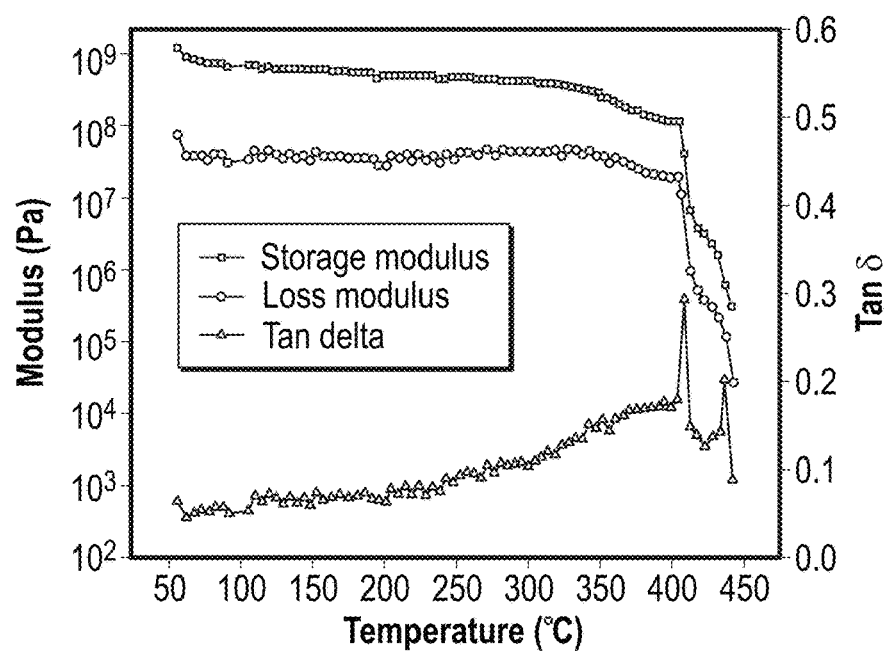
FIG. 7b depicts DMA curves for polymer dielectrics according to some embodiments.

FIGS. 7a and 7b show TGA and DMA curves, respectively, of c-BCB/BNNS of one embodiment. The inset in FIG. 7a shows TGA recorded from 250 to 450° C. The result of TGA conducted in N2 atmosphere indicates a decomposing temperature at around 450° C., and the TGA performed in air shows the onset of degradation at ~350° C. The result of DMA suggests that no glass transition occurs in the material below 350° C.

Figure 8A:
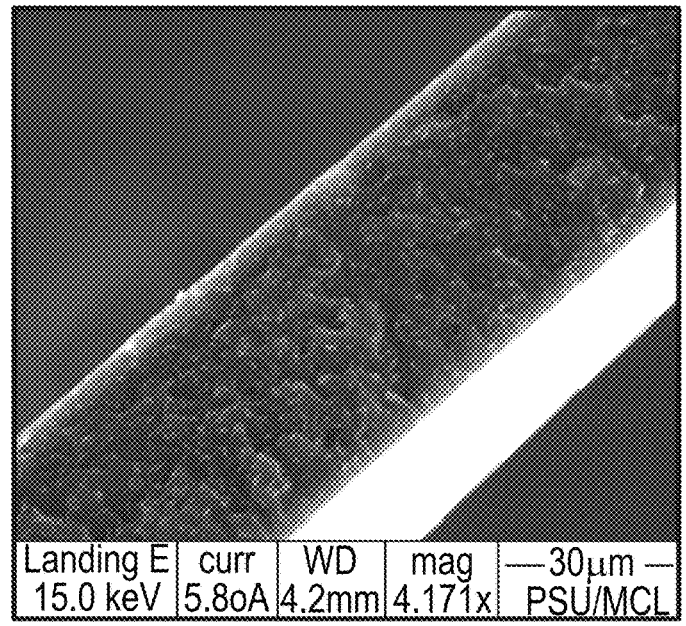
FIG. 8a depicts SEM images of polymer dielectrics according to some embodiments.
Figure 8B:
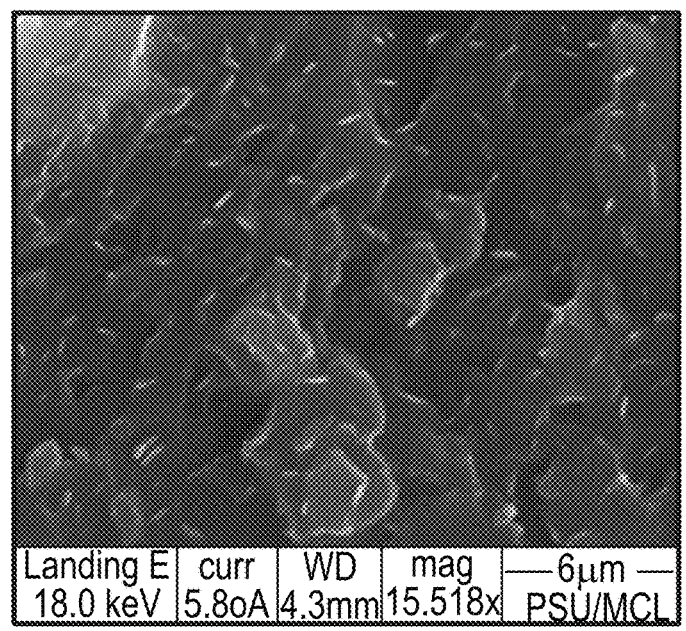
FIG. 8b depicts SEM images of polymer dielectrics according to some embodiments.

FIGS. 8a and 8b are cross-sectional SEM images of one embodiment of c-BCB/BNNSs with 10 vol % of BNNSs.

Effect of BNNSs on the Dielectric and Mechanical Properties of the c-BCB Polymer It has been discovered that cross-linked pristine BCB (the c-BCB polymer) (~95 wt % gel content) exhibited a high Tg (>350° C.), low volume conductivity (~1×10$^{-17}$ S m$^{-1}$), low dissipation factor (~0.15% at 10$^3$ Hz) and small variation (<3%) in dielectric constant at weak field from room temperature to 300° C. However, at relatively high electric fields, the conduction loss of c-BCB polymer was found to increase sharply, e.g., a volume conductivity of ~4×10$^{-12}$ S m$^{-1}$ and conduction loss of ~18% was found under an electric field of 200 MVm$^{-1}$ at 150° C.

In view of the above, it has been found that that compared to cross-linked pristine BCB, c-BCB/BNNS dielectric composite exhibit significantly suppressed high-field electrical conduction at elevated temperatures. Specifically, in one embodiment, the electrical conductivity was found to decrease from 4×10$^{-12}$ to 9.2×10$^{-14}$ S m$^{-1}$, and the conduction loss was found to decrease from 18% to 3% going from the c-BCB polymer to the c-BCB/BNNS dielectric composite under an applied field of 200 MVm$^{-1}$ at 150° C. Coupled with higher Young's modulus arising from the addition of BNNSs, which may impede the occurrence of the electromechanical breakdown, the largely reduced electrical conduction in the c-BCB/BNNS dielectric composite results in remarkably improved Weibull breakdown strength (Eb) at high temperatures, e.g. from 262 MVm$^{-1}$ of the c-BCB polymer to 403 MVm$^{-1}$ of the c-BCB/BNNS dielectric composite with 10 vol % BNNSs at 250° C.

Figure 9A:
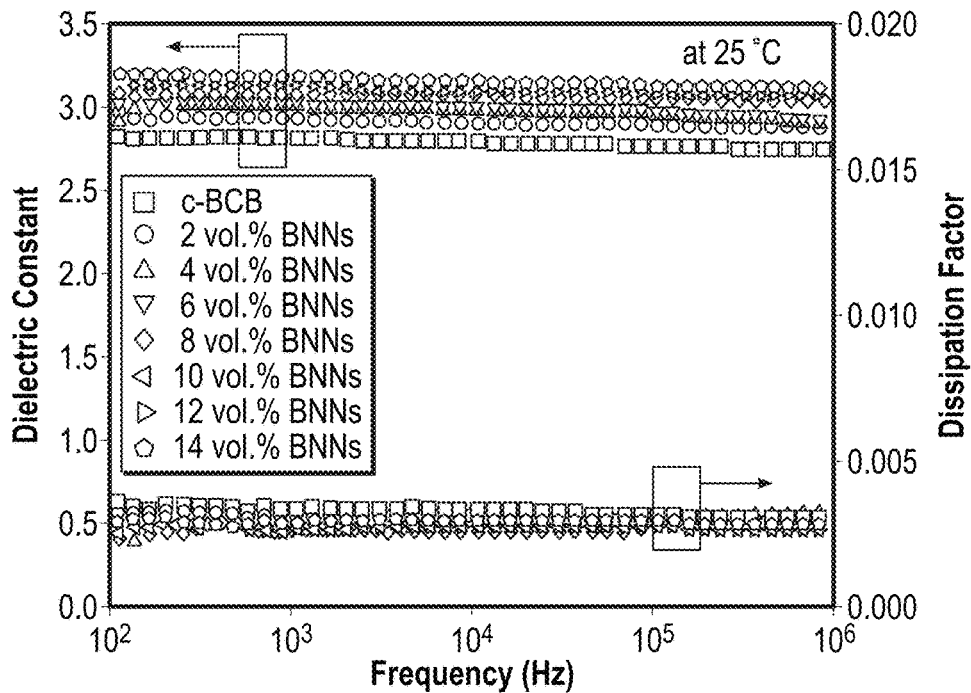
FIG. 9a is a graph of the frequency response of the dielectric constant and dissipation factor of polymer dielectrics according to some embodiments.
Figure 9B:
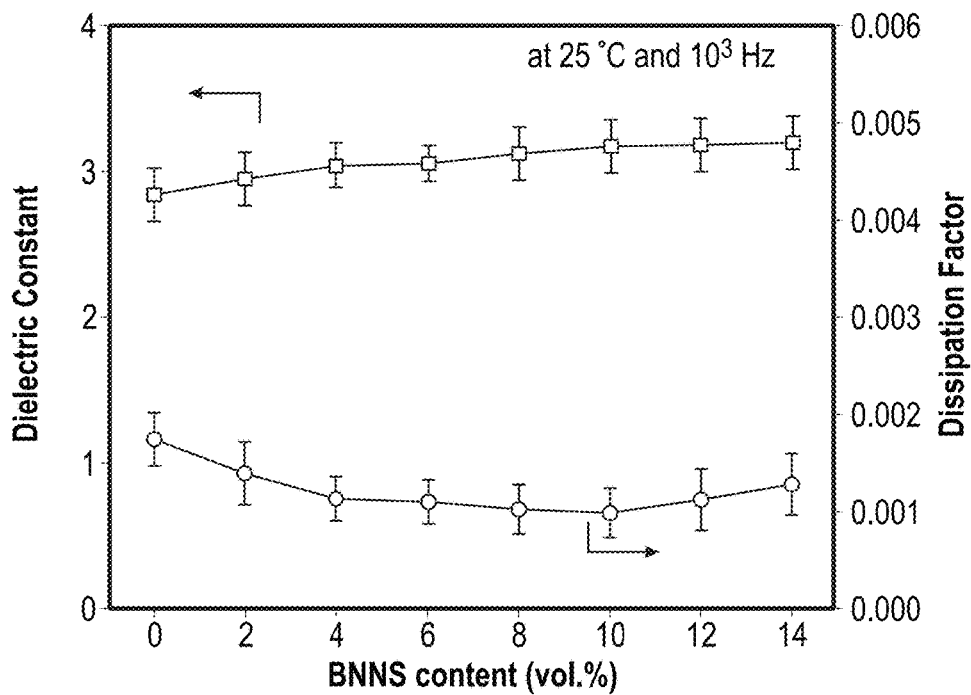
FIG. 9b is a graph of the dielectric constant and dissipation factor versus the boron nitride nanosheet concentration of polymer dielectrics according to some embodiments.
Figure 9C:
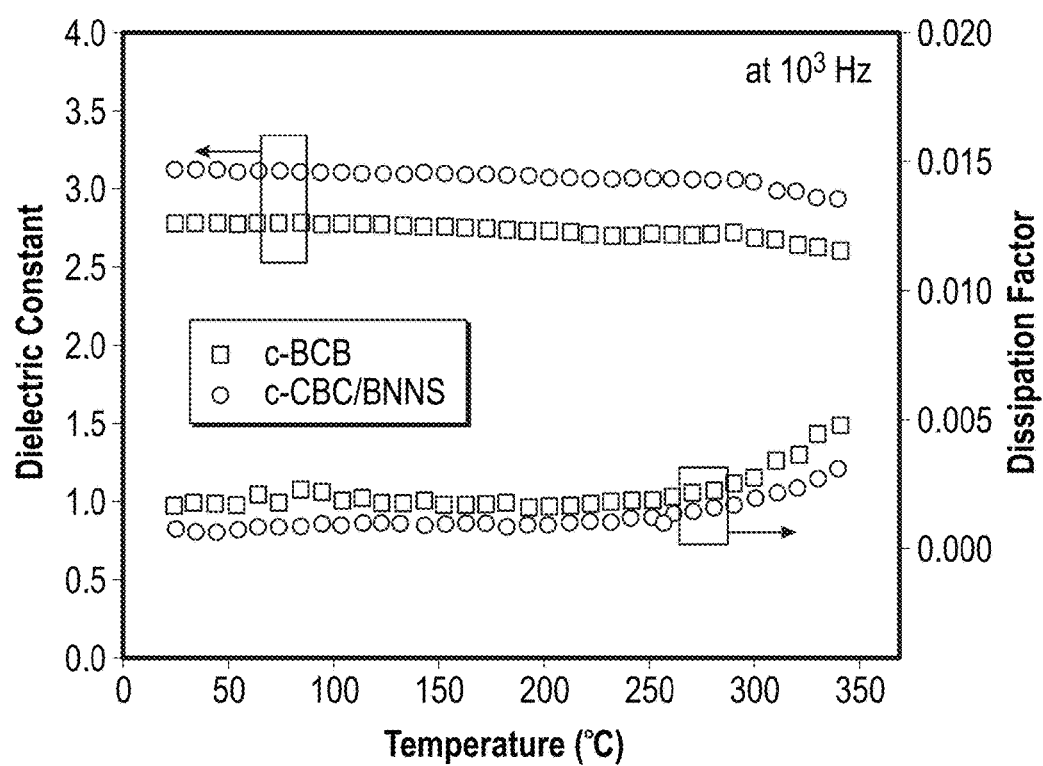
FIG. 9c is a graph of the temperature dependence of the dielectric constant and dissipation factor of polymer dielectrics according to some embodiments.
Figure 10A:
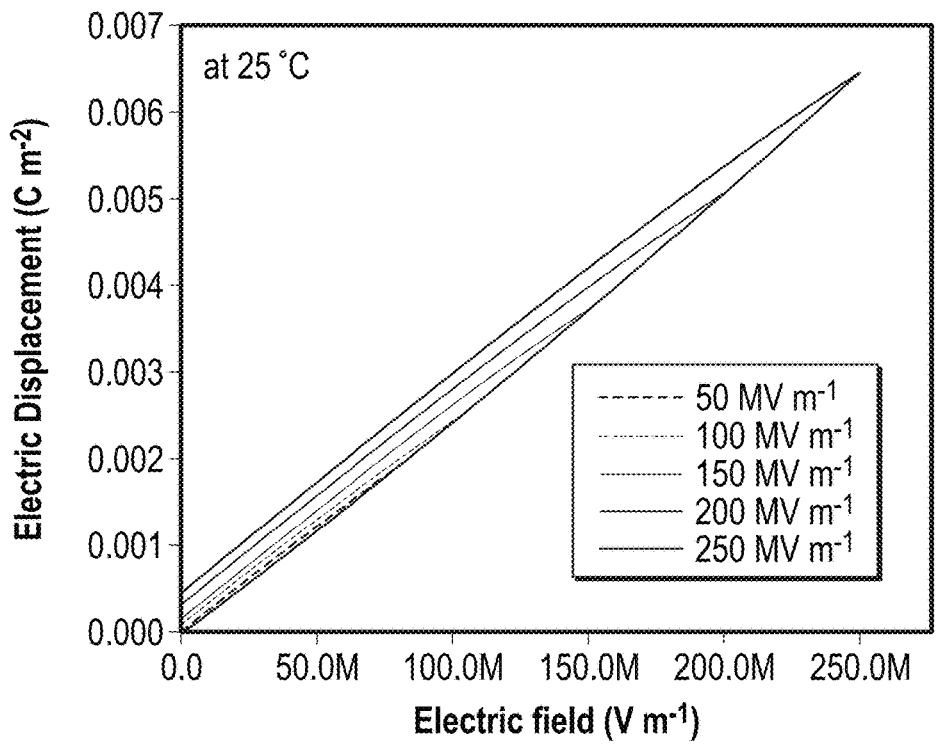
FIG. 10a is a graph of electric displacement-electric field loops of polymer dielectrics according to some embodiments.
Figure 10B:
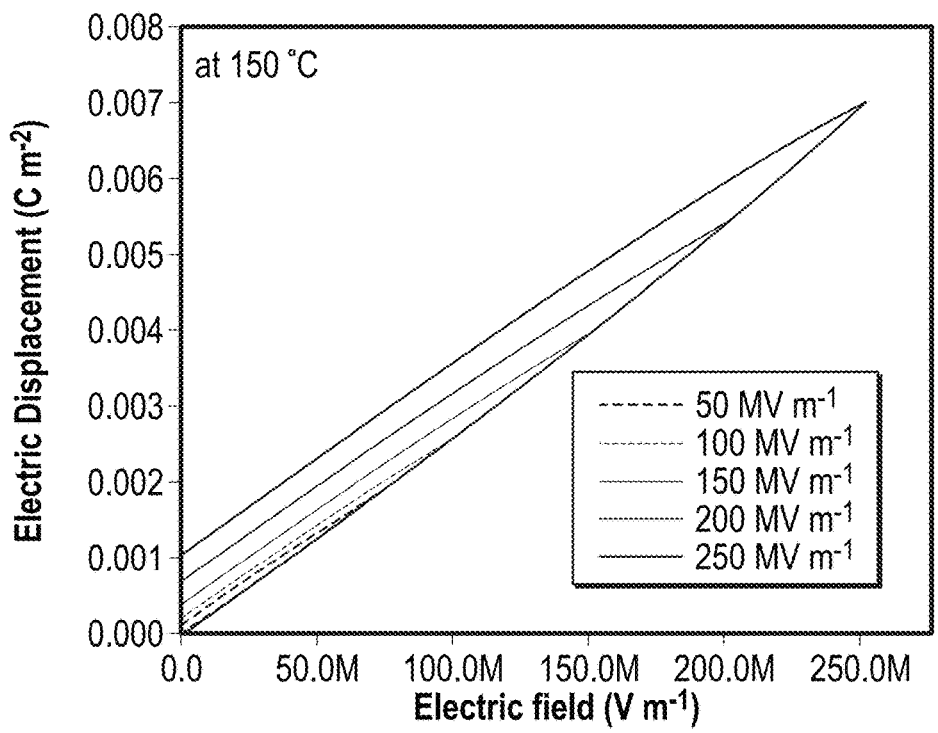
FIG. 10b is a graph of electric displacement-electric field loops of polymer dielectrics according to some embodiments.
Figure 10C:
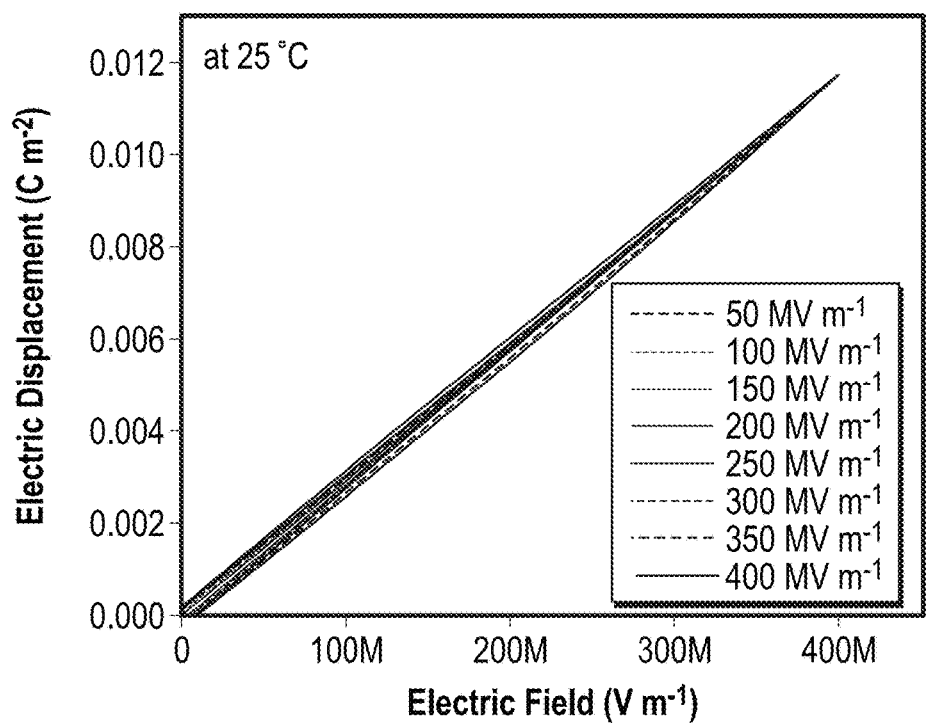
FIG. 10c is a graph of electric displacement-electric field loops of polymer dielectrics according to some embodiments.
Figure 10D:
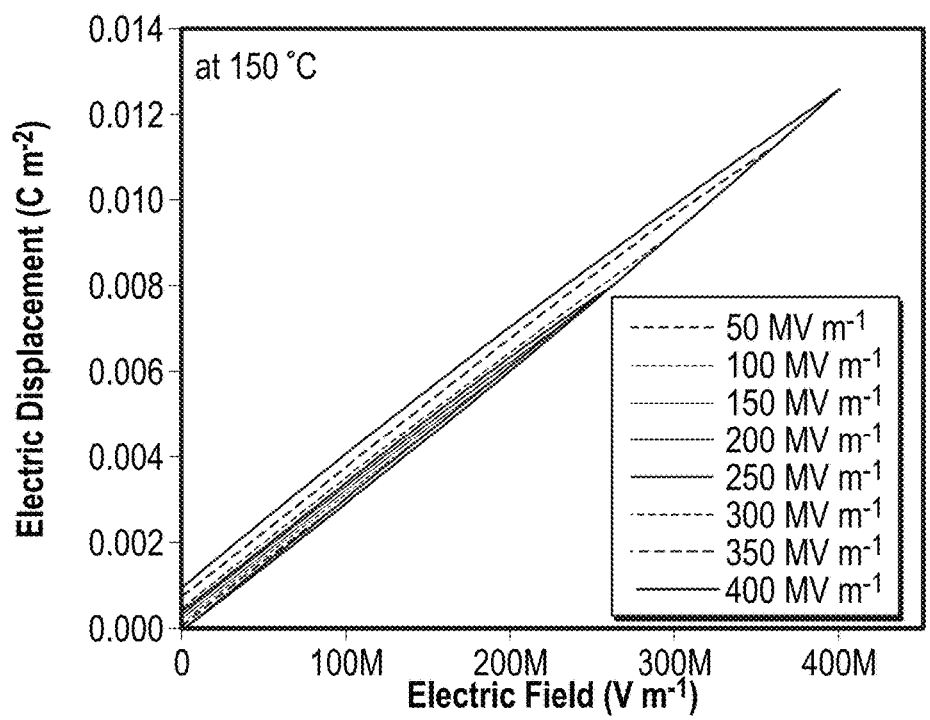
FIG. 10d is a graph of electric displacement-electric field loops of polymer dielectrics according to some embodiments.
Figure 10E:
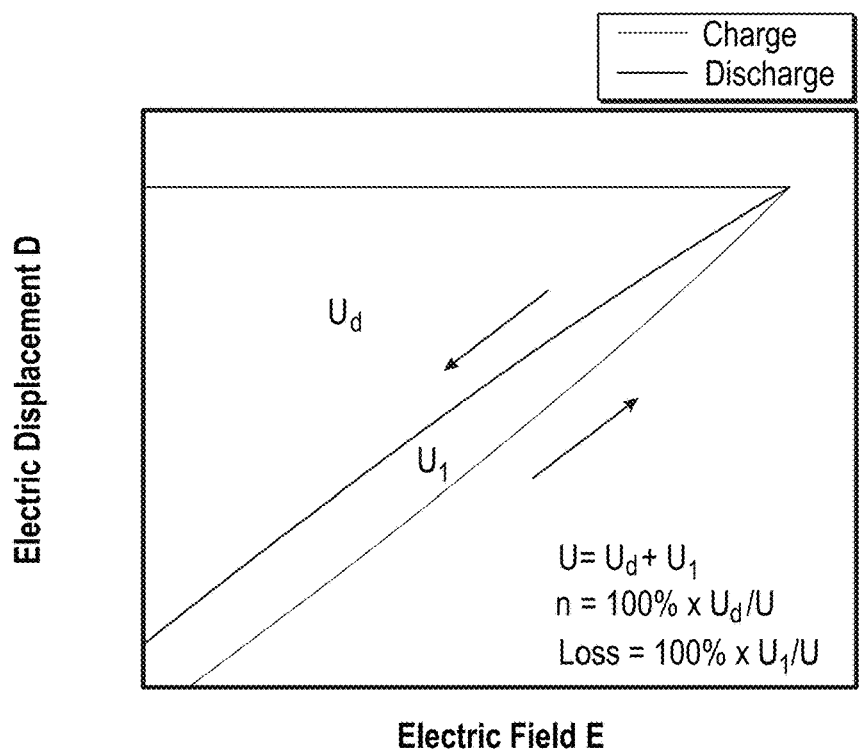
FIG. 10e is a graph of a schematic electric displacement-electric field loop of a dielectric material.
Figure 10F:
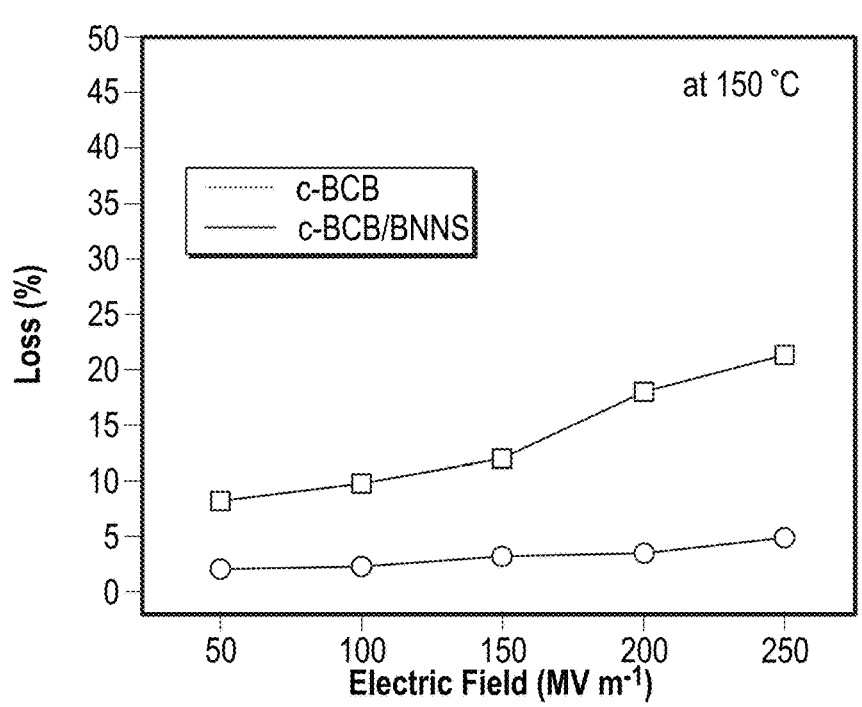
FIG. 10f is a graph of the conduction loss versus applied electric field for polymer dielectrics according to some embodiments.

FIG. 9a is a graph of the frequency dependence of dielectric constant and dissipation factor of c-BCB polymer and the c-BCB/BNNS dielectric composite with different filler contents according to some embodiments. FIG. 9b is a graph of the dielectric constant and dissipation factor of the c-BCB/BNNS dielectric composite at 10$^3$ Hz as a function of BNNS content. FIG. 9c is a graph of the temperature dependence of dielectric constant and dissipation factor of c-BCB polymer and the c-BCB/BNNS dielectric composite with 10 vol % of BNNSs. The dielectric constant of the c-BCB/BNNS dielectric composite with 10 vol % of BNNSs is found to increase by about 5 to 15%, preferably 8 to 12% compared to the pristine c-BCB polymer, which may be attributable to the higher dielectric constant of h-BN (i.e. 4-7) relative to that of c-BCB polymer.

In an embodiment, the dielectric constant of the dielectric composite containing 5 to 15 vol % of the dielectric filler is 2.8 to 3.5, preferably 2.9 to 3.25 at 1000 Hz when measured in a temperature range from 25 to 350° C., preferably 30 to 325° C., and more preferably 35 to 300° C.

FIG. 10 shows electric displacement-electric field (D-E) loops of the c-BCB polymer (FIGS. 10a-10b) and the c-BCB/BNNS dielectric composite with 10 vol % of BNNSs (FIGS. 10c-10d) according to some embodiments, at room temperature and at 150° C. FIG. 10e is a schematic D-E loop of a dielectric material with the discharged energy density (U$_d$) represented by the area colored in purple and energy loss (U$_l$) indicated by the area painted orange. The total stored energy density (U) equals U$_d$ plus U$_l$, and the charge-discharge efficiency (η) is calculated by η=100%×U$_d$/U. The conduction loss can be calculated as 100%×U$_l$/U. FIG. 10f depicts the conduction loss of the c-BCB polymer and the c-BCB/BNNS dielectric composite at 150° C. as a function of electric field.

Figure 11:
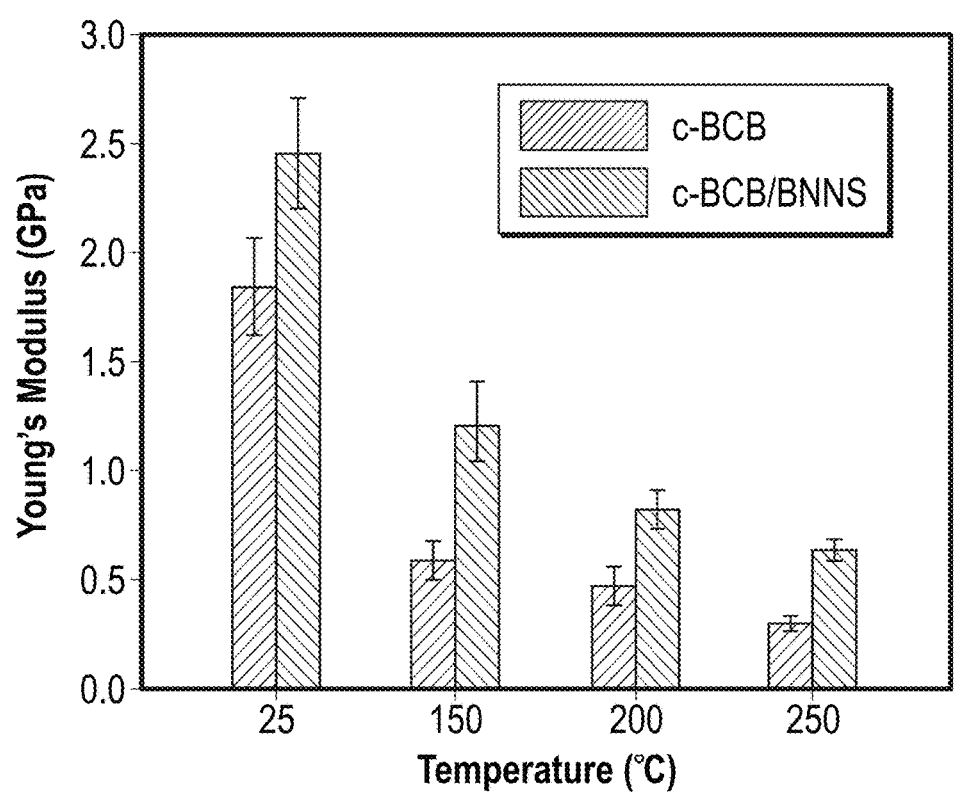
FIG. 11 is a graph of the Young's modulus of polymer dielectrics according to some embodiments.

FIG. 11 is a graph of the Young's moduli of c-BCB polymer and the c-BCB/BNNS dielectric composite with 10 vol % BNNS of one embodiment at various temperatures. In the FIG. 11 it may be seen that the Young's modulus (elastic modulus) is increased by 10 to 25% with the incorporation of the dielectric filler at temperatures of 25 to 250° C. The increased modulus provides dimensional stability at elevated temperatures when compared with unfilled polymers. The dielectric composites thus display a unique combination of thermal and dimensional stability and dielectric constant at temperatures of 25 to 350° C., preferably 30 to 300° C.

Figure 12A:
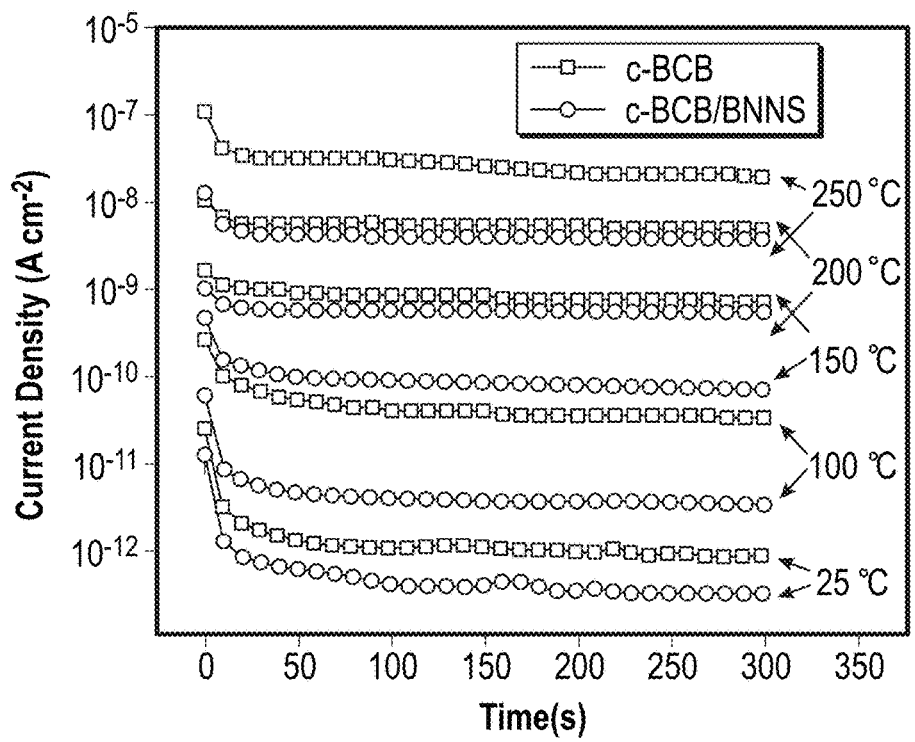
FIG. 12a is a graph of the current density at various temperatures in polymer dielectrics according to some embodiments.
Figure 12B:
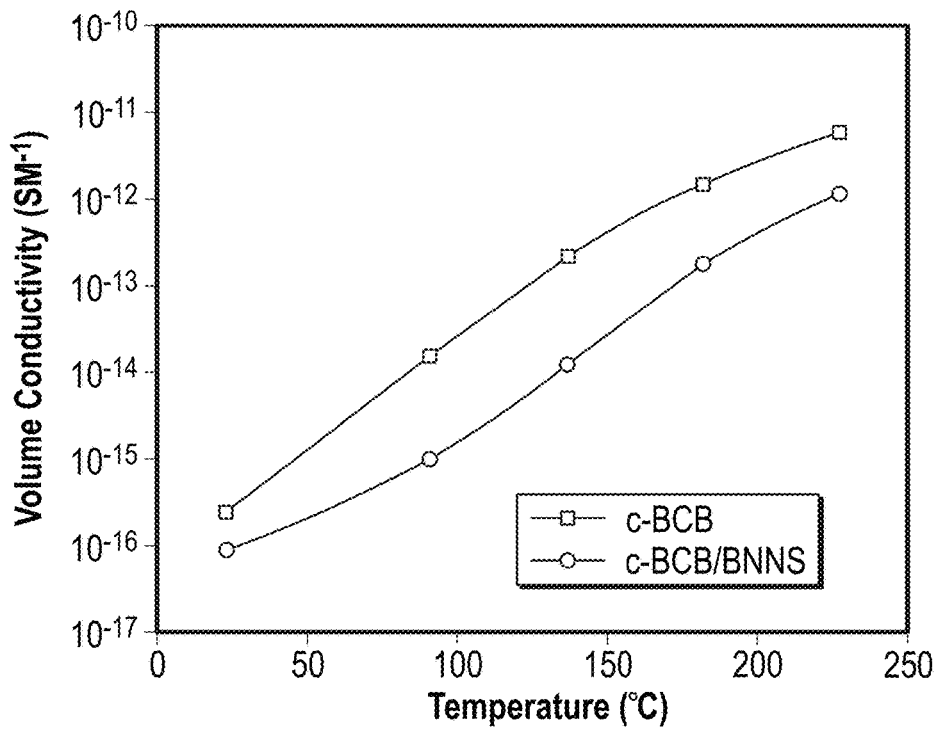
FIG. 12b is a graph of the temperature dependence of the volume conductivity of polymer dielectrics according to some embodiments.

FIG. 12a is a graph of the current density of the c-BCB polymer and the c-BCB/BNNS dielectric composite with 10 vol % of BNNSs of one embodiment under a DC bias of 50 MVm$^{-1}$ at various temperatures. FIG. 12b is a graph of the volume conductivity under an applied field of 50 MVm$^{-1}$ as a function of temperature. From the FIGS. 12a and 12b, it may be seen that current density and volume conductivity is of the dielectric composite is reduced compared with that of the unfilled polymer in a temperature range of 25 to 300° C., preferably 30 to 250° C.

Figure 13A:
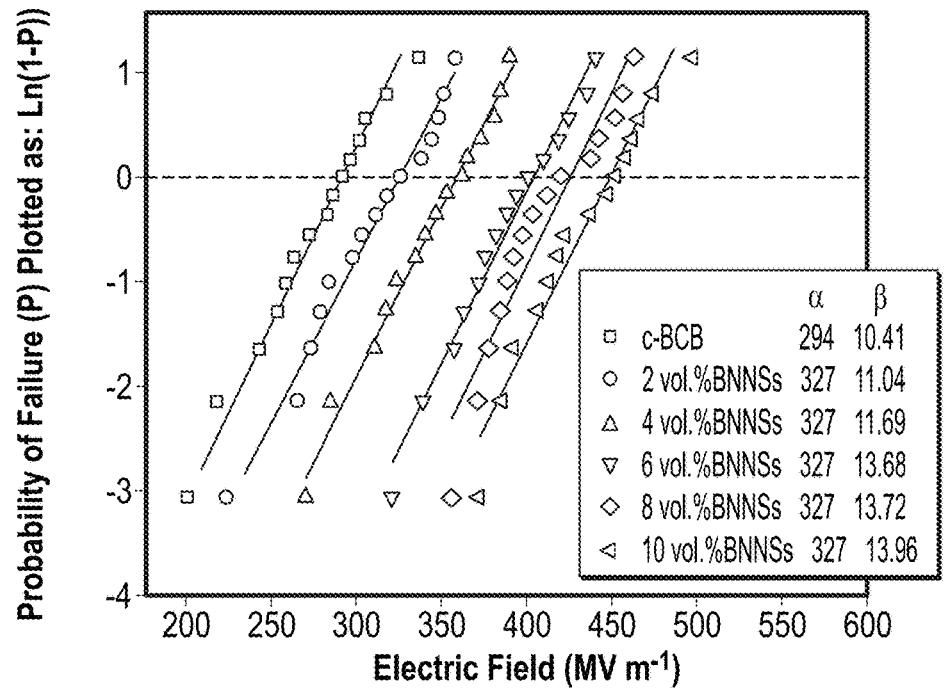
FIG. 13a depicts Weibull plots of polymer dielectrics with various Boron Nitride nanosheets concentrations according to some embodiments.
Figure 13B:
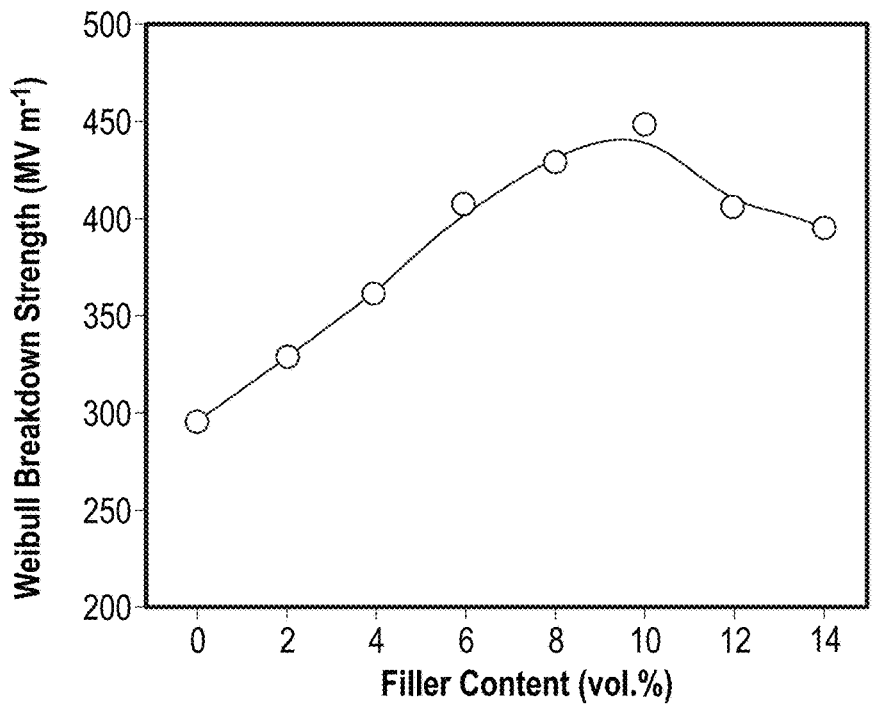
FIG. 13b is graph of the Weibull breakdown strength versus Boron nitride nanosheet concentration in polymer dielectrics according to some embodiments.
Figure 13C:
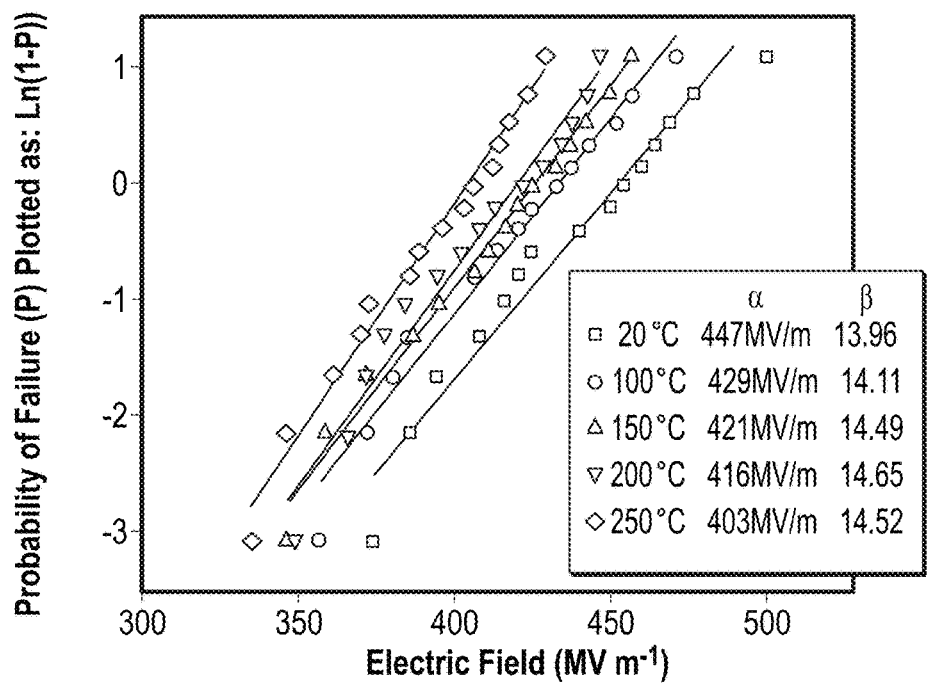
FIG. 13c depicts Weibull plots of polymer dielectrics at various temperatures, according to some embodiments.
Figure 13D:
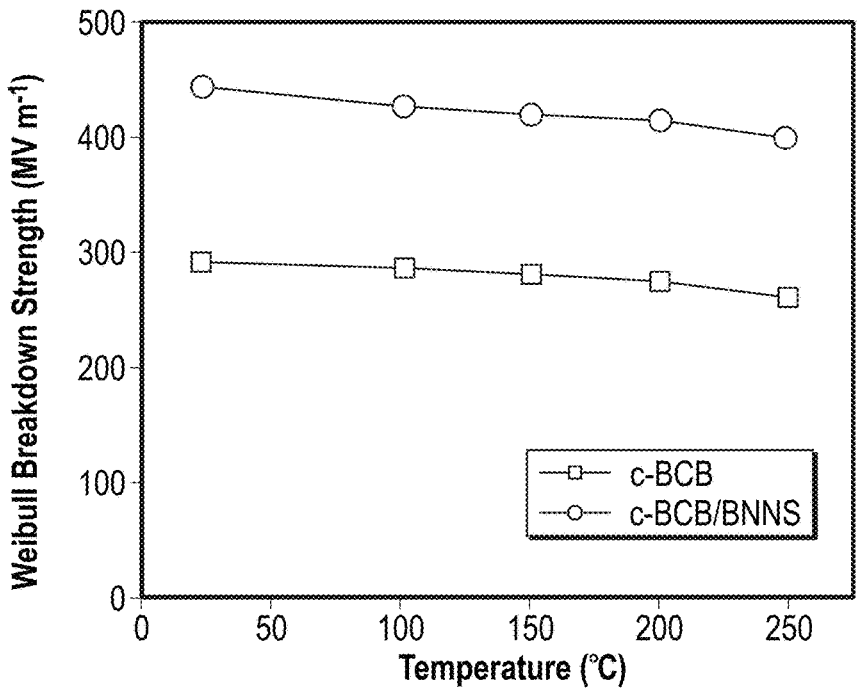
FIG. 13d is a graph of the temperature dependence of the Weibull breakdown strength of polymer dielectrics according to some embodiments.
Figure 14A:
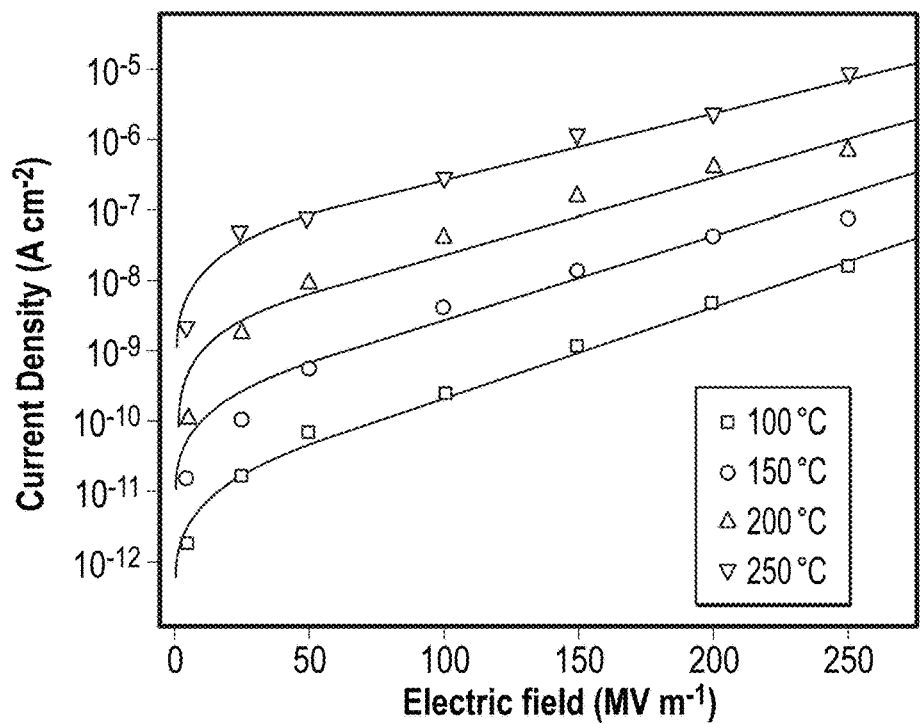
FIG. 14a depicts graphs of the conduction current density of polymer dielectrics according to some embodiments.
Figure 14B:
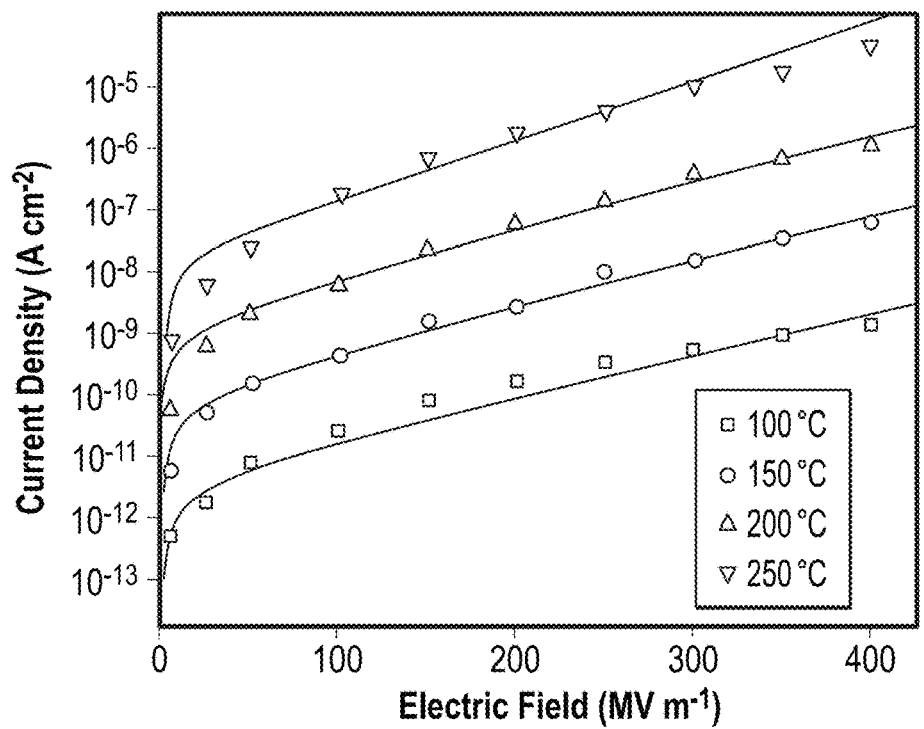
FIG. 14b depicts graphs of the conduction current density of polymer dielectrics according to some embodiments.

The dielectric breakdown strength was analyzed within the framework of a two-parameter Weibull statistic described as P(E)=1−exp(−(E/α)β), where P(E) is the cumulative probability of electric failure, E is the measured breakdown field, the scale parameter α is the field strength for which there is a 63% probability for the sample to breakdown (Weibull breakdown strength), and the shape parameter β evaluates the scatter of data and a higher value of β represents greater dielectric reliability. FIG. 13a shows Weibull plots of the c-BCB/BNNS dielectric composite with various BNNS contents according to some embodiments. FIG. 13b shows the Weibull breakdown strength of the embodiments of the c-BCB/BNNS dielectric composite as a function of the filler content. FIG. 13c shows Weibull plots of one embodiment of the c-BCB/BNNS dielectric composite with 10 vol % of BNNSs at different temperatures. FIG. 13d is a graph of the Weibull breakdown strength of the c-BCB polymer and the c-BCB/BNNS dielectric composite as a function of temperature. From the FIG. 13d, it may be seen that the Weibull strength is increased by at least 100 MVm$^{-1}$ Effects of BNNS on the High-Field, High-Temperature Conduction of the c-BCB Polymer FIG. 14 shows the conduction current density of the c-BCB polymer (FIG. 14a) and the c-BCB/BNNS dielectric composite with 10 vol % BNNSs as a function of electric field strength at various temperatures. It has been discovered that the current density of the c-BCB/BNNS dielectric composite may be much lower than that of the c-BCB polymer at comparable temperatures and field strengths. FIG. 14 also displays a clear trend that conduction current density increased exponentially over electric field; without wishing to be bound by any particular theory, this may imply that solid state hopping conduction is a plausible conduction mechanism in these materials. Hopping conduction between traps is a typical conduction mode in disordered organic materials, in which the conduction current density, J, is given as, $$J(E,T) = 2ne\lambda v^* \exp[-(eW/k_BT)]^* \sin h(\lambda eE/2k_BT) \quad (1a)$$

where n is the carrier concentration, λ the hopping distance, v the attempt-to-escape frequency, W the activation energy in eV, e the electric charge of the carriers, k$_B$ the Boltzmann constant. The curve fits of Equation 1a are also presented in FIG. 14; the curve fits are found to agree well with the experimental data, suggesting that hopping is the major conduction mechanism in these materials.

Figure 15:
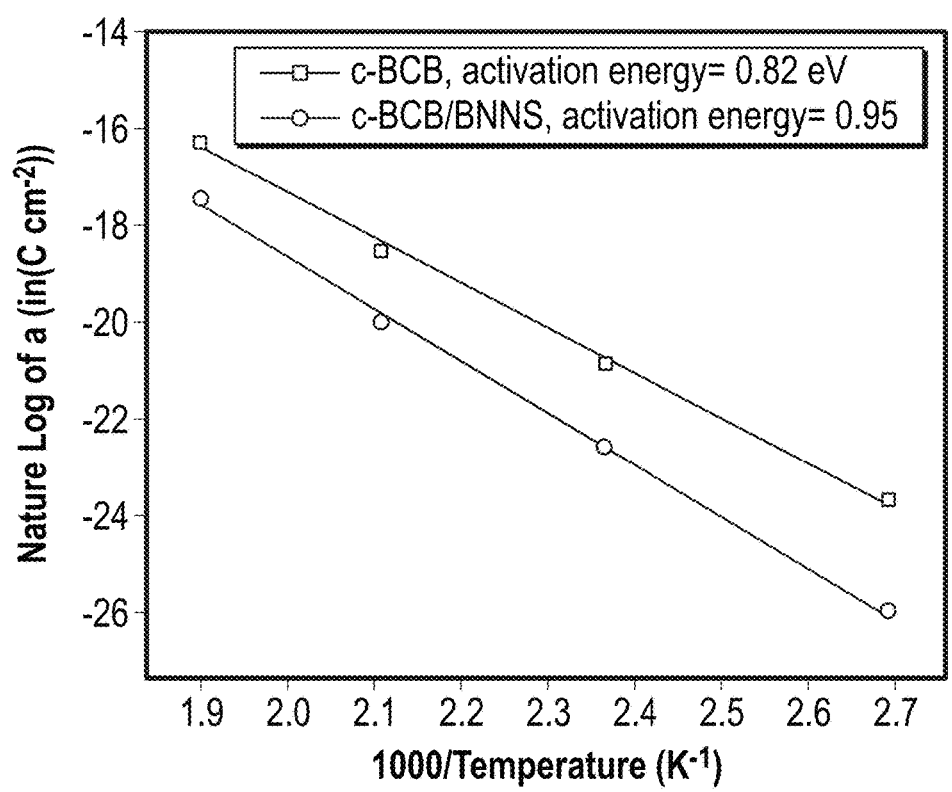
FIG. 15 depicts activation energies of polymer dielectrics according to some embodiments.

The electrical conductivity of polymer dielectrics that follow the hopping mechanism is no longer ohmic (nonlinear relationship between current and field) but exponentially increases with the field strength when the energy gained between traps becomes comparable to the thermal energy which causes de-trapping at lower field strengths. With a further increase of the applied electric field, when the energy gained between traps becomes comparable to the trap depth, the electrical conductivity would increase drastically. The thermal activation energy of conductivity reflects the depth of traps, and thus determines the likelihood of carriers running out of traps at a given condition to participate the conduction process. It is thus informative to investigate the activation energy of the materials. To this end, Equation 1a is simplified as, $$J(E) = A * \sin h(BE) \quad (2a)$$

where A and B are two lumped parameters. A can be considered as a function of temperature T as, $$A(T) = 2ne\lambda v^* \exp[-(eW/k_B T)] \quad (3a)$$

from which the activation energy can be obtained through a linear fit of the Arrhenius plot. FIG. 15 is a graph of the dependence of A on temperature for the c-BCB polymer and the c-BCB/BNNS dielectric composite with 10 vol % of BNNSs according to one embodiment. The values of A used for the linear fits are extracted from the curve fits in FIG. 14, and can be viewed as the low-field currents. The results indicate that the activation energies of the c-BCB polymer and the c-BCB/BNNS dielectric composite, as determined from the slops of the linear fits, are 0.82 eV and 0.95 eV, respectively.

Figure 16A:
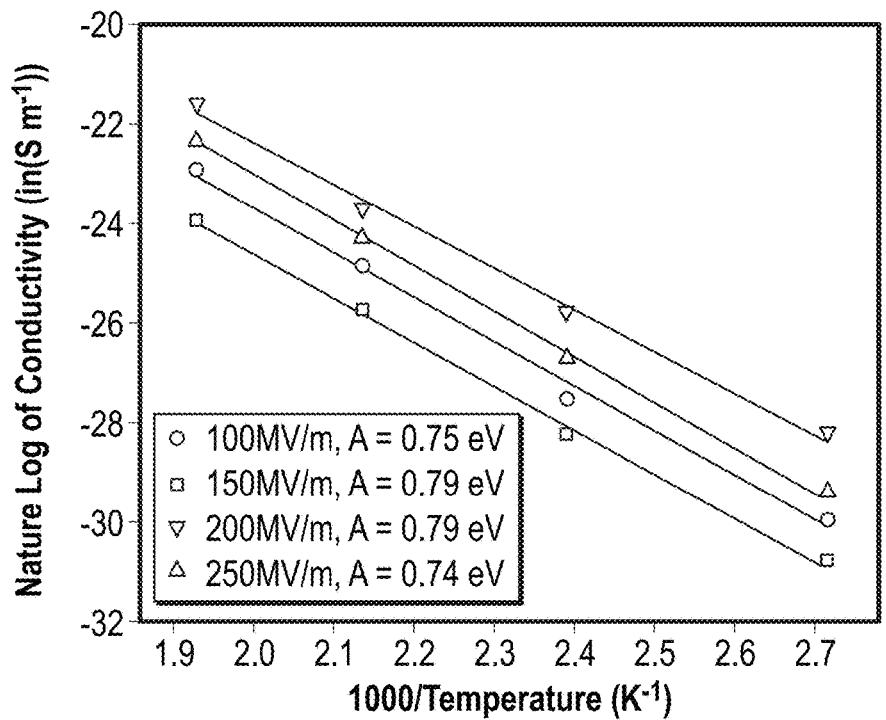
FIG. 16a depicts the dependence of the conductivity on temperature of polymer dielectrics according to some embodiments.
Figure 16B:
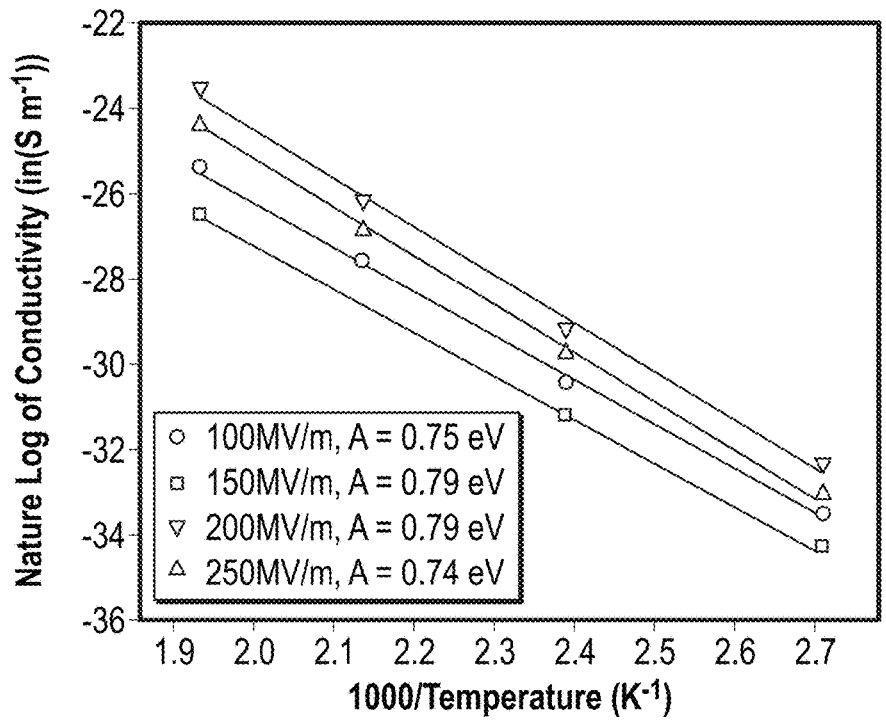
FIG. 16b depicts the dependence of the conductivity on temperature of polymer dielectrics according to some embodiments.

Activation energies can also be determined from the high-field temperature dependent conductivities, which generally fit an Arrhenius relationship given as, $$\sigma(T) = \sigma_0 * \exp[-(Aq/k_B T)] \quad (4a)$$

where $\sigma_0$ is the prefactor, A is the activation energy in eV, q is the electronic charge, and $k_B$ is the Boltzmann constant. FIGS. 16a-16b are Arrhenius plots of the conductivity of c-BCB and c-BCB/BNNS with 10 vol % of BNNSs, respectively, under various electric fields. The average activation energies determined from Equation 4a are 0.77 eV and 0.94 eV, for the c-BCB and c-BCB/BNNS, respectively.

Without wishing to be bound by any theory, these results of the activation energies indicate that the presence of BNNS in c-BCB gives rise to a higher average energy barrier to be overcome for the conduction process to occur, thus resulting in a lower conduction current in c-BCB/BNNS than in c-BCB under the same conditions.

Dielectric Stability of c-BCB/BNNS and High $T_g$ Polymer Dielectrics

The dielectric properties of one embodiment of a c-BCB/BNNS polymer composite have been evaluated along with the state-of-the-art high-temperature capacitor-grade polymer films (also called conventional polymer dielectrics) including polycarbonate (PC), poly(ether ether ketone) (PEEK), polyetherimide (PEI), fluorine polyester (FPE) and polyimide (Kapton PI). The characteristics of the polymers are summarized in Table 1. None of these polymers contain any dielectric fillers.

TABLE 1

| Polymer | $T_g$ (° C.) | Thickness (μm) | Film Type | Mass Density (g cm$^{-3}$) |
| --- | --- | --- | --- | --- |
| PC | 150 | 6 | Solution cast film | 1.21 |
| PEEK | 150 | 12 | Amorphous PEEK | 1.32 |
| PEI | 217 | 12 | Extruded film | 1.27 |
| FPE | 330 | 6 | Solution cast film | 1.21 |
| PI | 360 | 12 | Kapton -HN | 1.42 |
| c-BCB/BNNS | >350 | 6-12 | Solution cast film | 1.10 |

The dielectric constant K and dissipation factor DF were analyzed as a function of temperature and frequency. It has been discovered that at $10^4$ Hz, which is the frequency of interest for common power conditioning applications, a minor variation in K with temperature, i.e. <1.7%, is seen in c-BCB/BNNS from room temperature to 300° C., while FPE, the next best dielectric investigated in this study, shows a K variation of over 8% at 300° C. relative to room temperature. Moreover, it has been found that the temperature coefficient of K for the c-BCB/BNNS dielectric composite is around 65 ppm ° C.$^{-1}$, compared to 308 and 498 ppm ° C.$^{-1}$ for FPE and Kapton, respectively, within the temperature range of 25 to 300° C. Even under a DC bias of 50 MVm$^{-1}$, the K variation of the c-BCB/BNNS dielectric composite is still as low as 1.6% at 250° C., compared to 8.5% for FPE.

Additionally, the DF of the c-BCB/BNNS dielectric composite at $10^4$ Hz only increases from 0.09% to 0.13% with increasing temperature up to 300° C. While Kapton shows similar stability of DF with temperature under DC bias to the c-BCB/BNNS dielectric composite, appreciable increases in DF have been observed in all the other polymer dielectrics, e.g. DF of FPE jumps from 0.22% at room temperature to 1.35% at 280° C. In view of the above, c-BCB/BNNS may offer a substantially more stable K and DF in the frequency range of $10^2$ to $10^6$ Hz at elevated temperatures compared to known other high $T_g$ polymer dielectrics known in the art.

Figure 17A:
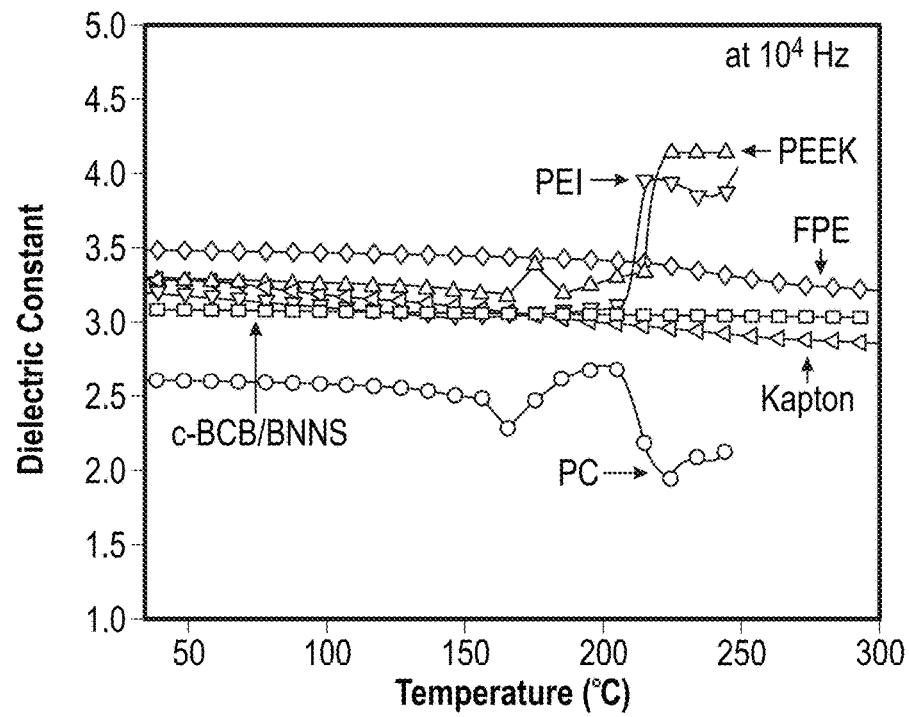
FIG. 17a is a graph of the temperature dependence of the dielectric constant and dissipation factor, respectively, of conventional high-Tg polymer dielectrics and polymer dielectrics according to some embodiments.
Figure 17B:
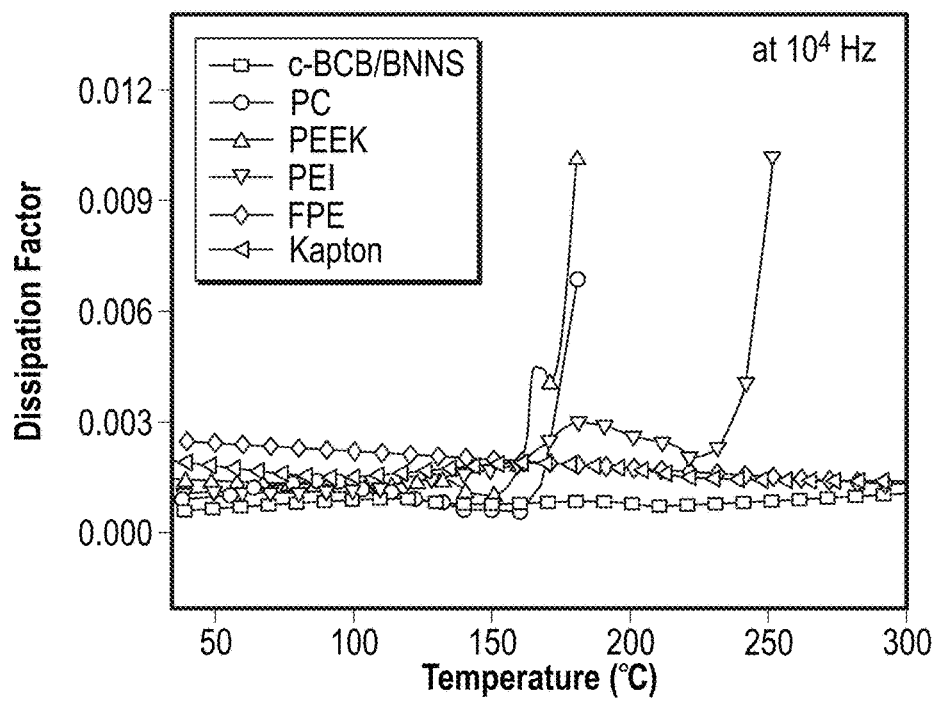
FIG. 17b is a graph of the temperature dependence of the dielectric constant and dissipation factor, respectively, of conventional high-Tg polymer dielectrics and polymer dielectrics according to some embodiments.
Figure 17C:
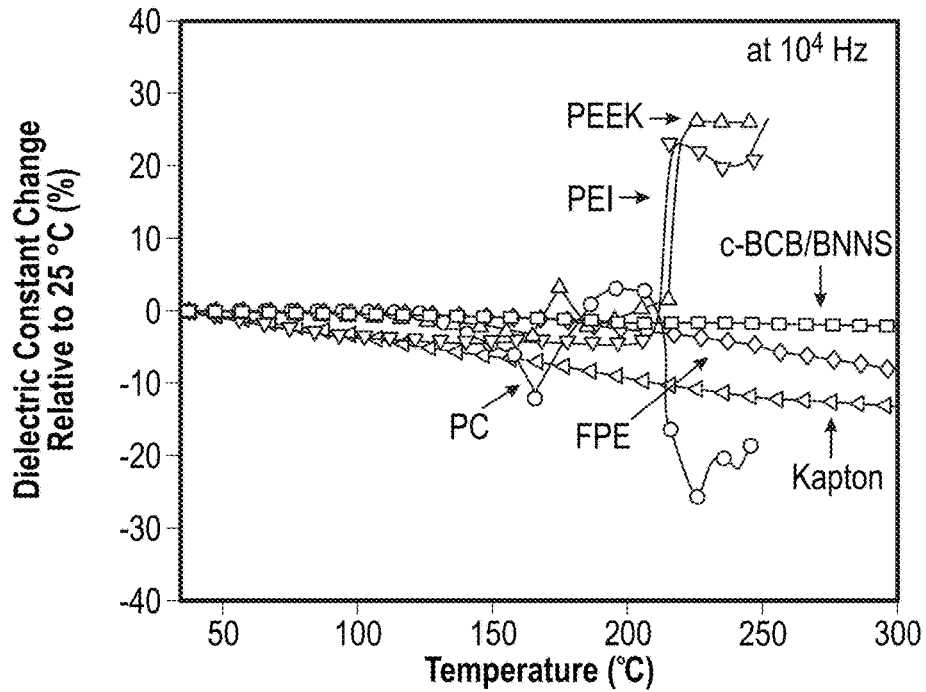
FIG. 17c is a graph of the change in dielectric constant relative to 25° C. of conventional high-Tg polymer dielectrics and polymer dielectrics according to some embodiments.
Figure 17D:
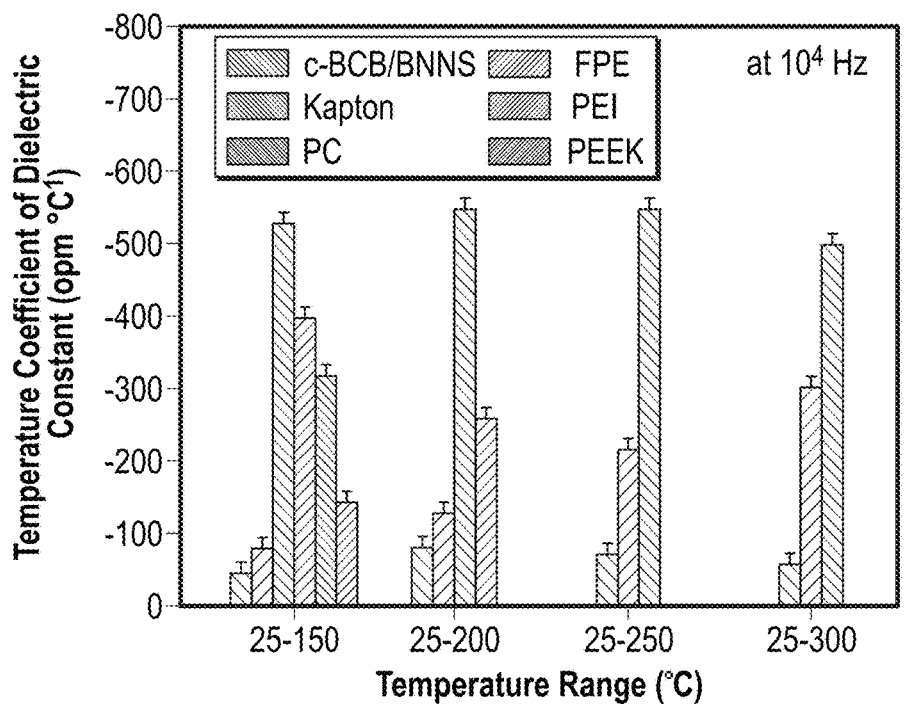
FIG. 17d is a bar chart of the temperature coefficient of the dielectric constant for various temperature ranges for conventional high-Tg polymer dielectrics and polymer dielectrics according to some embodiments.
Figure 17E:
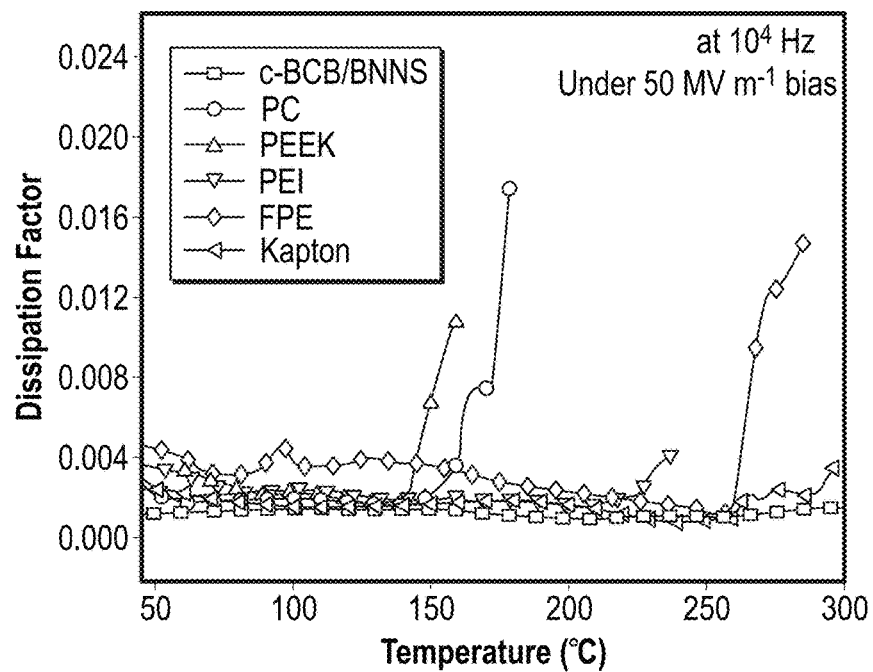
FIG. 17e is a graph of the temperature dependence of the dissipation factor of conventional high-Tg polymer dielectrics and polymer dielectrics according to some embodiments under a DC bias.
Figure 17F:
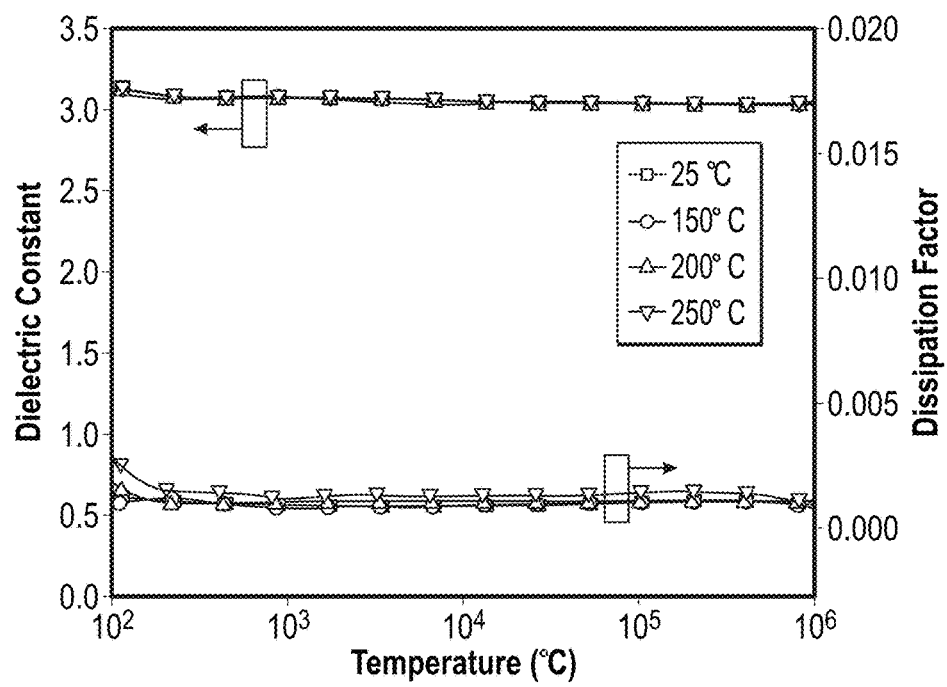
FIG. 17f is a graph of the frequency dependence of the dielectric constant and dissipation factor of polymer dielectrics according to some embodiments, at various temperatures.

FIGS. 17a and 17b are graphs of the temperature dependence of dielectric constants and dissipation factors, respectively, of one embodiment of the c-BCB/BNNS dielectric composite with 10 vol % of BNNSs and the high-$T_g$ polymer dielectrics. FIG. 17c depicts the percentage change of dielectric constants of the c-BCB/BNNS dielectric composite and the high-$T_g$ polymer dielectrics relative to the room-temperature values as a function of temperature, and FIG. 17d shows the temperature coefficients of the dielectric constant of the c-BCB/BNNS dielectric composite and the high-$T_g$ polymer dielectrics (shown in Table 1 excluding the c-BCB—these are also referred to as conventional polymer dielectrics) over various temperature ranges. The temperature coefficient of the dielectric constant, $T_{\varepsilon r}$, for a given temperature range (from $T_i$ to $T_f$), is defined as $\tau_{\varepsilon r} = (K_f - K_i)/(K_{ref}(T_f - T_1))$, where $K_{ref}$ is the dielectric constant at room temperature, $T_i$ and $T_f$ are the low end and high end temperatures, respectively, and $K_i$ and $K_f$ are the dielectric constants at $T_i$ and $T_f$, respectively. FIG. 17e is a graph of the temperature dependence of dissipation factors of the c-BCB/BNNS dielectric composite and high-$T_g$ polymer dielectrics under a DC bias of 50 MVm$^{-1}$, and FIG. 17f depicts the frequency dependence of dielectric constants and dissipation factors of the c-BCB/BNNS dielectric composite at different temperatures.

Figure 18:
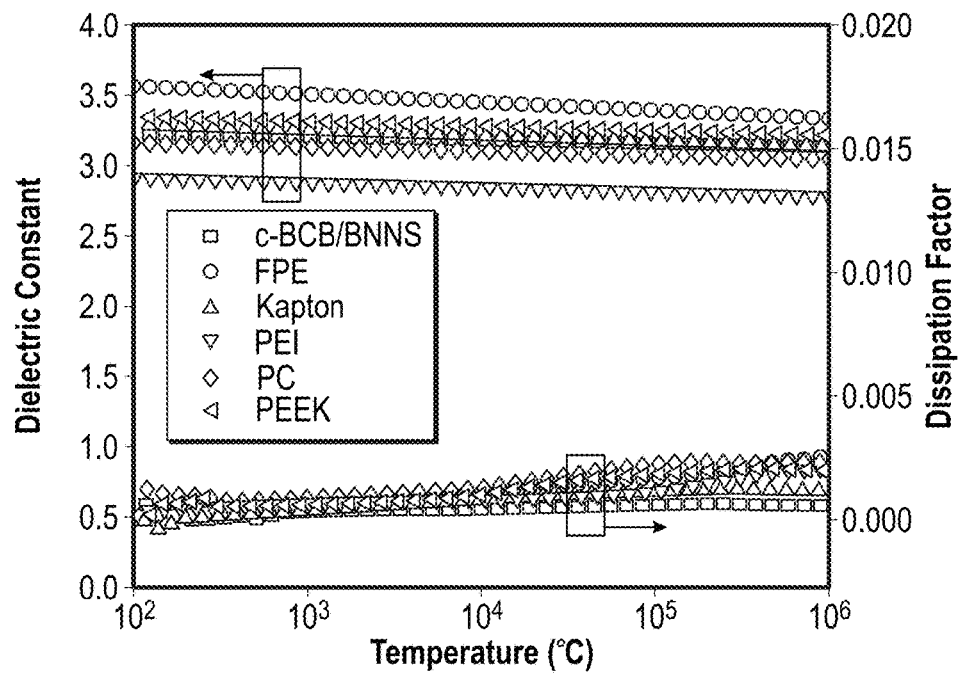
FIG. 18 is a graph of the dependence of the dielectric constant and dissipation factor of conventional high-Tg polymer dielectrics and polymer dielectrics according to some embodiments.

FIG. 18 shows the frequency dependence of the dielectric constant and dissipation factor of one embodiment of the c-BCB/BNNS dielectric composite with 10 vol % of BNNSs and the high-$T_g$ polymer dielectrics at room temperature. Although many of the high-temperature polymer dielectrics show good frequency-stability of dielectric constant, their dissipation factors begin to increase at around 104 Hz. In contrast, the c-BCB/BNNS dielectric composite exhibits excellent stability of both dielectric constant and dissipation factor over the entire frequency range.

Figure 19A:
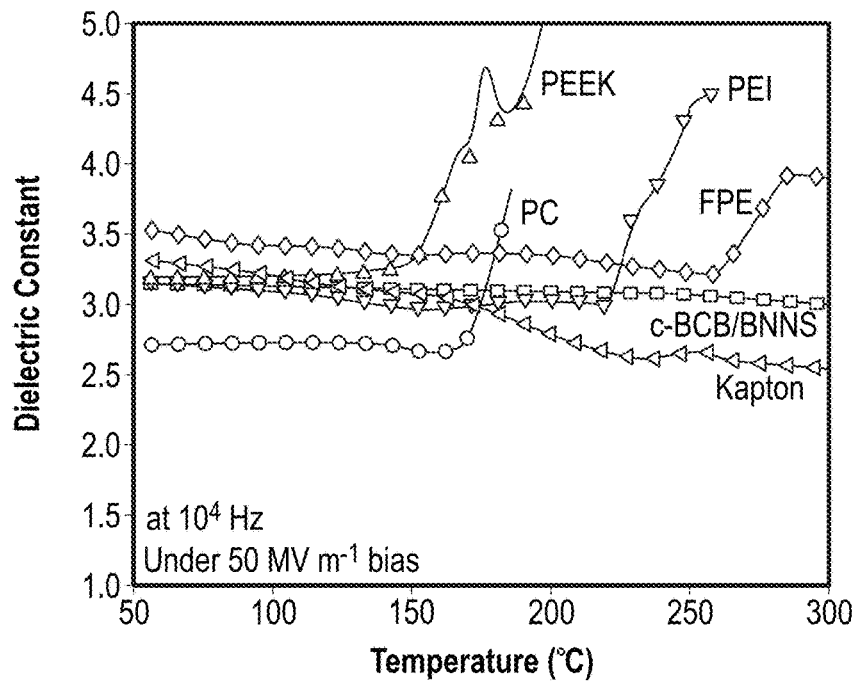
FIG. 19a depicts the temperature dependence of the dielectric response of conventional high-Tg polymer dielectrics and polymer dielectrics according to some embodiments, under a DC bias.
Figure 19B:
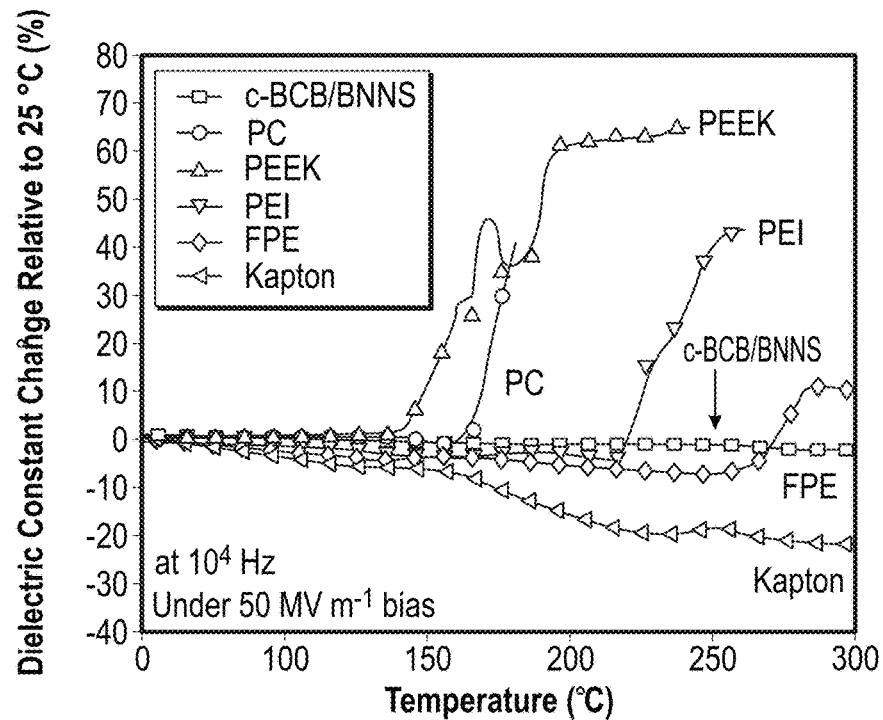
FIG. 19b depicts the temperature dependence of the dielectric response of conventional high-Tg polymer dielectrics and polymer dielectrics according to some embodiments, under a DC bias.

FIGS. 19a-19b are graphs of the temperature dependence of the dielectric constant and percentage change of dielectric constant, respectively, of one embodiment of the c-BCB/BNNS dielectric composite with 10 vol % of BNNSs and the high-$T_g$ polymer dielectrics at $10^4$ Hz under a DC bias of 50 $MVm^{-1}$. The percentage change of dielectric constant of the c-BCB/BNNS dielectric composite is only 1.6% at 250° C., and increases to ~4% at 300° C. In contrast, all the conventional high temperature polymer dielectrics tested herein display a variation of dielectric constant larger than 10% within the same temperature range.

Figure 20A:
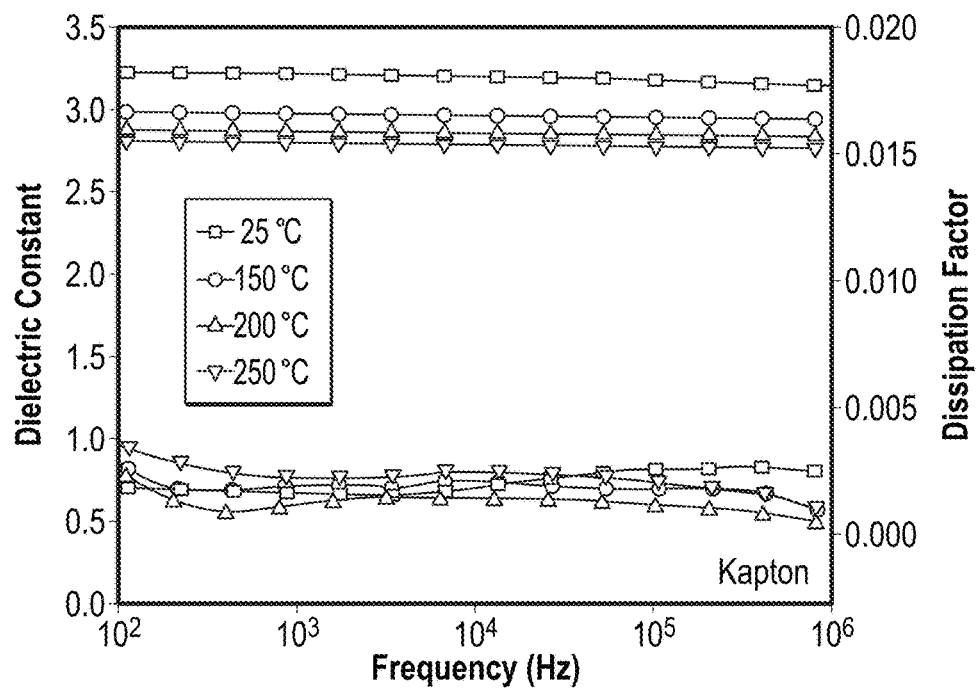
FIG. 20a depicts the frequency dependence of the dielectric response of conventional high-$T_g$ polymer dielectrics.
Figure 20B:
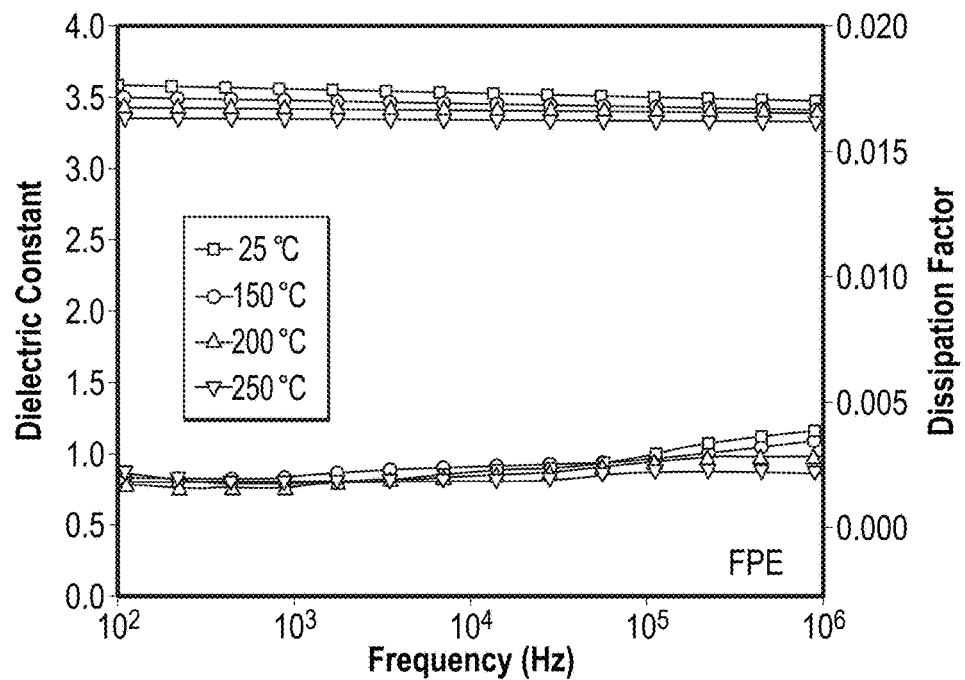
FIG. 20b depicts the frequency dependence of the dielectric response of conventional high-$T_g$ polymer dielectrics.
Figure 20C:
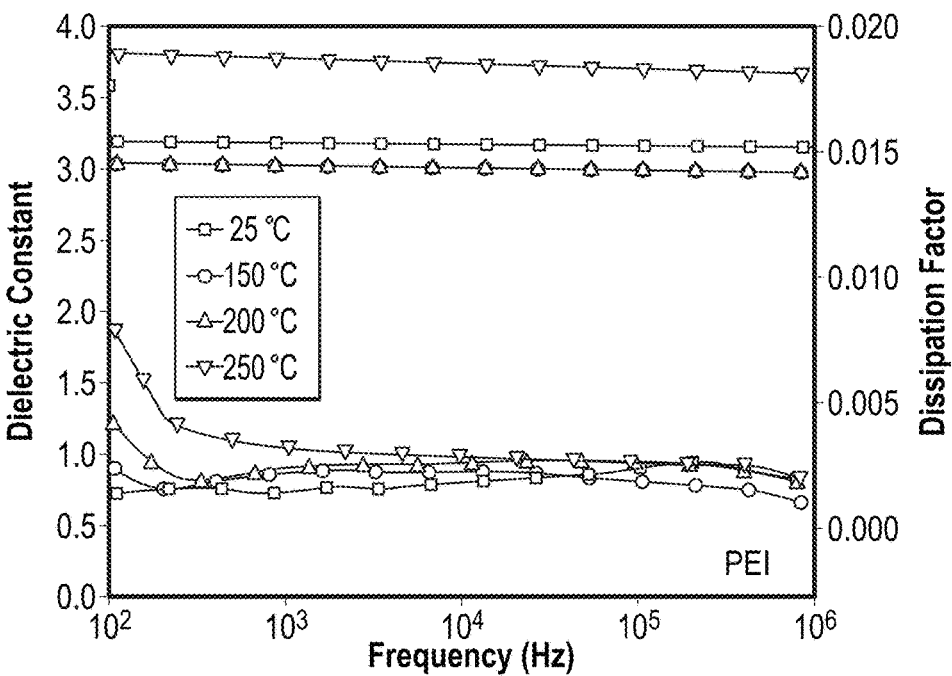
FIG. 20c depicts the frequency dependence of the dielectric response of conventional high-$T_g$ polymer dielectrics.

FIGS. 20a-20c are graphs of the frequency dependence of the dialectic constant and dissipation factor of Kapton, FPE, and PEI, respectively, at different temperatures. These results indicate that the dissipation factors of these high-temperature polymer dielectrics may be unstable over various frequency ranges at certain temperatures, and the variations of dielectric constant from room temperature to 250° C. may be relatively large.

Figure 21A:
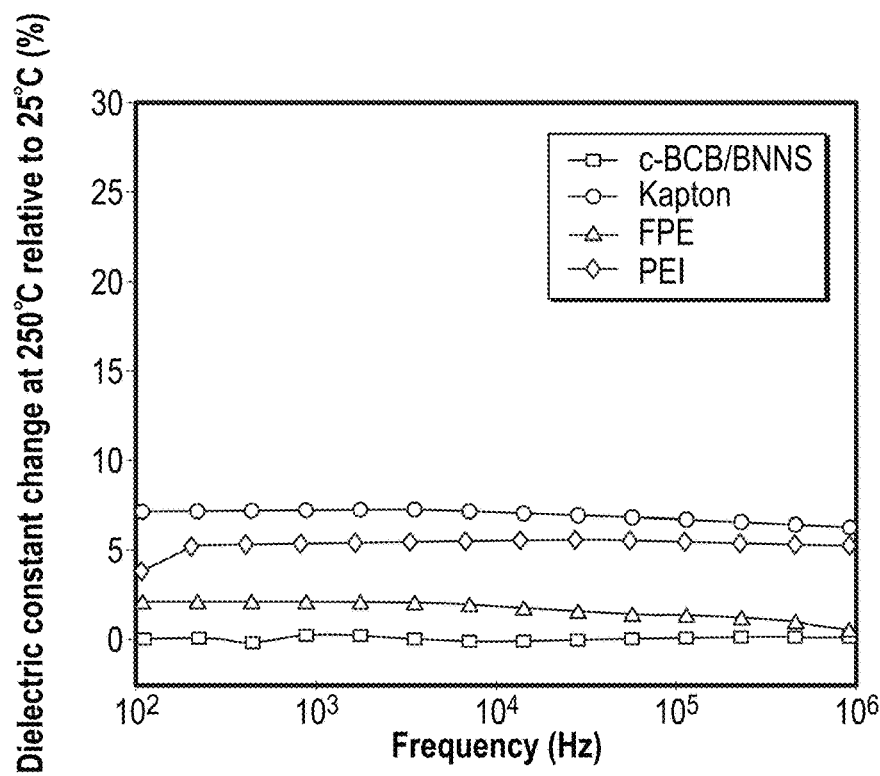
FIG. 21a depicts the frequency dependence of the dielectric response of conventional high-Tg polymer dielectrics and polymer dielectrics according to some embodiments.
Figure 21B:
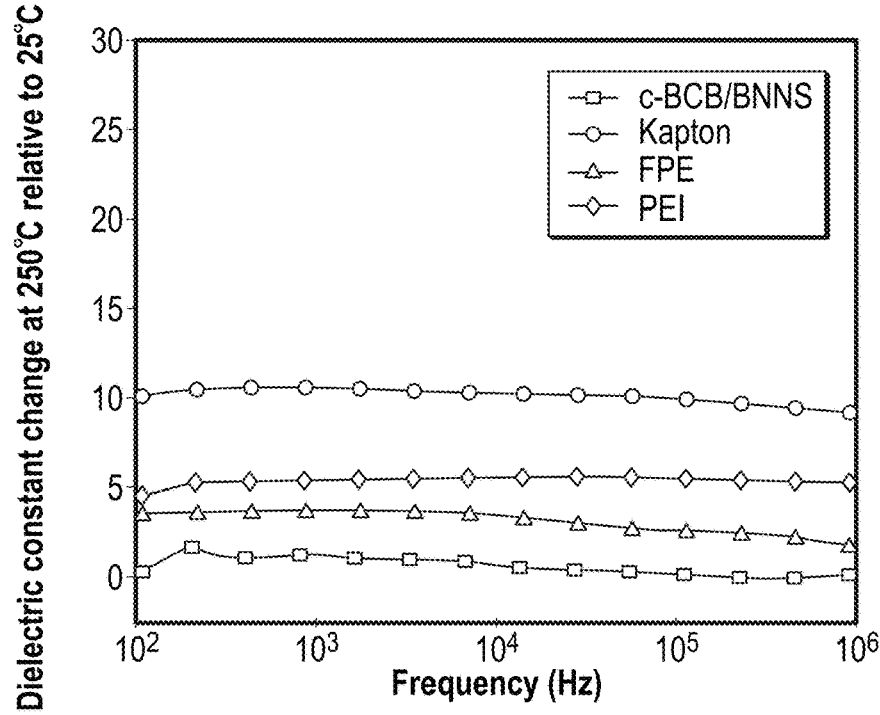
FIG. 21b depicts the frequency dependence of the dielectric response of conventional high-Tg polymer dielectrics and polymer dielectrics according to some embodiments.
Figure 21C:
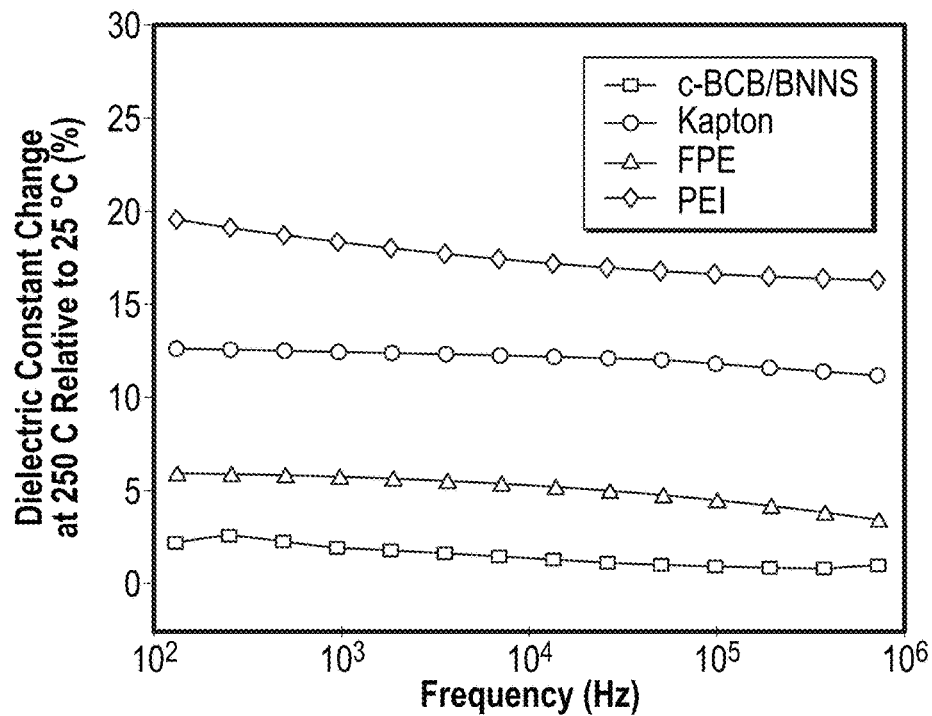
FIG. 21c depicts the frequency dependence of the dielectric response of conventional high-Tg polymer dielectrics and polymer dielectrics according to some embodiments.
Figure 22A:
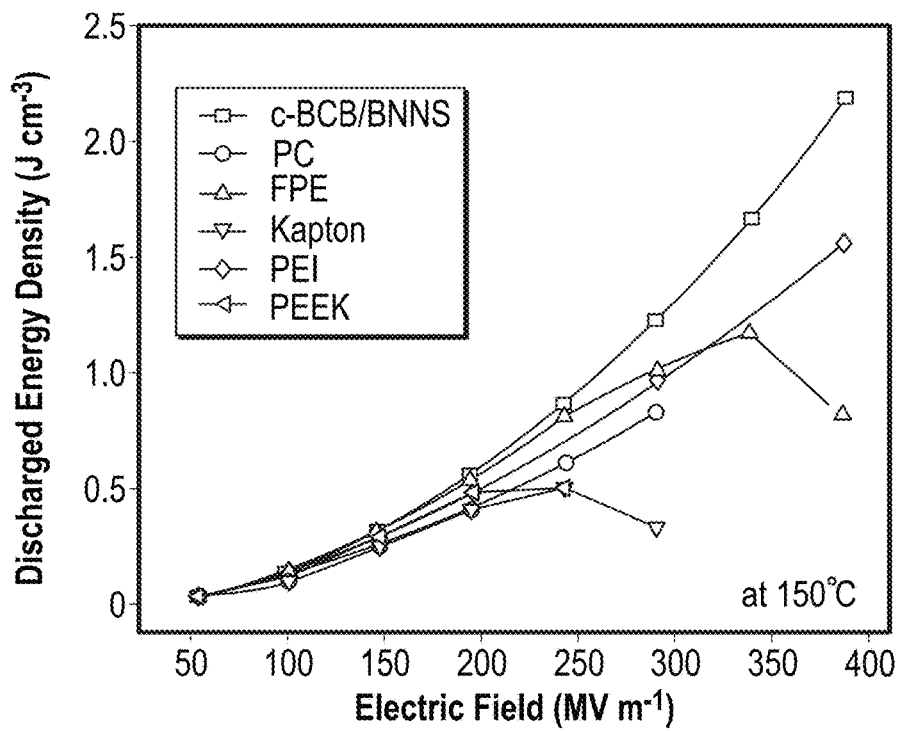
FIG. 22a is a graph of the discharged energy density and charge-discharge efficiency, respectively, versus temperature of conventional high-Tg polymer dielectrics and polymer dielectrics according to some embodiments, at 150° C.
Figure 22B:
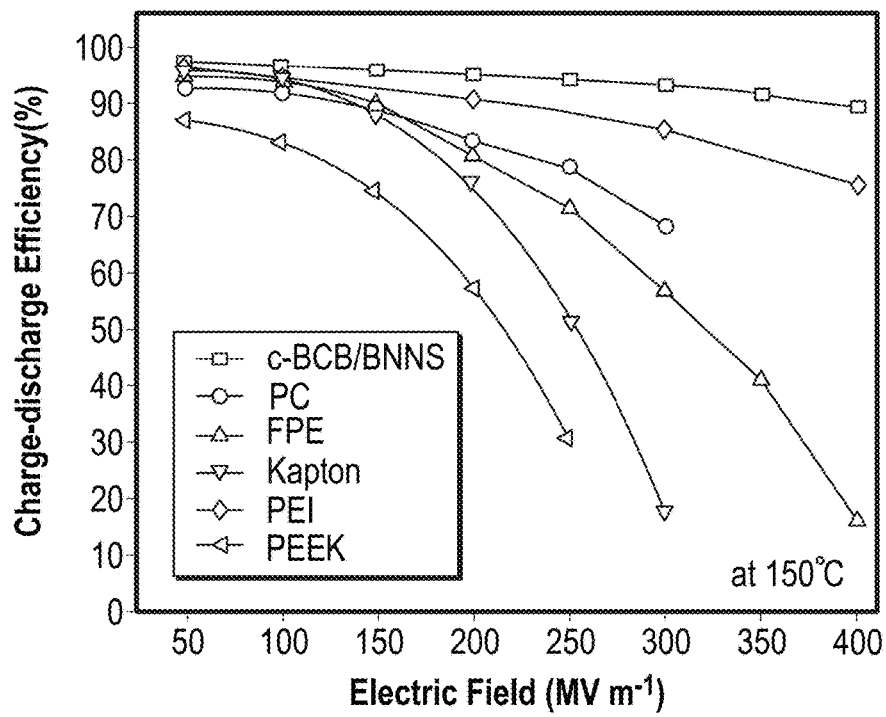
FIG. 22b is another graph of the discharged energy density and charge-discharge efficiency, respectively, versus temperature of conventional high-Tg polymer dielectrics and polymer dielectrics according to some embodiments, at 150° C.
Figure 22C:
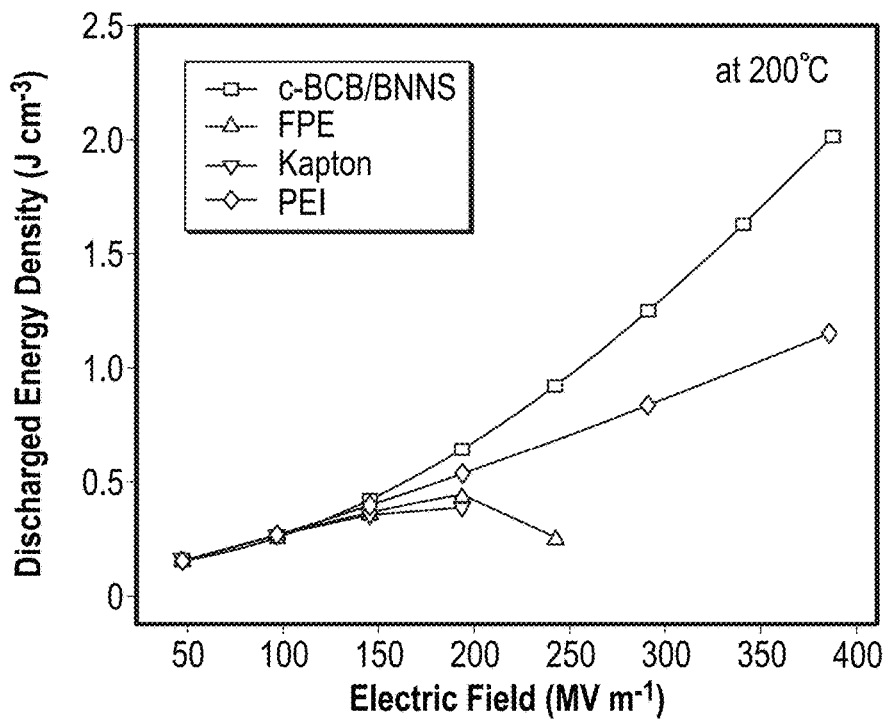
FIG. 22c is a graph of the discharged energy density and charge-discharge efficiency, respectively, versus temperature of conventional high-Tg polymer dielectrics and polymer dielectrics according to some embodiments, at 200° C.
Figure 22D:
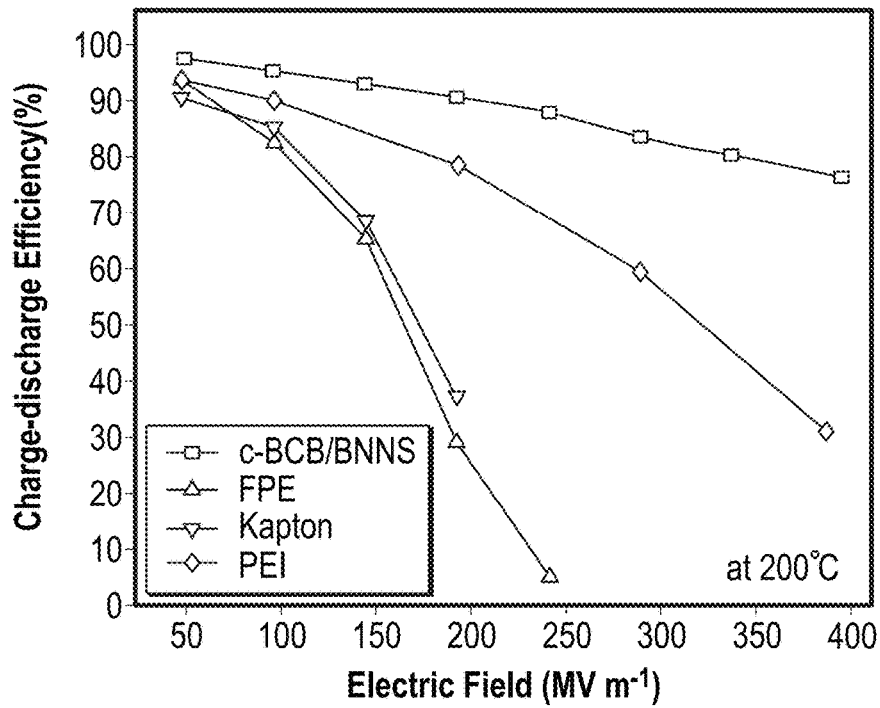
FIG. 22d is another graph of the discharged energy density and charge-discharge efficiency, respectively, versus temperature of conventional high-Tg polymer dielectrics and polymer dielectrics according to some embodiments, at 200° C.
Figure 22E:
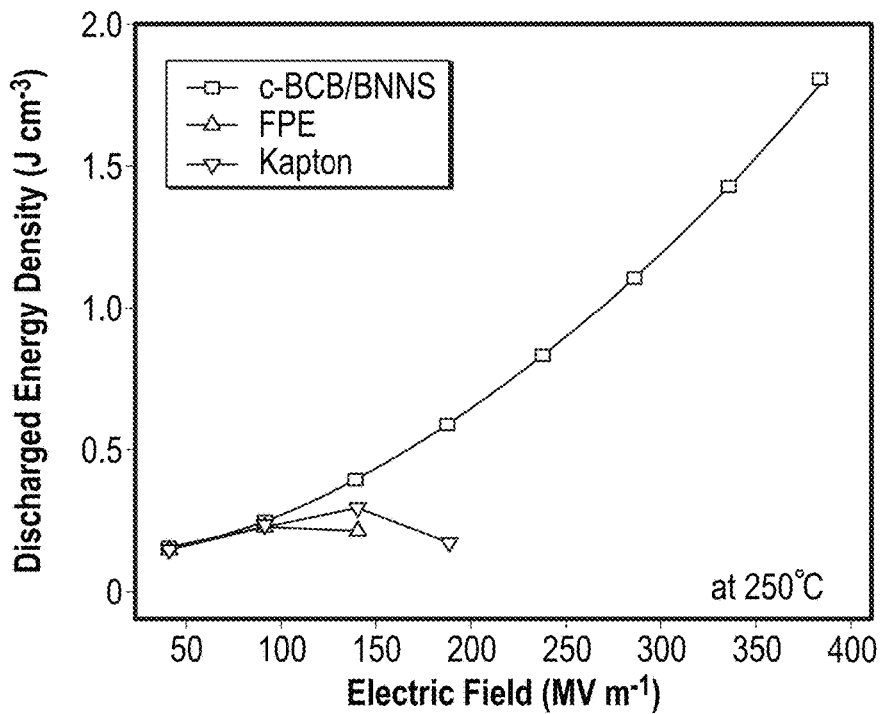
FIG. 22e is a graph of the discharged energy density and charge-discharge efficiency, respectively, versus temperature of conventional high-Tg polymer dielectrics and polymer dielectrics according to some embodiments, at 250° C.
Figure 22F:
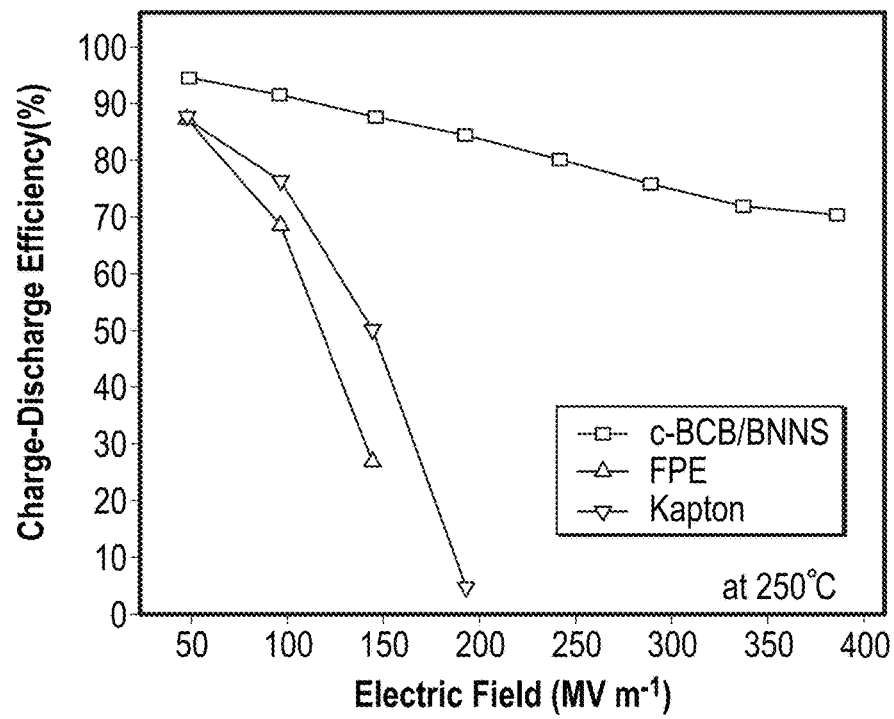
FIG. 22f is a graph of the discharged energy density and charge-discharge efficiency, respectively, versus temperature of conventional high-Tg polymer dielectrics and polymer dielectrics according to some embodiments, at 250° C.

FIGS. 21a-21c are graphs of the percentage change of dielectric constant of one embodiment of the c-BCB/BNNS dielectric composite with 10 vol % of BNNSs and high-temperature polymer dielectrics at 150° C., 200° C. and 250° C., respectively, relative to room temperature as a function of frequency.

High-Field, High-Temperature Capacitive Energy Storage Properties of the c-BCB/BNNS Dielectric Composite and High $T_g$ Polymer Dielectrics The high-field capacitive energy storage properties at elevated temperatures were also investigated. It has been discovered that some embodiments of the c-BCB/BNNS dielectric composite may outperform many other high-Tg polymer dielectrics at temperatures ranging from 150 to 250° C. in terms of the discharged energy density ($U_e$) and the charge-discharge efficiency ($\eta$). For example, in one embodiment, the c-BCB/BNNS dielectric composite can discharge an $U_e$ exceeding 2.2 J cm$^{-3}$ under an applied electric field of 400 MV m$^{-1}$ with a $\eta$ of larger than 90% at 150° C. At 200° C., the c-BCB/BNNS dielectric composite may have a $U_e$ of 2 Jcm$^{-3}$ under an applied field of 400 MVm$^{-1}$, which is twice that of PEI, as well as a more than 1.5 times higher $\eta$ than PEI.

Moreover, as the temperature is further raised to 250° C., a temperature at which none of the high-$T_g$ polymer dielectrics can operate beyond an applied electric field of 150 MVm$^{-1}$, the c-BCB/BNNS dielectric composite according to some embodiments may be functional up to an applied field of 400 MVm$^{-1}$ with an $U_e$ of ~1.8 J cm$^{-3}$. Remarkably, at 200 MVm$^{-1}$, which is a common operating condition of BOPP film capacitors in electric vehicles, the $\eta$ of the c-BCB/BNNS dielectric composite at 150° C., i.e. ~97%, is the same as that of BOPP at 70° C. Without wishing to be bound by any theory, this indicates that by replacing BOPP with c-BCB/BNNS, the complex cooling system for power inverters in electric vehicles may be eliminated. Furthermore, under these conditions, the $U_e$ of the c-BCB/BNNS dielectric composite is over 40% higher than that of BOPP due to its higher K, i.e. 3.1 vs. 2.2 of BOPP.

FIG. 22 depicts graphs of the discharged energy density and charge-discharge efficiency of one embodiment of the c-BCB/BNNS dielectric composite with 10 vol % of BNNSs and high-$T_g$ polymer dielectrics measured at 150° C. (FIGS. 22a-22b), 200° C. (FIGS. 22c-22d), and 250° C. (FIGS. 22e-22f).

Figure 23A:
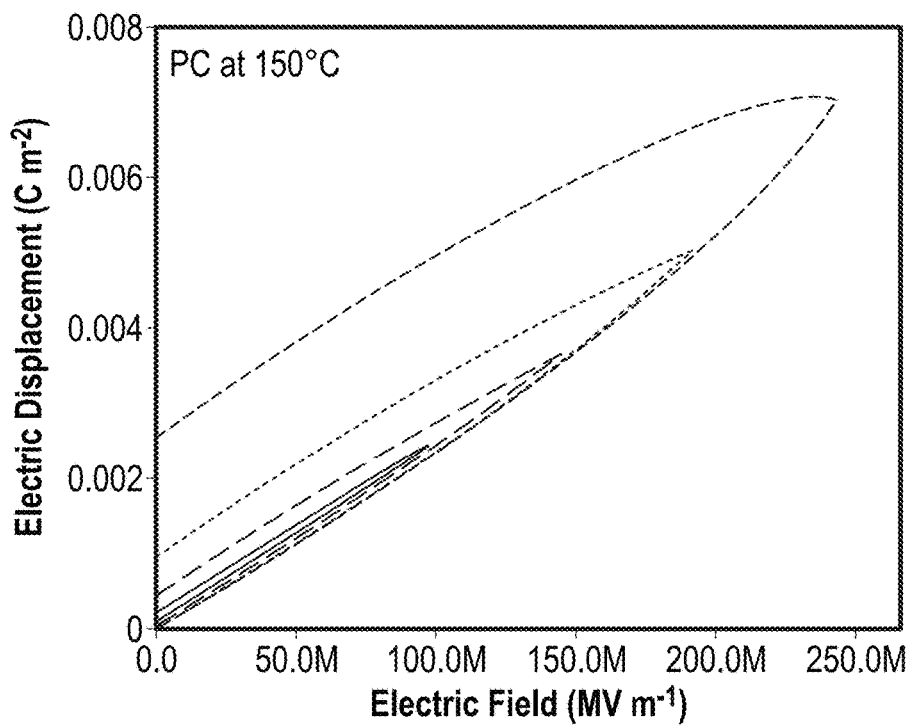
FIG. 23a is a graph of electric field-electric displacement loops for one conventional high-Tg polymer dielectric.
Figure 23B:
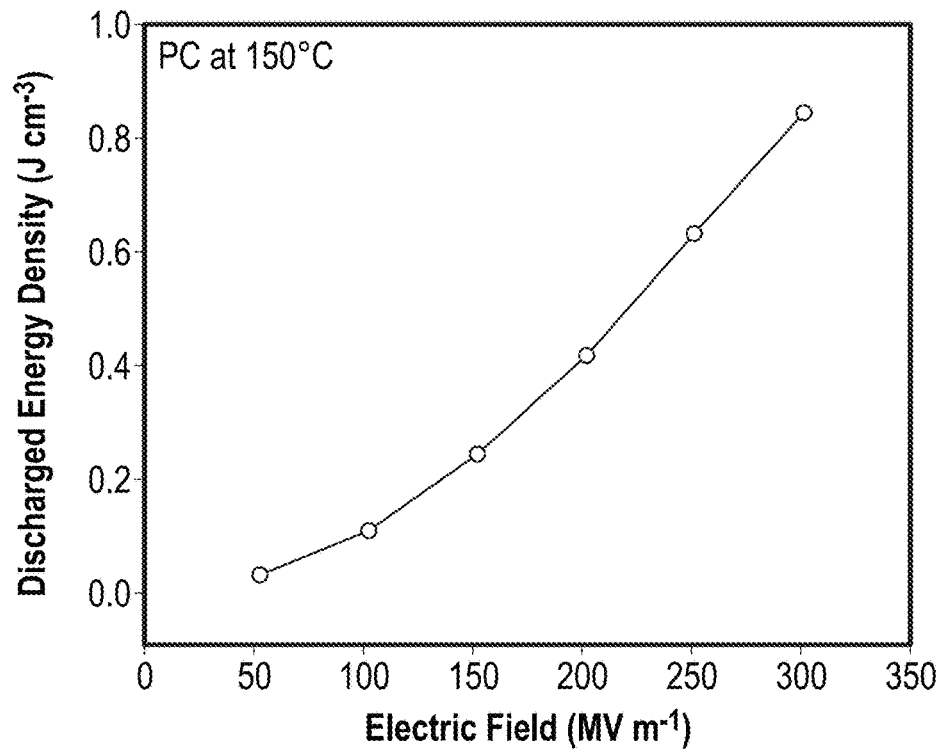
Figure 23C:
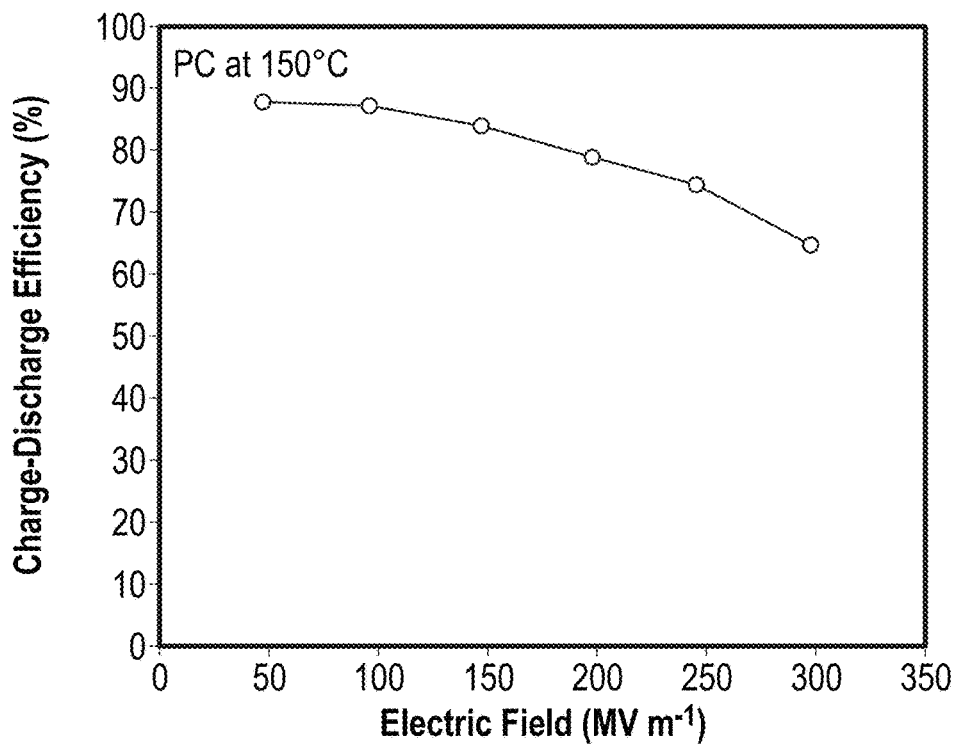
Figure 24A:
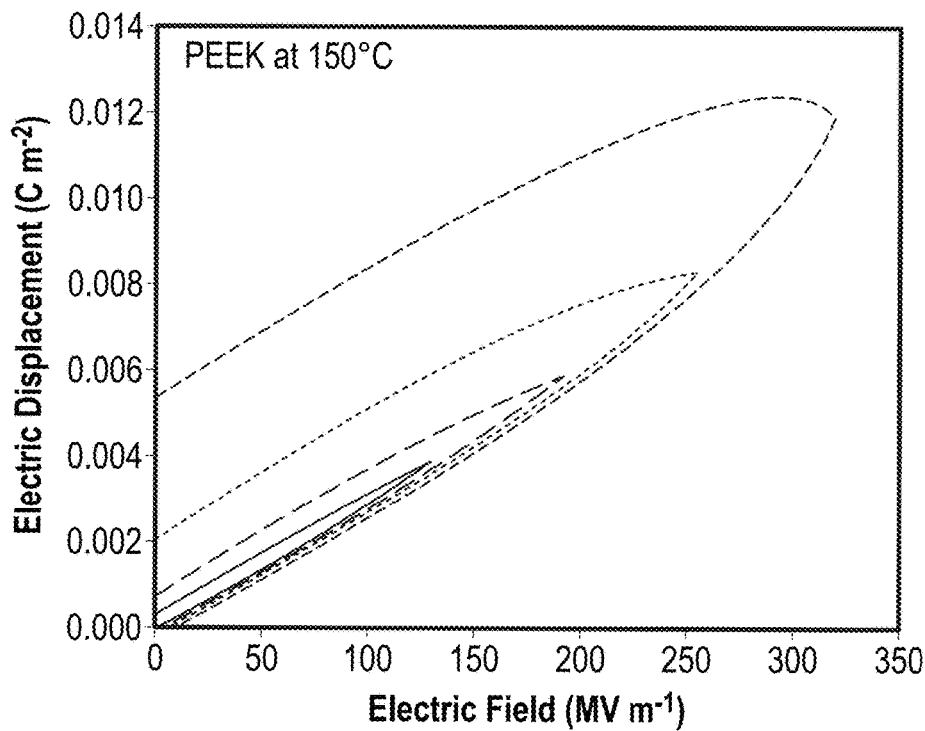
FIG. 24a is a graph of electric field-electric displacement loops for one conventional high-Tg polymer dielectric.
Figure 24B:
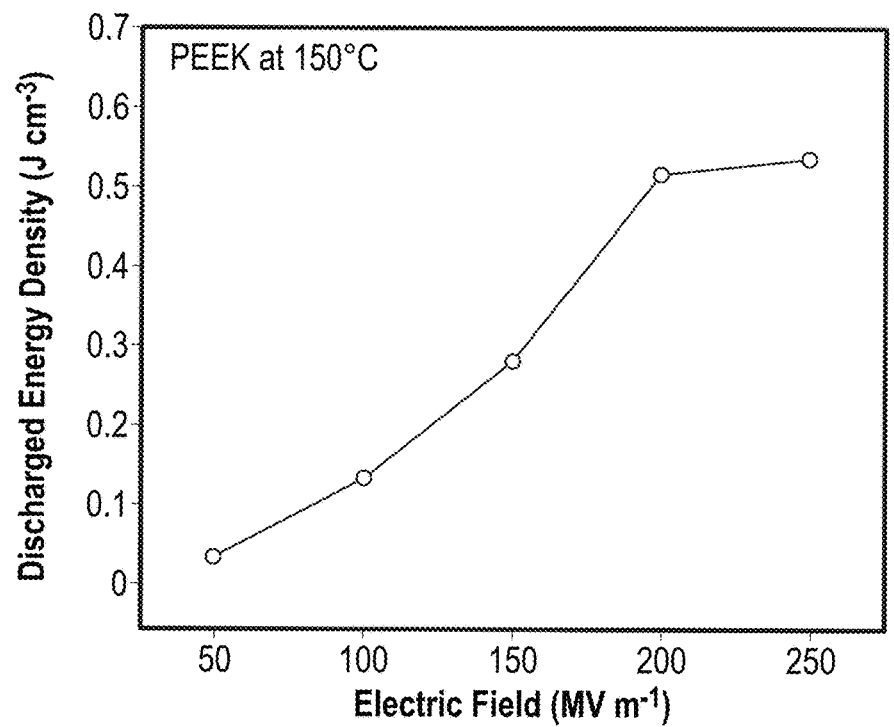
Figure 24C:
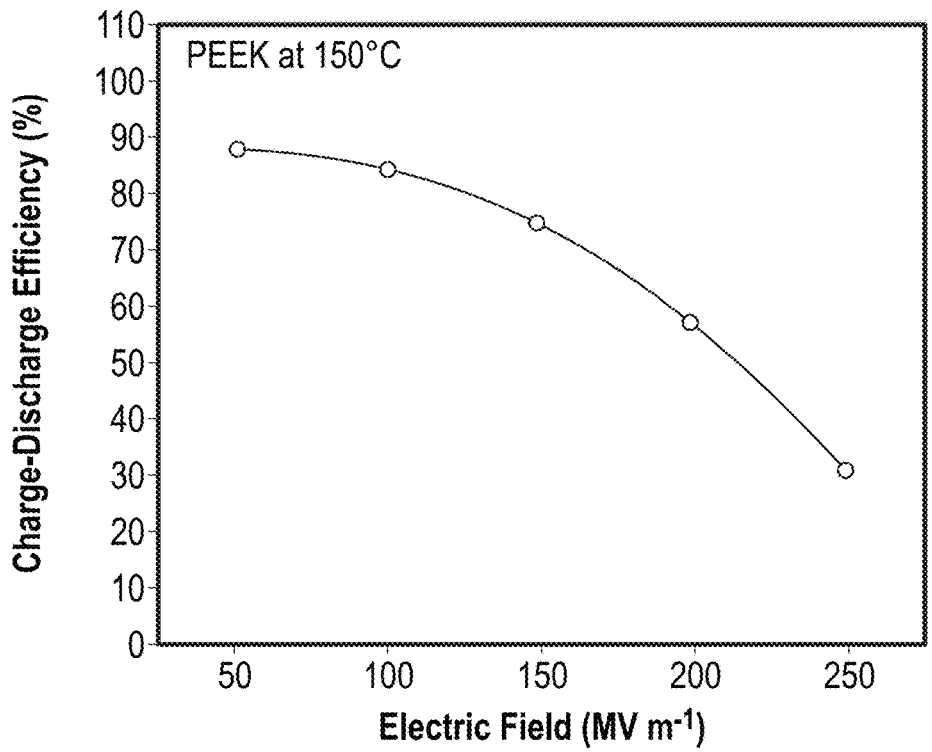
Figure 25A:
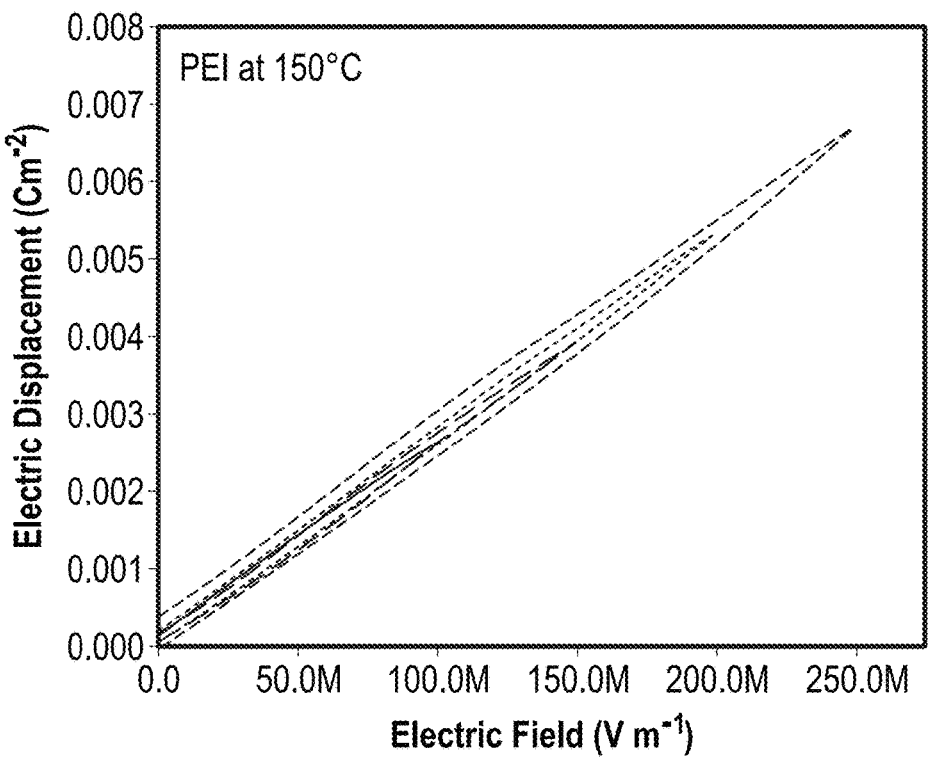
FIG. 25a is a graph of electric field-electric displacement loops for one conventional high-Tg polymer dielectric.
Figure 25B:
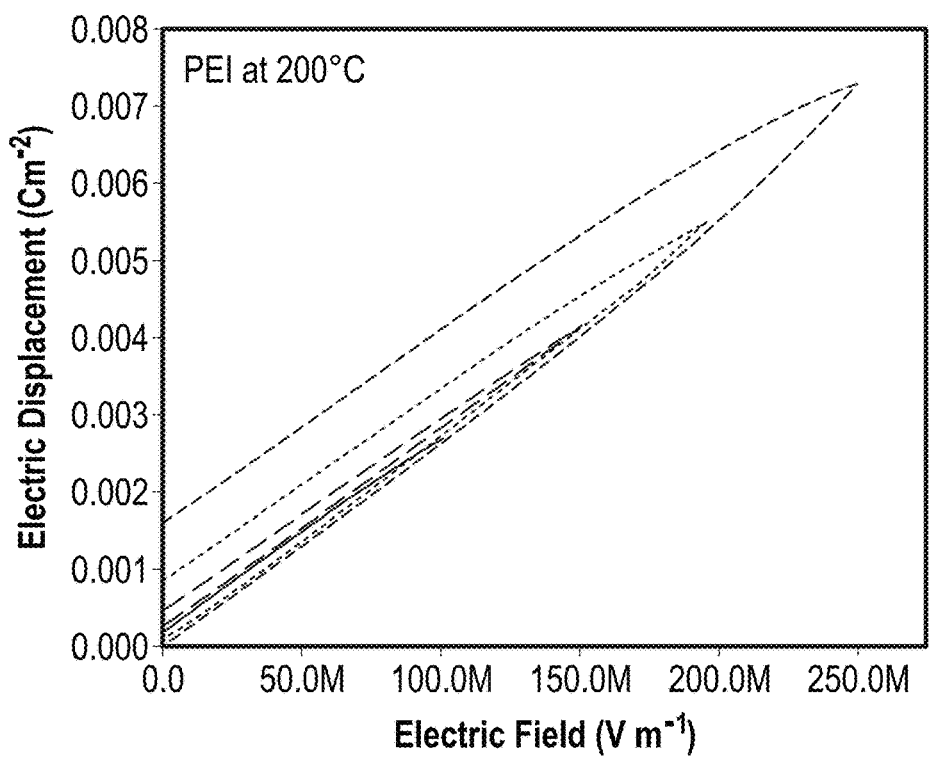
FIG. 25b is a graph of electric field-electric displacement loops for one conventional high-Tg polymer dielectric.
Figure 25C:
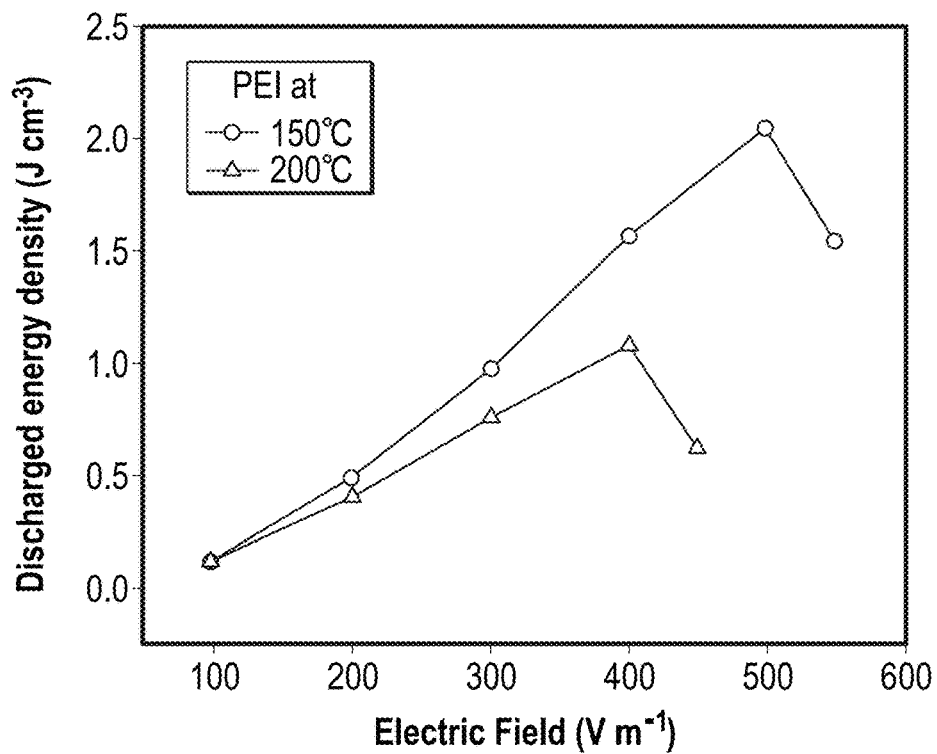
FIG. 25c is a graph of discharged energy density and charge-discharge efficiency, respectively, versus electric field, for the conventional high-Tg polymer dielectric of FIGS. 25a-25b.
Figure 25D:
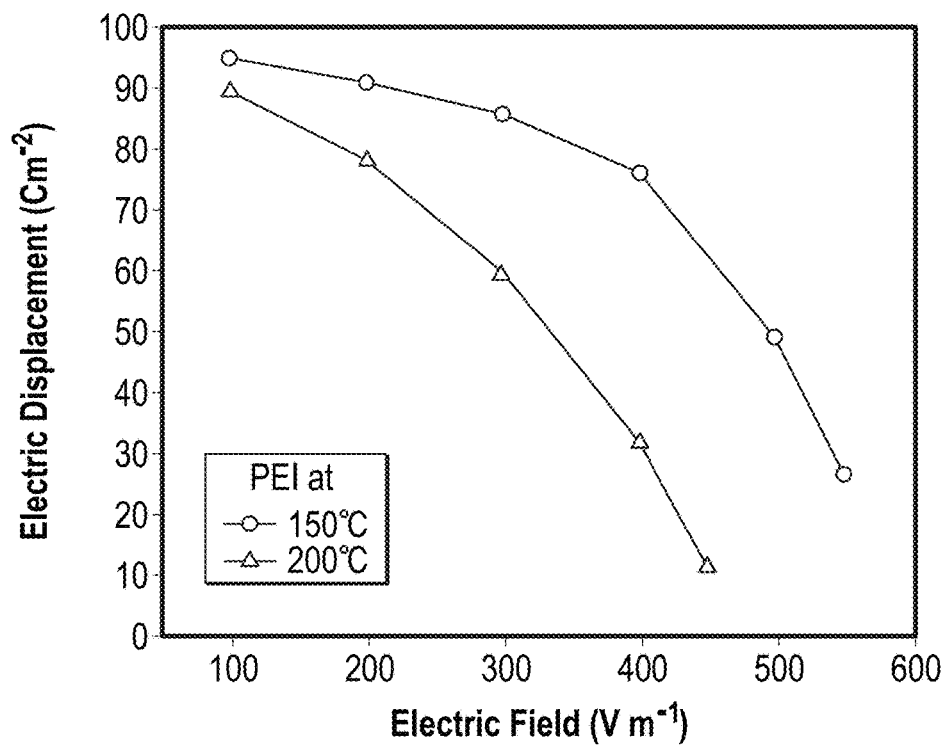
FIG. 25d is a graph of discharged energy density and charge-discharge efficiency, respectively, versus electric field, for the conventional high-Tg polymer dielectric of FIGS. 25a-25b.
Figure 26A:
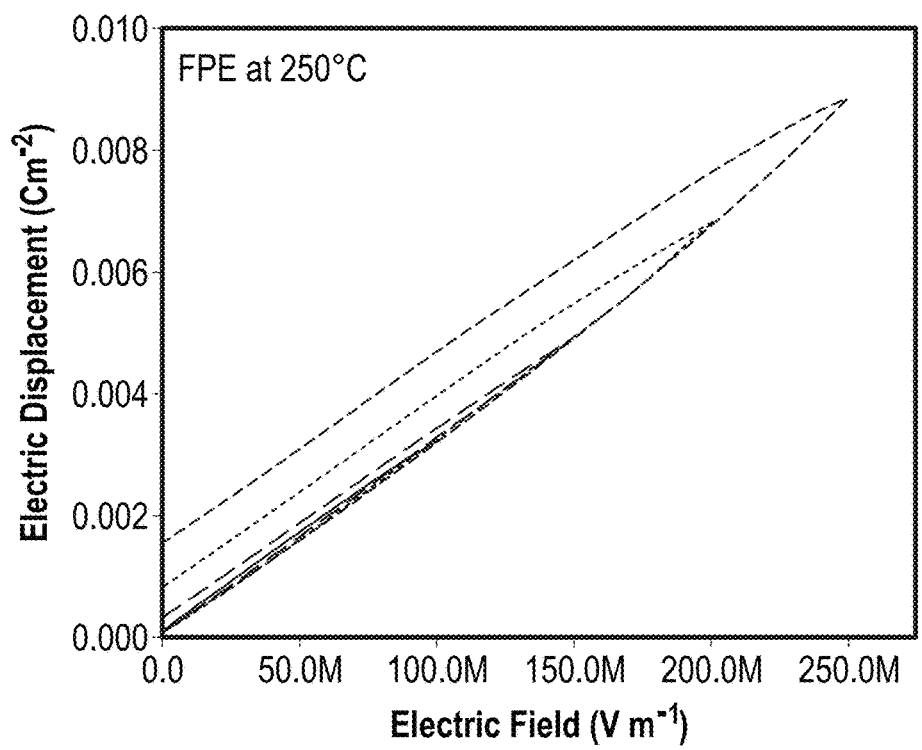
FIG. 26a is a graph of electric field-electric displacement loops for one conventional high-Tg polymer dielectric.
Figure 26B:
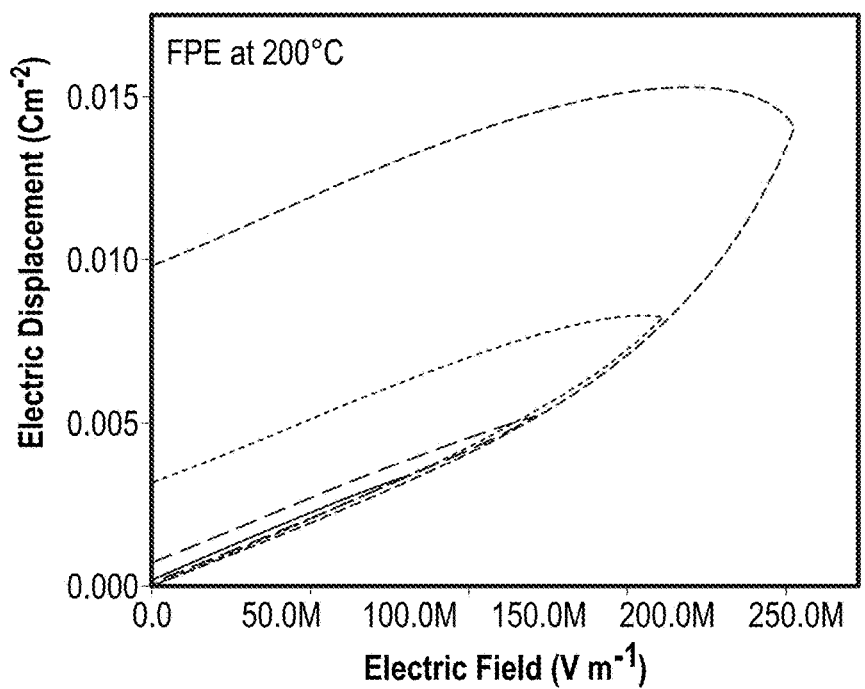
FIG. 26b is a graph of electric field-electric displacement loops for one conventional high-Tg polymer dielectric.
Figure 26C:
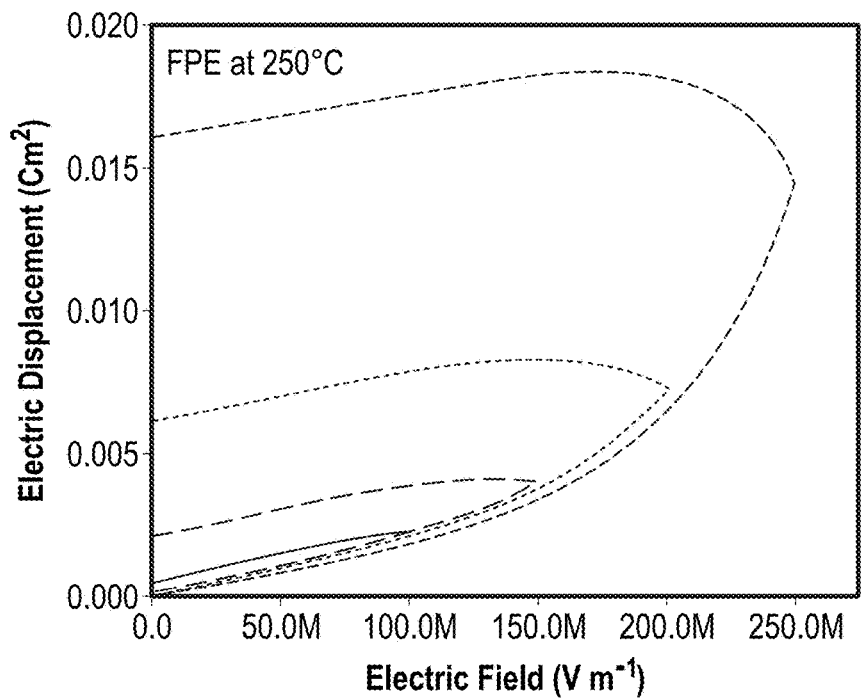
FIG. 26c is a graph of electric field-electric displacement loops for one conventional high-Tg polymer dielectric.
Figure 26D:
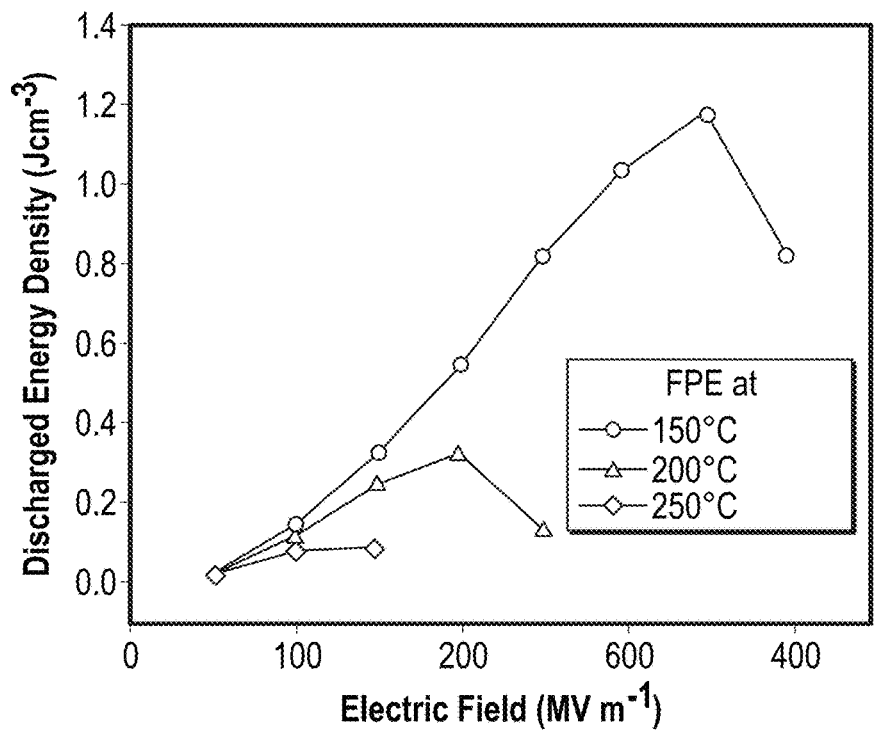
FIG. 26d is a graph of discharged energy density and charge-discharge efficiency, respectively, versus electric field, for the conventional high-Tg polymer dielectric of FIGS. 26a-26c.
Figure 26E:
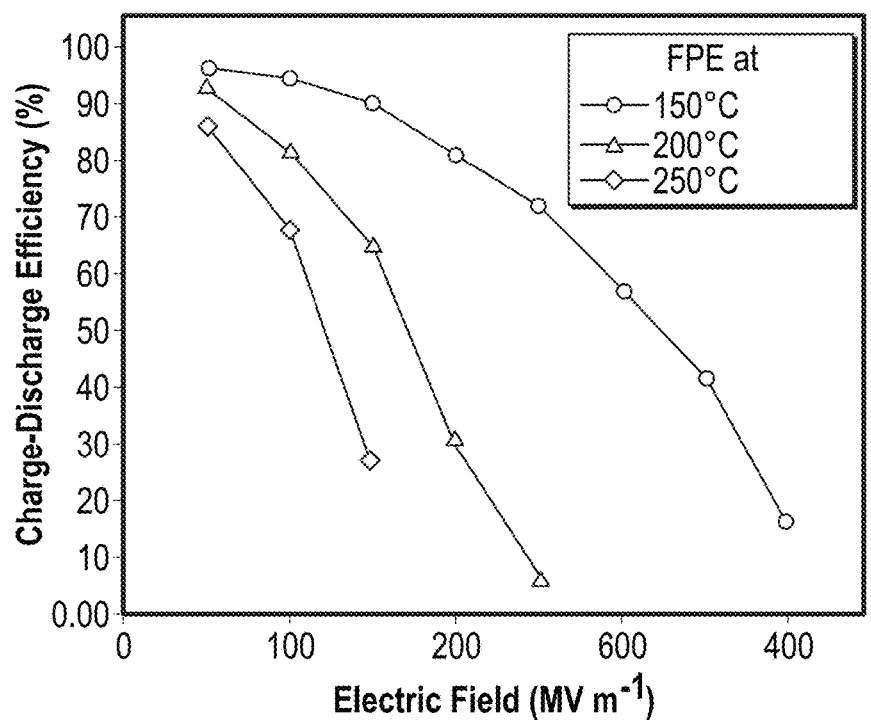
FIG. 26e is a graph of discharged energy density and charge-discharge efficiency, respectively, versus electric field, for the conventional high-Tg polymer dielectric of FIGS. 26a-26c.
Figure 27A:
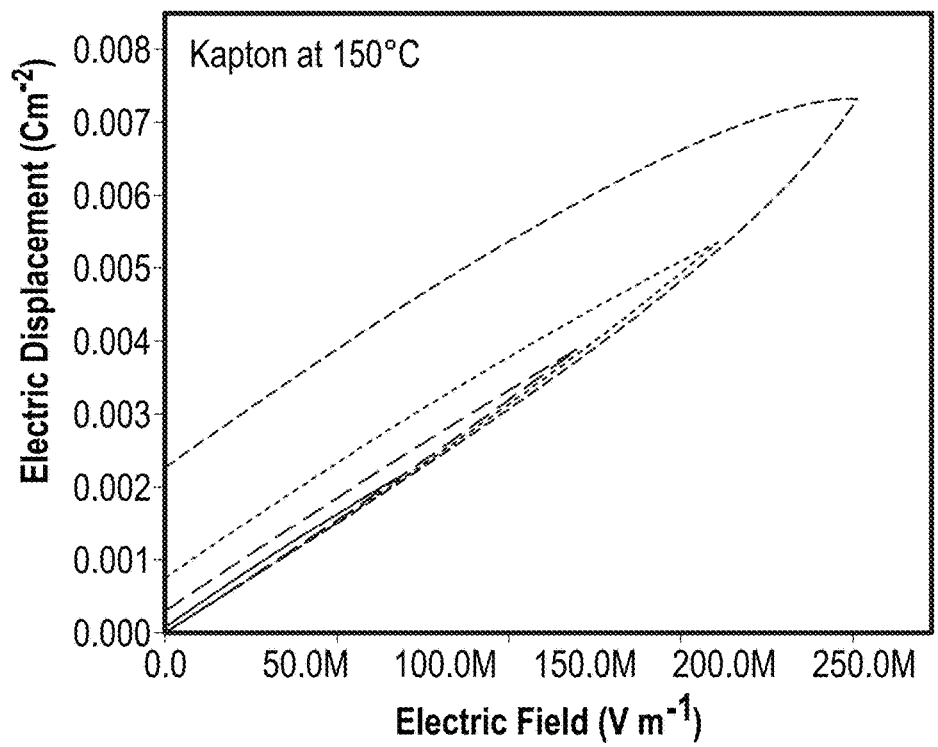
FIG. 27a is a graph of electric field-electric displacement loops for one conventional high-Tg polymer dielectric.
Figure 27B:
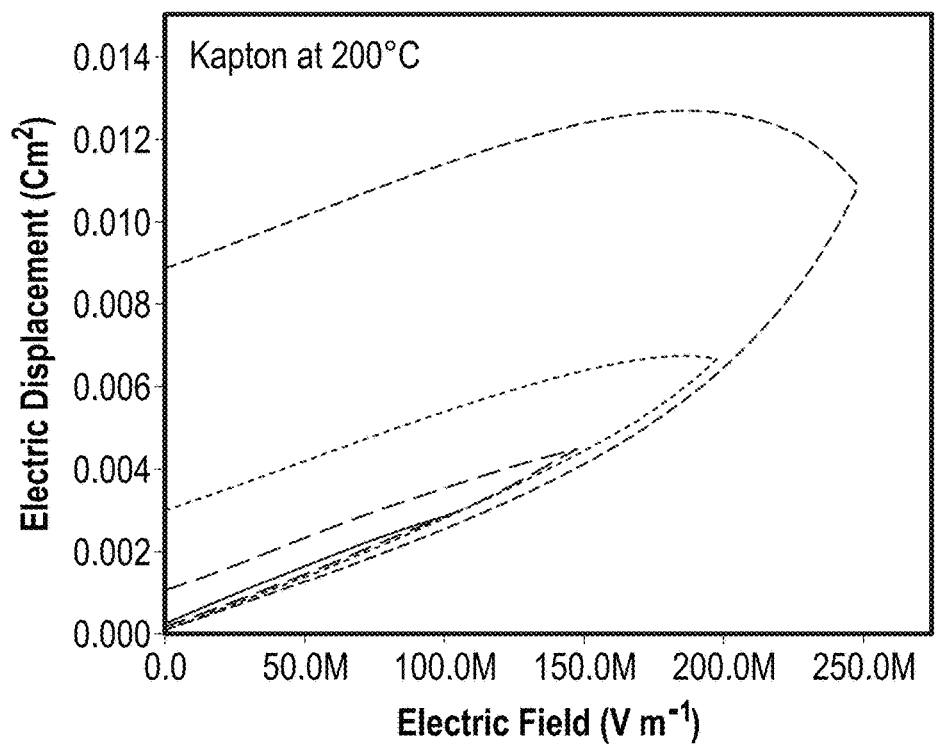
FIG. 27b is a graph of electric field-electric displacement loops for one conventional high-Tg polymer dielectric.
Figure 27C:
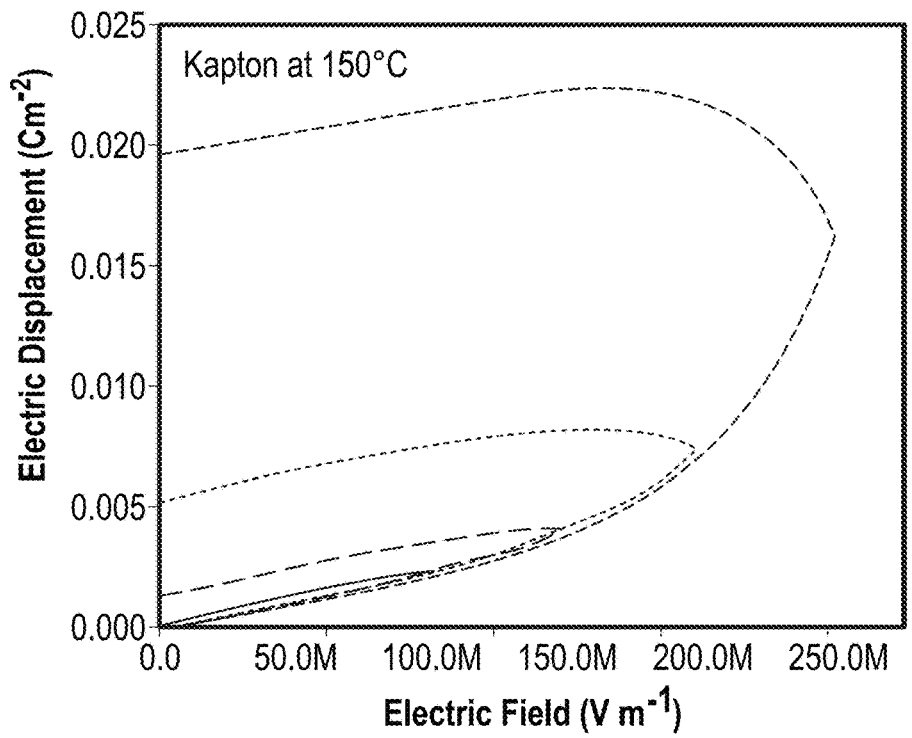
FIG. 27c is a graph of electric field-electric displacement loops for one conventional high-Tg polymer dielectric.
Figure 27D:
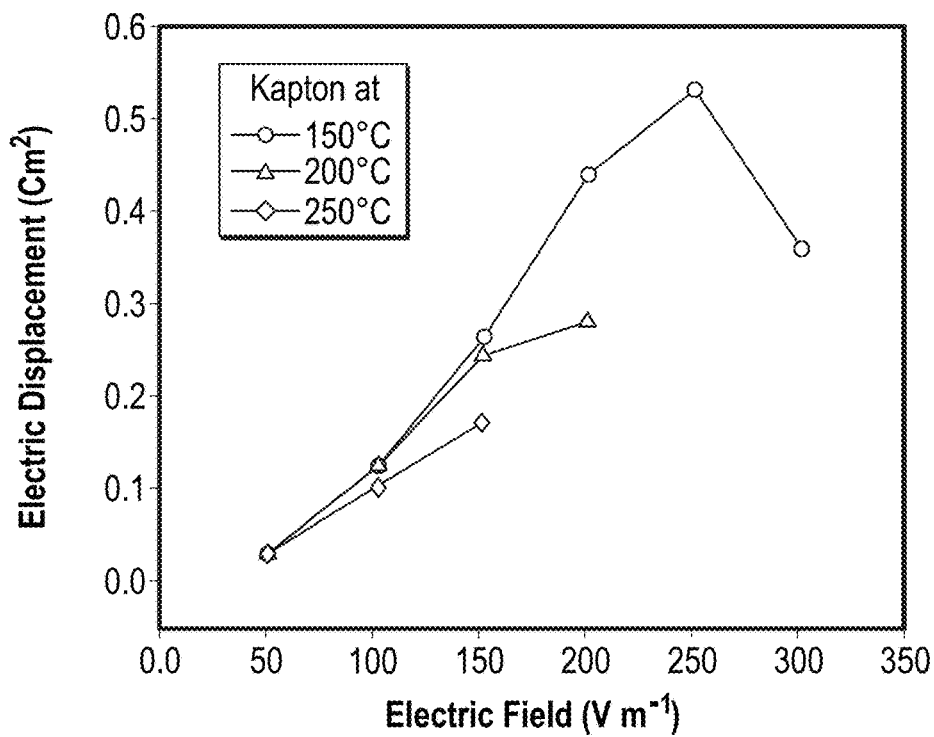
FIG. 27d is a graph of discharged energy density and charge-discharge efficiency, respectively, versus electric field, for the conventional high-Tg polymer dielectric of FIGS. 27a-27c.
Figure 27E:
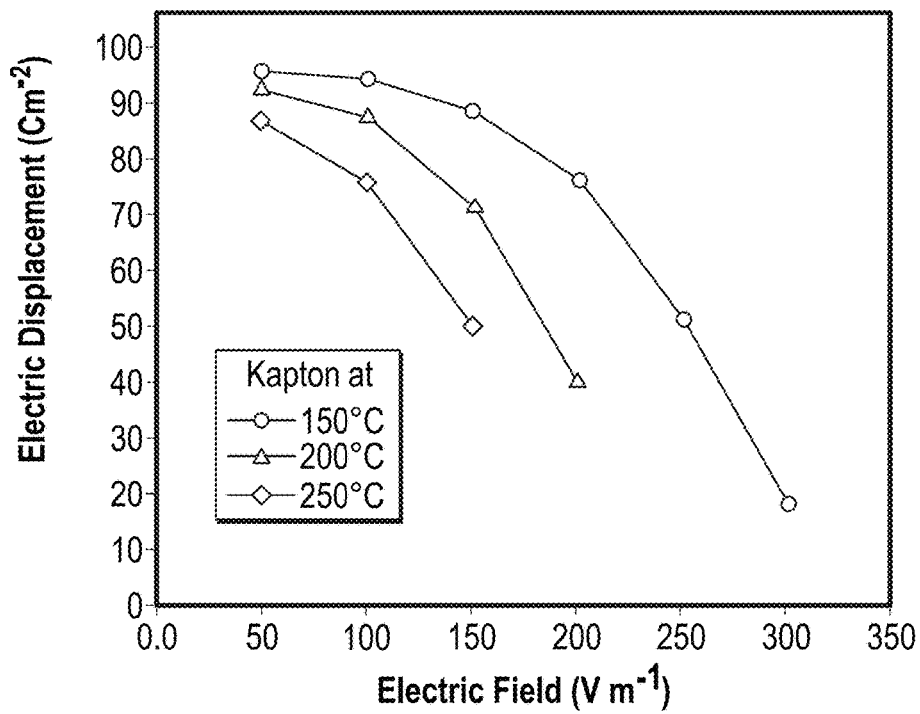
FIG. 27e is a graph of discharged energy density and charge-discharge efficiency, respectively, versus electric field, for the conventional high-Tg polymer dielectric of FIGS. 27a-27c.
Figure 27F:
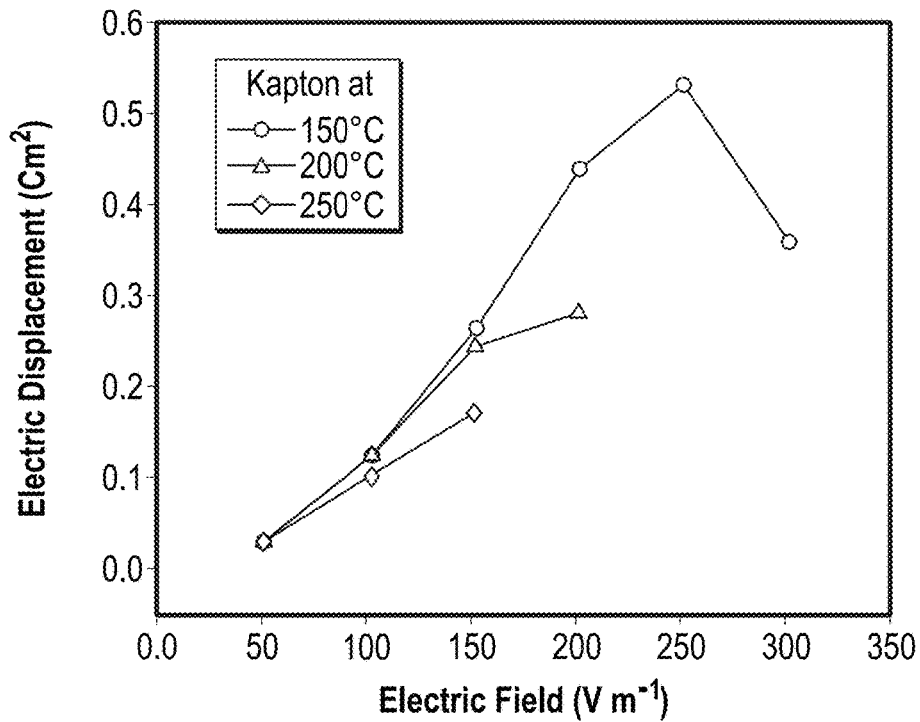
FIG. 27f is a graph of discharged energy density and charge-discharge efficiency, respectively, versus electric field, for the conventional high-Tg polymer dielectric of FIGS. 27a-27c.
Figure 28A:
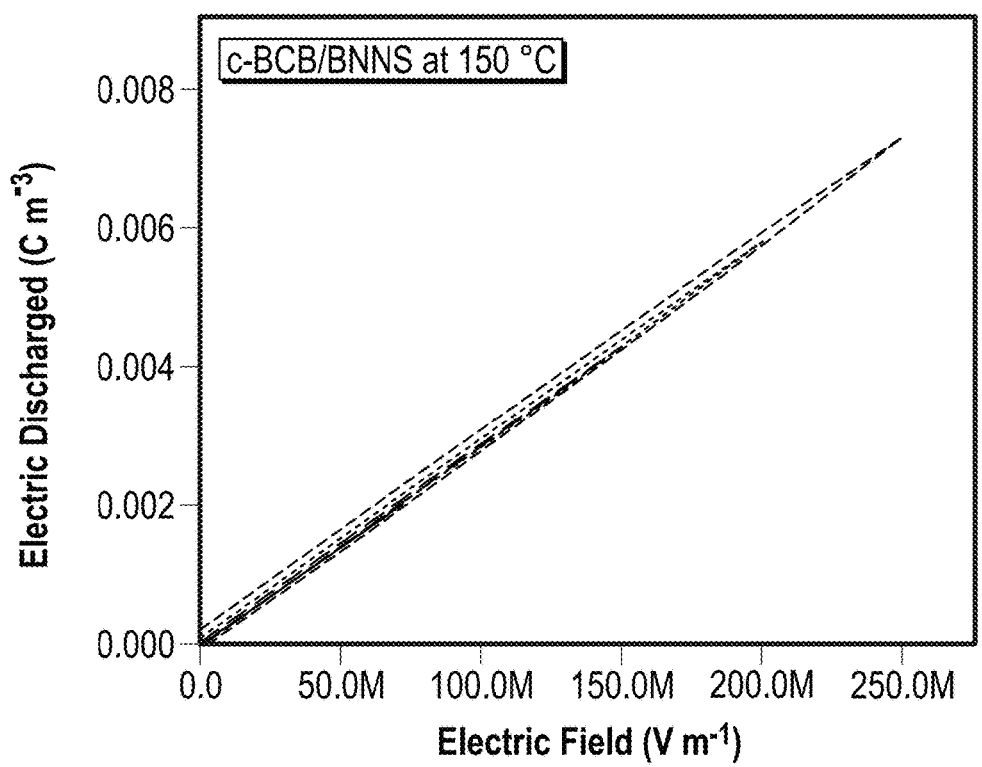
FIG. 28a is a graph of electric field-electric displacement loops for a dielectric composite according to some embodiments.
Figure 28B:
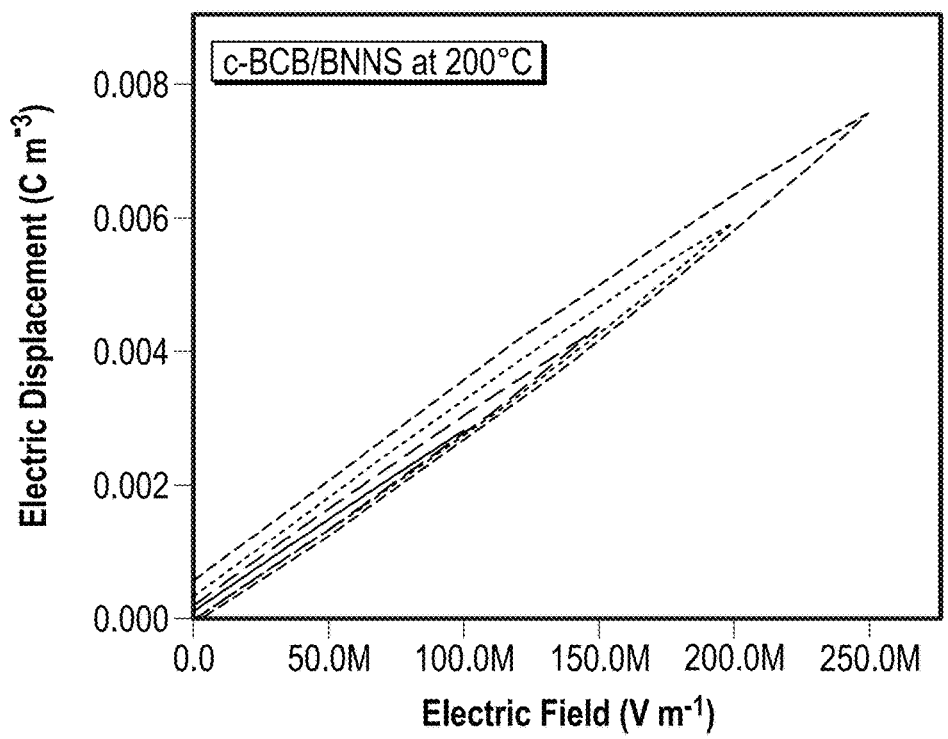
FIG. 28b is a graph of electric field-electric displacement loops for a dielectric composite according to some embodiments.
Figure 28C:
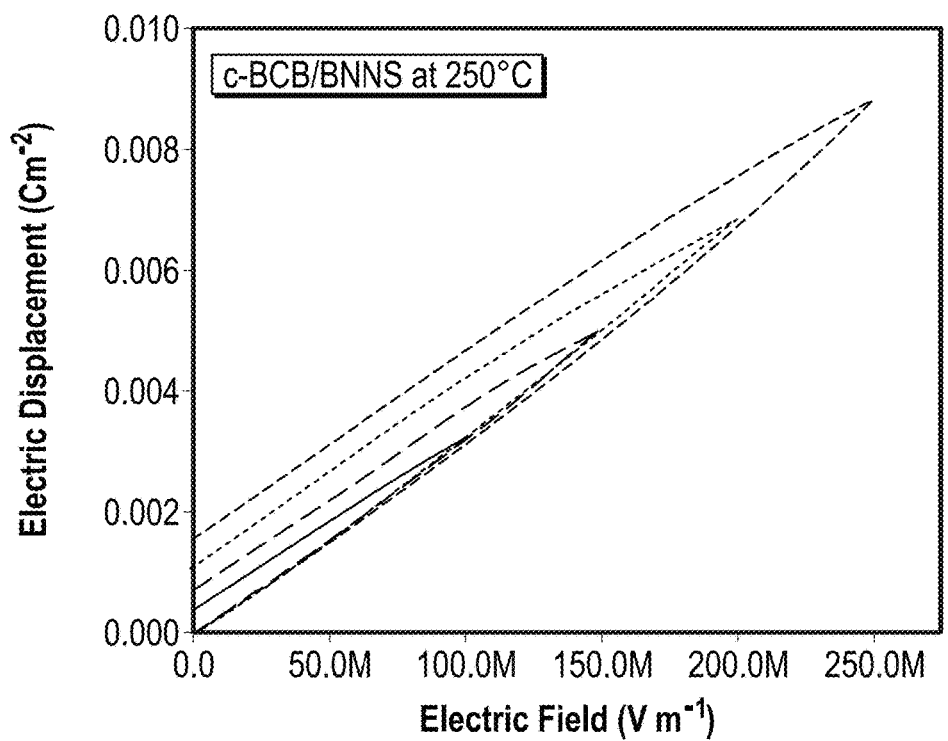
FIG. 28c is a graph of electric field-electric displacement loops for a dielectric composite according to some embodiments.
Figure 28D:
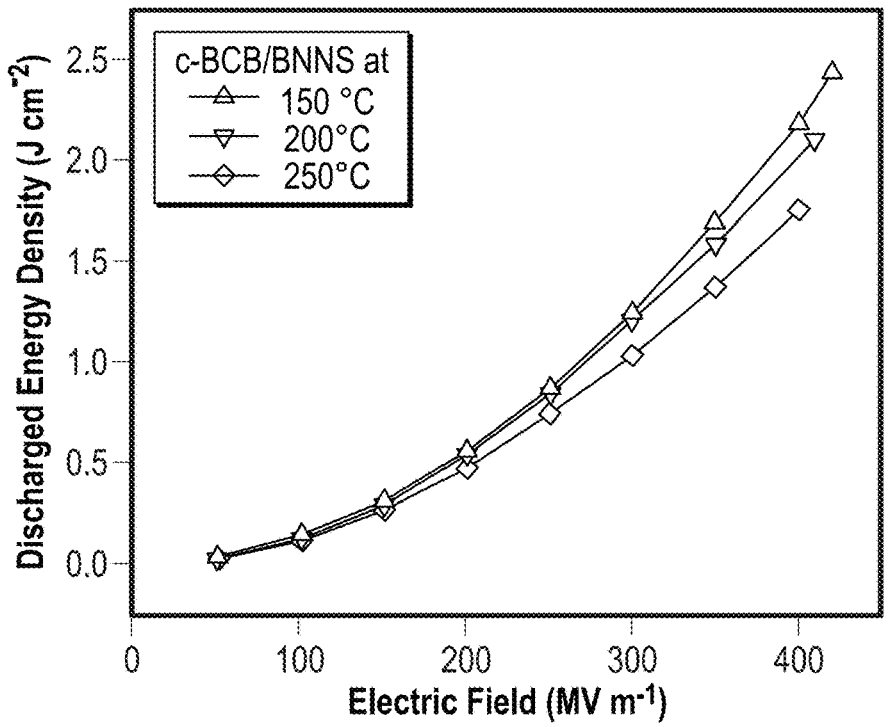
FIG. 28d is a graph of discharged energy density and charge-discharge efficiency, respectively, versus electric field, for the dielectric composite of FIGS. 28a-28c.
Figure 28E:
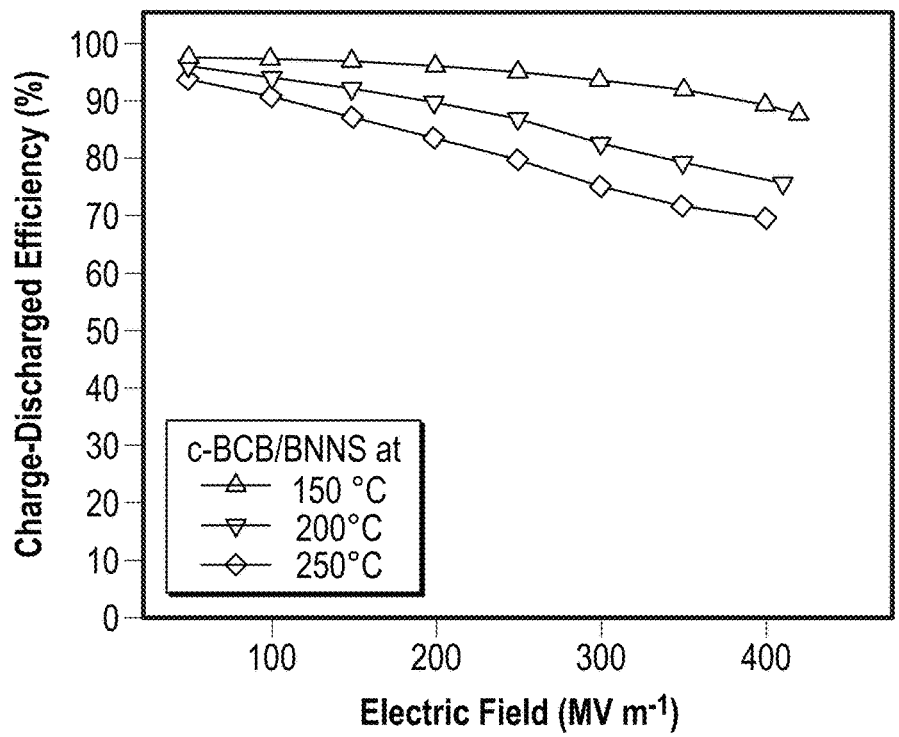
FIG. 28e is a graph of discharged energy density and charge-discharge efficiency, respectively, versus electric field, for the dielectric composite of FIGS. 28a-28c.

FIG. 23a-23c are graphs of D-E loops, discharged energy density, and charge-discharge efficiency, respectively, of PC at 150° C. FIG. 24a-24c are graphs of D-E loops, discharged energy density, and charge-discharge efficiency, respectively, of PEEK at 150° C. FIGS. 25a-25b are graphs of D-E loops, FIG. 25c is a graph of discharged energy density, and FIG. 25d is a graph of the charge-discharge efficiency of PEI at elevated temperatures. FIGS. 26a-26c are graphs of D-E loops, FIG. 26d is a graph of discharged energy density, and FIG. 26e is a graph of the charge-discharge efficiency of FPE at elevated temperatures. FIGS. 27a-27c are graphs of D-E loops, FIG. 27d is a graph of discharged energy density, and FIG. 27e is a graph of the charge-discharge efficiency of Kapton at elevated temperatures. FIGS. 28a-28c are graphs of D-E loops, FIG. 28d is a graph of discharged energy density, and FIG. 28e is a graph of the charge-discharge efficiency of one embodiment of the c-BCB/BNNS dielectric composite with 10 vol % BNNSs at elevated temperatures.

Figure 29A:
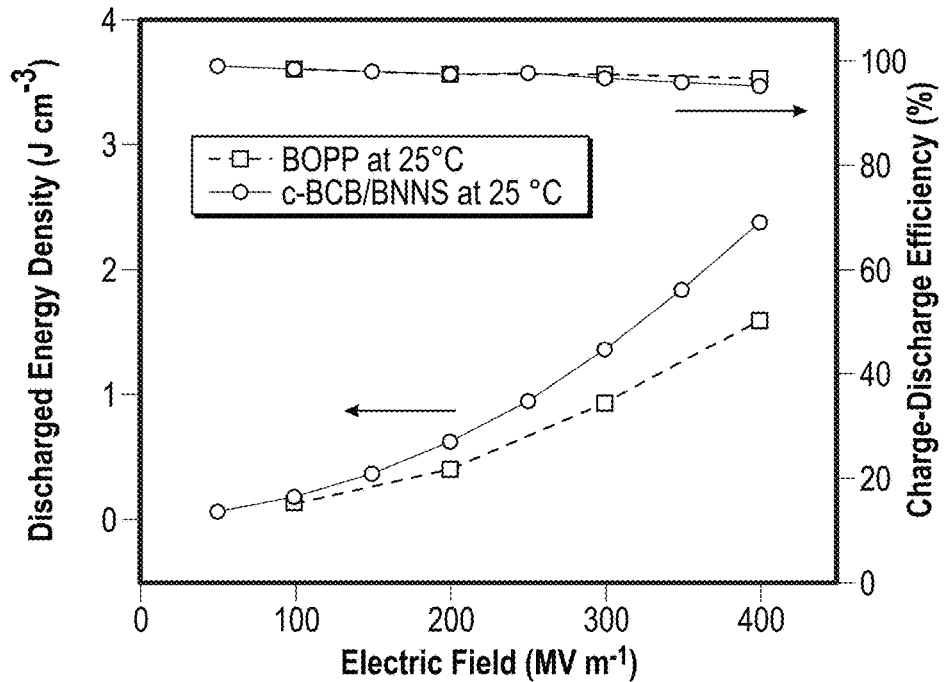
FIG. 29a is a graph of the discharged energy density and charge-discharge efficiency versus electric field for one conventional polymer dielectric material and a dielectric composite film according to some embodiments, at various temperatures.
Figure 29B:
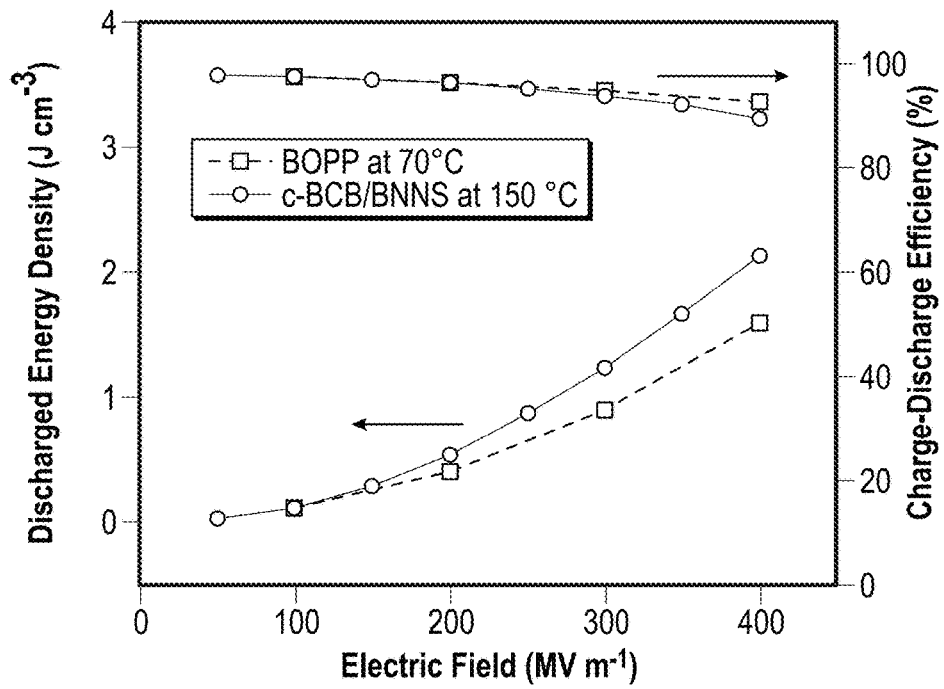
FIG. 29b is a graph of the discharged energy density and charge-discharge efficiency versus electric field for one conventional polymer dielectric material and a dielectric composite film according to some embodiments, at various temperatures.

FIGS. 29a-29b show the discharged energy density and charge-discharge efficiency of BOPP and one embodiment of the c-BCB/BNNS dielectric composite with 10 vol % of BNNSs derived from D-E loops at room temperature and elevated temperature, respectively. At room temperature, the c-BCB/BNNS dielectric composite shows higher discharged energy density and very similar charge-discharge efficiency relative to BOPP at comparable fields. It has been discovered that at 150° C. and under a field of 200 MVm$^{-1}$, the c-BCB/BNNS dielectric composite still displays higher discharged energy density and very similar charge-discharge efficiency relative to those of BOPP measured at 70° C. and 200 MVm$^{-1}$. Since film capacitors in the power inverter of electric vehicles are usually operated under 200 MVm$^{-1}$, this data indicates that by replacing BOPP with BCB/BNNS, the secondary cooling system for capacitors in electric vehicles may be not be necessary, as discussed above.

Figure 30:
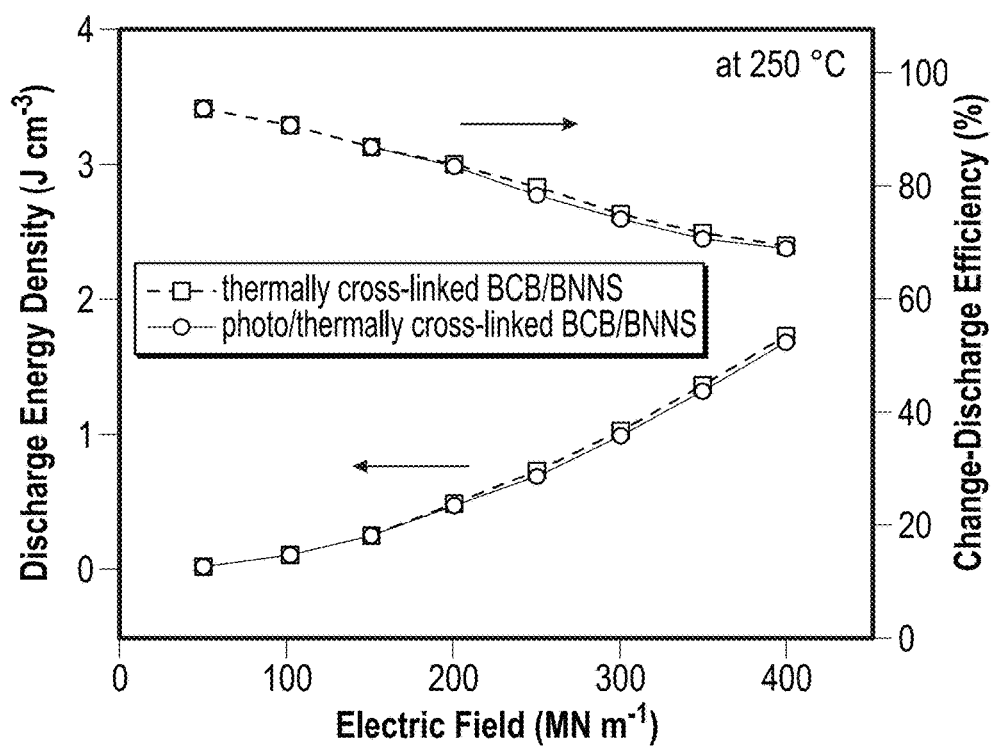
FIG. 30 is a graph of the discharged energy density and charge-discharge efficiency versus electric field for thermally and photo-cross-linked dielectric composite films according to some embodiments.

As discussed above, in some embodiments, a c-BCB/BNNS dielectric composite polymer composite may be photo-cross-linked, and therefore may be photo-patternable. It has been discovered that the dielectric properties of photo-cross-linked the c-BCB/BNNS dielectric composite films do not differ substantially from thermally cross-linked films. FIG. 30 shows the discharged energy density and charge-discharge efficiency of thermally cross-linked BCB/BNNS and photo/thermally cross-linked BCB/BNNS with 10 vol % of BNNSs at 250° C.

Mechanical Flexibility and Strength

Figure 31:
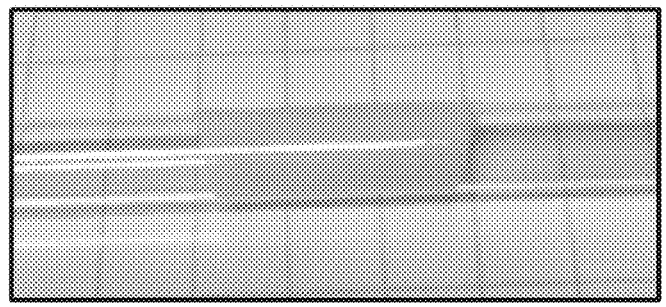
FIG. 31 is a photograph of a winding test of dielectric composite films according to some embodiments.
Figure 32A:
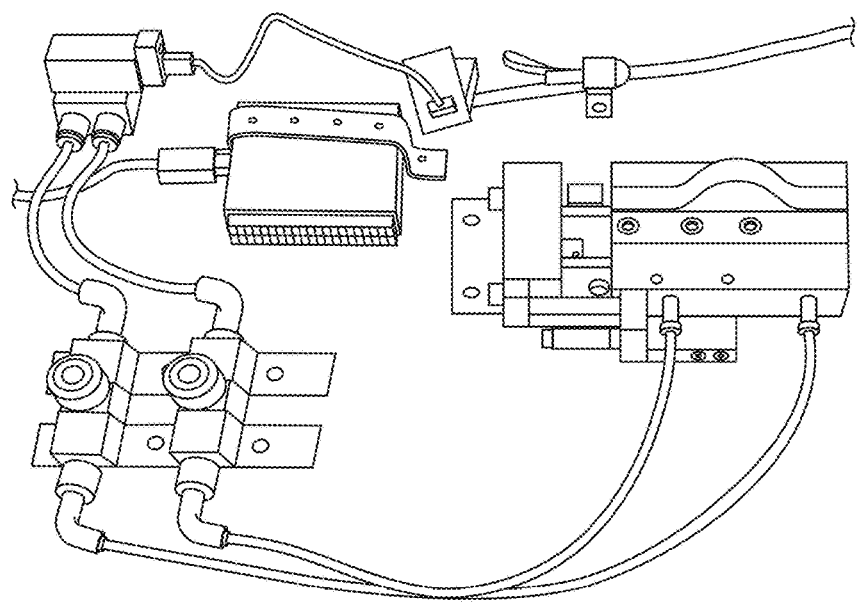
FIG. 32a is a photograph of an experimental setup for a bending test of dielectric composite films according to some embodiments.
Figure 32B:
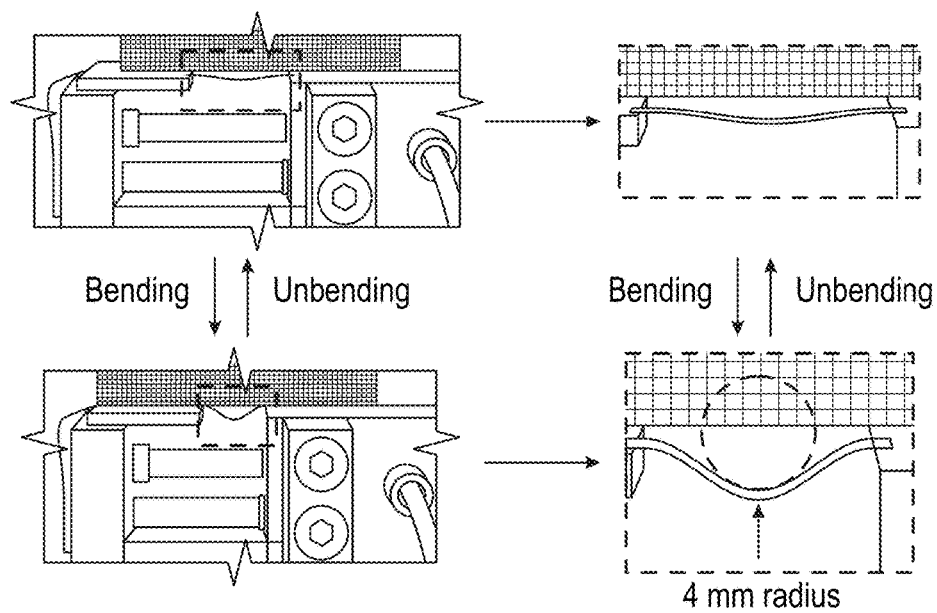
FIG. 32b depicts photographs of bending tests of dielectric composite films according to some embodiments.
Figure 33:
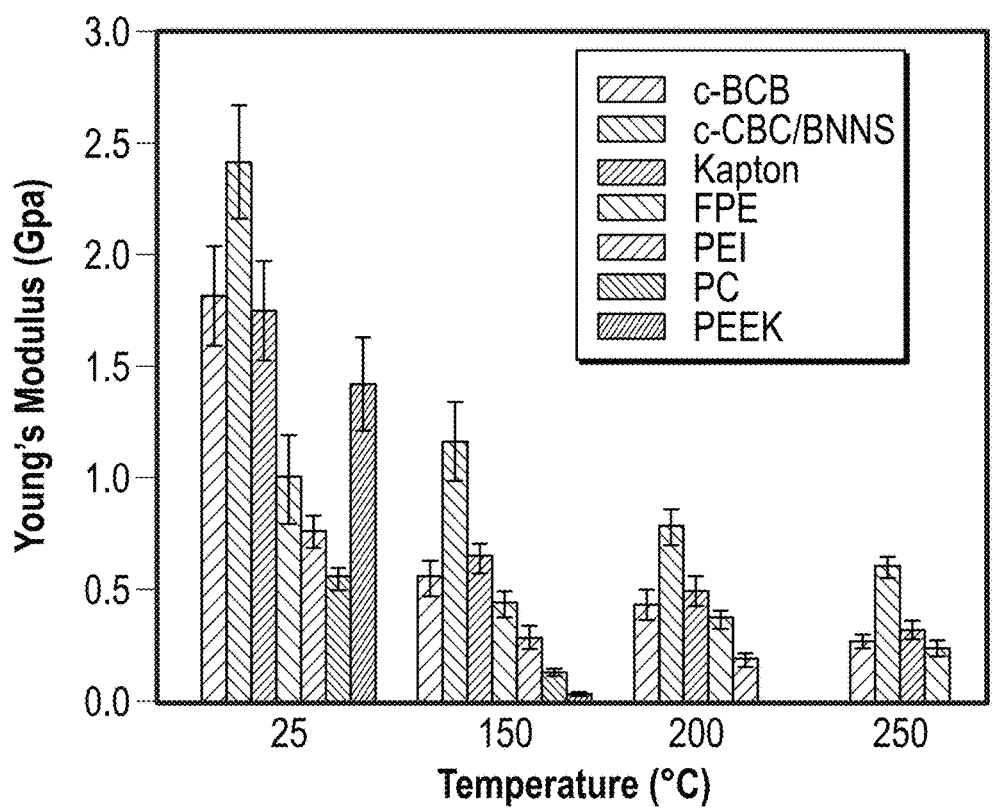
FIG. 33 is a graph of the dependence of the Young's modulus on temperature of conventional high-Tg polymer dielectrics and polymer dielectrics according to some embodiments.

Two tests were performed on embodiments of the c-BCB/BNNS dielectric composite films (12 μm thick) with 10 vol % of BNNSs in order to assess their mechanical flexibility and strength. The first is winding test, in which the c-BCB/BNNS dielectric composite film strip is wrapped on a glass tube with a 4 mm diameter, and the coiled state is held for 120 hours. FIG. 31 is a photograph of a winding test in which one embodiment of a the c-BCB/BNNS dielectric composite film with 10 vol % of BNNSs is wrapped on a glass tube for three turns. The second is a bending test, in which the BCB/BNNS film strip is repeatedly bent and unbent for 20,000 rounds; each round is programmed to be accomplished in 5 seconds. FIGS. 32a-32b are photographs of the experimental setup for the bending test and one bending and unbending cycle, respectively. FIG. 33 is a plot of the Young's moduli of the the c-BCB/BNNS dielectric composite film with 10 vol % of BNNSs and the other high-$T_g$ polymer dielectrics at different temperatures.

Figure 34A:
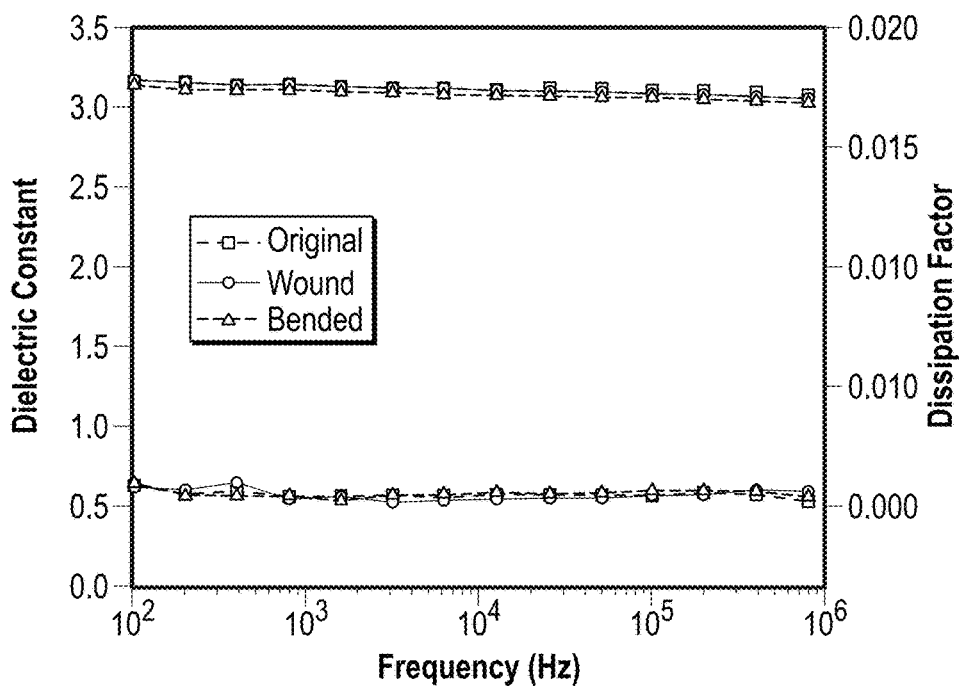
FIG. 34a depicts the dielectric response of dielectric composite films according to some embodiments after winding and bending tests.
Figure 34B:
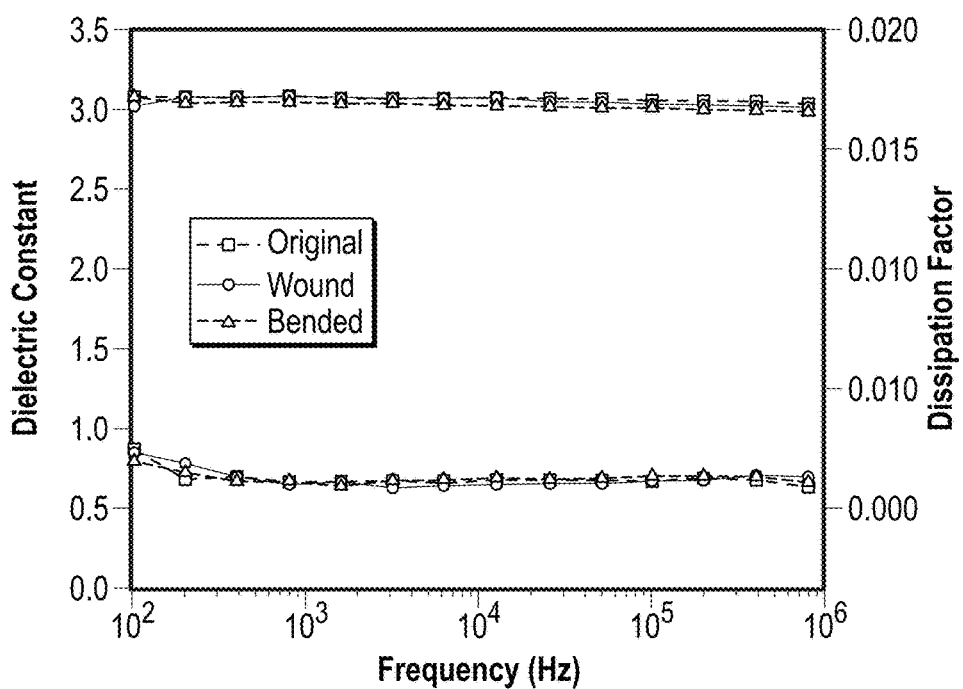
FIG. 34b depicts the dielectric response of dielectric composite films according to some embodiments after winding and bending tests.
Figure 35A:
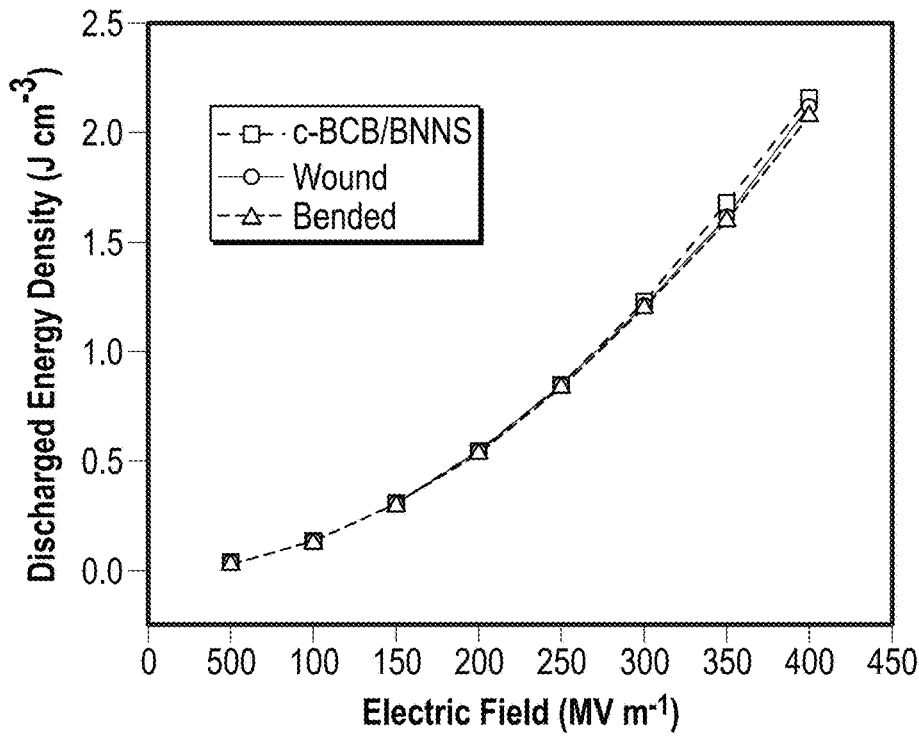
FIG. 35a is a graph of the discharged energy density and charge-discharge efficiency, respectively, versus electric field, measured at 15° C., for dielectric composite films according to some embodiments after winding and bending tests.
Figure 35B:
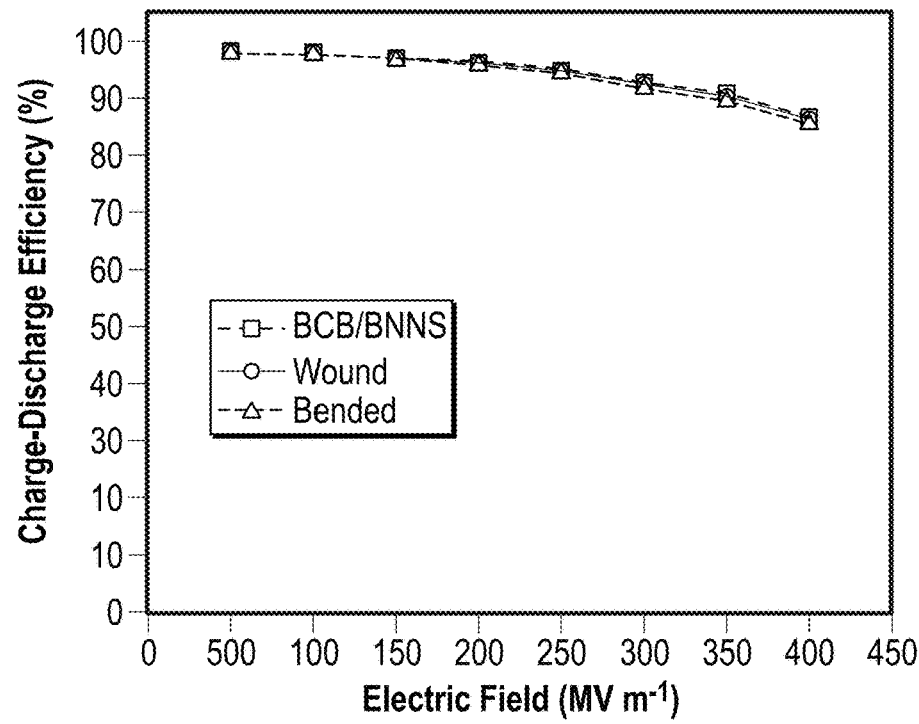
FIG. 35b is a graph of the discharged energy density and charge-discharge efficiency, respectively, versus electric field, measured at 150° C., for dielectric composite films according to some embodiments after winding and bending tests.
Figure 35C:
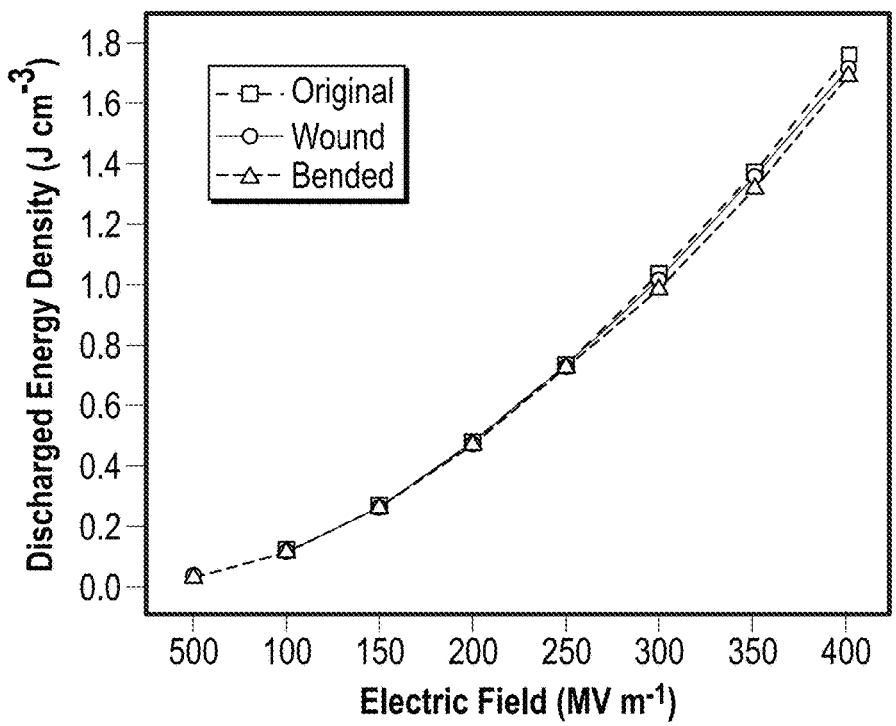
FIG. 35c is a graph of the discharged energy density and charge-discharge efficiency, respectively, versus electric field, measured at 250° C., for dielectric composite films according to some embodiments after winding and bending tests.
Figure 35D:
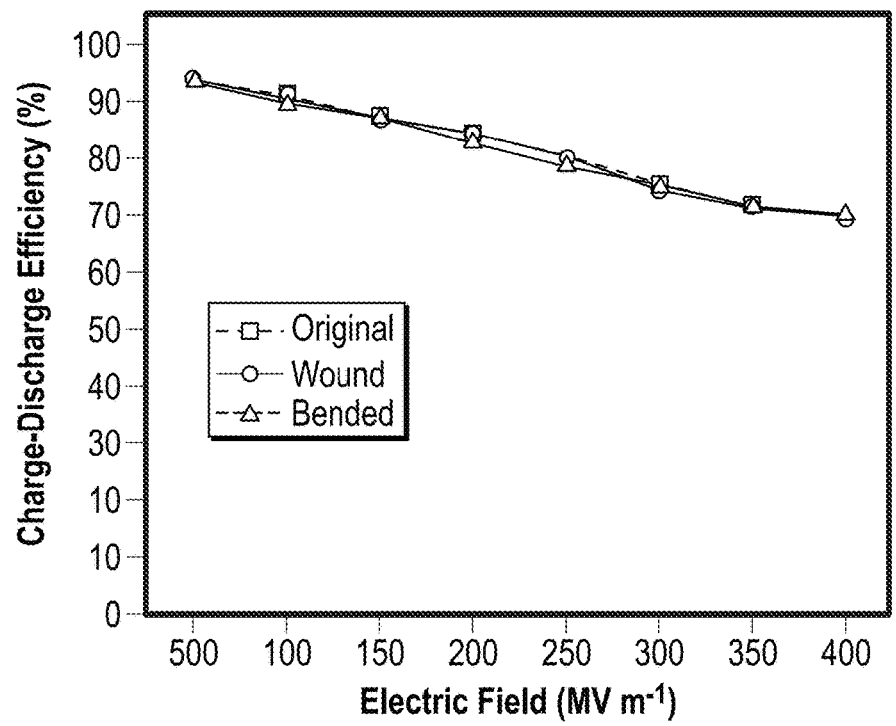
FIG. 35d is a graph of the discharged energy density and charge-discharge efficiency, respectively, versus electric field, measured at 250° C., for dielectric composite films according to some embodiments after winding and bending tests.
Figure 36A:
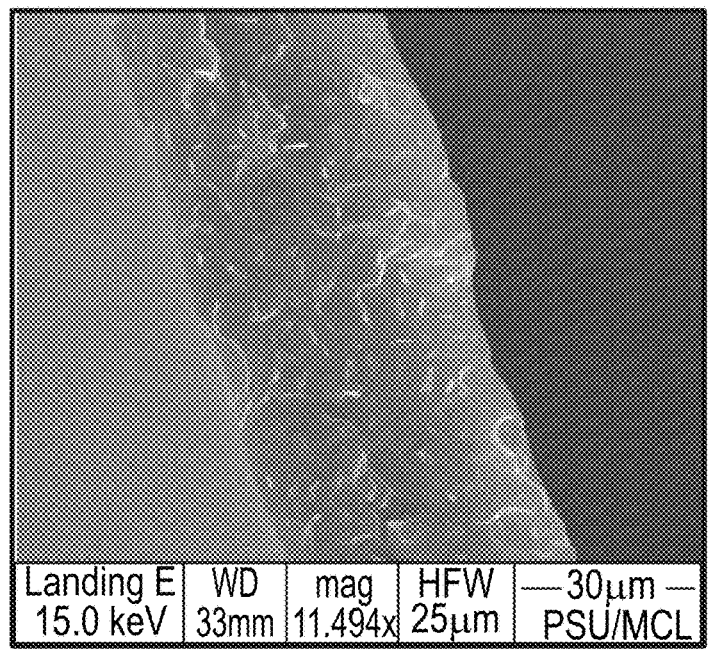
FIG. 36a shows SEM images of dielectric composite films according to some embodiments after winding and bending tests.
Figure 36B:
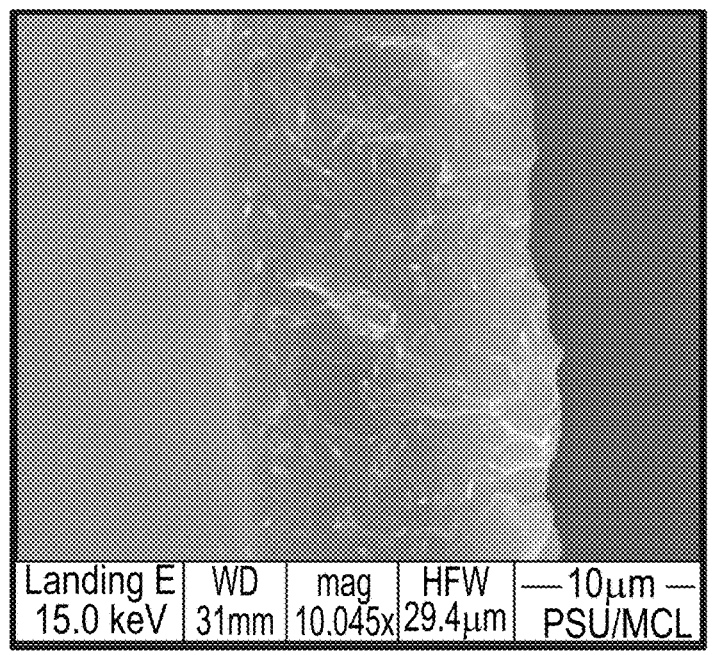
FIG. 36b shows SEM images of dielectric composite films according to some embodiments after winding and bending tests.

The dielectric stability of the wound and bended materials was investigated by studying the frequency dependent dielectric properties at both room temperature and elevated temperature. The results, as shown in FIG. 34a for 25° C. and FIG. 34b for 250° C., indicate that both the wound sample and bended sample possess almost the same dielectric stability to the original the c-BCB/BNNS dielectric composite material. High-temperature high-electric-field performances of all the samples were studied by conducting a charge-discharge experiment at 150° C. and 250° C. as a function of electric fields. FIG. 35 depicts graphs of the discharged energy density and charge-discharge efficiency for one embodiment of a the c-BCB/BNNS dielectric composite film with 10 vol % of BNNSs before and after winding and bending tests, measured at 150° C. (FIGS. 35a and 35b) and at 250° C. (FIGS. 35c and 35d). Moreover, FIG. 36 depicts cross-sectional SEM images of the the c-BCB/BNNS dielectric composite film with 10 vol % of BNNSs after winding (FIG. 36a) and after bending (FIG. 36b); no detectable cracks or flaws after winding and bending were found. In view of the above, it is found that embodiments of the c-BCB/BNNS dielectric composite materials are flexible, and that winding and bending does not affect the energy storage capabilities or dielectric response.

It is to be noted that all ranges detailed herein include the endpoints. Numerical values from different ranges are combinable.

The transition term comprising encompasses the transition terms "consisting of" and "consisting essentially of".

The term "and/or" includes both "and" as well as "or". For example, "A and/or B" is interpreted to be A, B, or A and B.

While the invention has been described with reference to some embodiments, it will be understood by those skilled in the art that various changes may be made and equivalents may be substituted for elements thereof without departing from the scope of the invention. In addition, many modifications may be made to adapt a particular situation or material to the teachings of the invention without departing from essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A dielectric composite comprising:
an organic polymer that has a glass transition temperature greater than or equal to about 250° C.; where the organic polymer is a crosslinked polymer, and where the crosslinked polymer is crosslinked divinyltetramethyldisiloxane-bis(benzocyclobutene) having the structure (2):

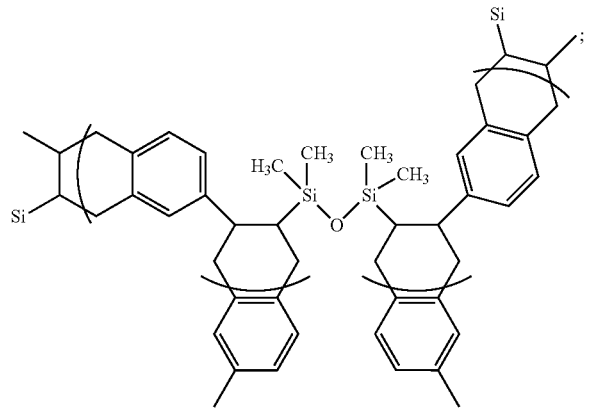

(2)

and
a dielectric filler present in an amount effective to impart to the dielectric composite a dielectric constant that varies by less than 5% over a temperature range of 25° C. to 300° C., with an applied alternating electric field having a frequency of $10^4$ Hz and a maximum operating electric field strength of at least 250 megavolt per meter.

2. The dielectric composite of claim 1, where the dielectric filler is a metal oxide, a metal carbide, a metal oxycarbide, a metal nitride, a metal oxynitride, a metal boride, a metal borocarbide, a boronitride, a metal silicide, a metal iodide, a metal bromide, a metal sulfide, a metal selenide, a metal telluride, a metal fluoride, a metal borosilicide or a combination thereof.

3. The dielectric composite of claim 1, where the dielectric filler is alumina, magnesia, zirconia, titania, antimony tin oxide, calcium copper titanate, lead titanate, lead magnesium titanate, barium neodymium titanate, lead zirconium titanate, strontium titanate, calcium titanate, boron nitride, hexagonal boron nitride, aluminum nitride, silicon nitride, silicon carbide, diamond of natural or synthetic origin, or a combination thereof.

4. The dielectric composite of claim 1, where the dielectric filler is exfoliated hexagonal boron nitride and exfoliated boron nitride.

5. The dielectric composite of claim 1, where the dielectric filler is present in the dielectric composite in an amount of 5 to 30 weight percent, based on the total weight of the dielectric composite.

6. The dielectric composite of claim 1, where the organic polymer is used in amounts of 70 to 95 weight percent, based on a total weight of the dielectric composite.

7. The dielectric composite of claim 1, wherein the maximum operating electric field strength is at least 350 megavolt per meter.

8. The dielectric composite of claim 1, wherein the dielectric constant varies by less than 2% over a temperature range of 25° C. to 300° C., with an applied alternating electric field having a frequency of $10^4$ Hz.

9. The dielectric composite of claim 1, wherein the dielectric constant varies by less than 2% over a temperature range of 25° C. to 300° C., with an applied direct bias electric field of 50 megavolt per meter.

10. An article comprising the composite of claim 1.

11. A method of manufacturing a dielectric composite comprising:
blending an organic polymer that has a glass transition temperature greater than or equal to about 250° C.; and a dielectric filler to produce the dielectric composite; where the dielectric filler is present in an amount effective to impart to the dielectric composite a dielectric constant that varies by less than 5% over a temperature range of 25° C. to 300° C., with an applied alternating electric field having a frequency of $10^4$ Hz and a maximum operating electric field strength of at least 250 megavolt per meter; where the organic polymer is crosslinked divinyltetramethyldisiloxane-bis(benzocyclobutene) having the structure (2):

(2)

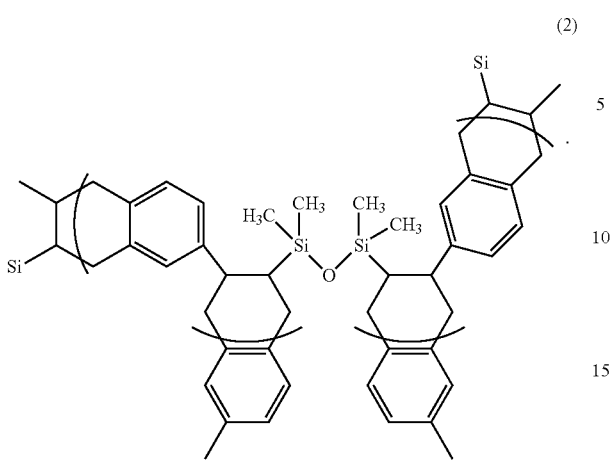

12. The method of claim 11, where the dielectric filler is exfoliated boron nitride and/or exfoliated hexagonal boron nitride.

13. The method of claim 11, where the blending comprises dry blending, solution blending and/or melt blending.

14. The method of claim 13, further comprising molding the dielectric composite.

15. A capacitor comprising:
   a first electrode;
   a second electrode; and
   a dielectric composite comprising an organic polymer that has a glass transition temperature greater than or equal to about 250° C.; and a dielectric filler present in an amount effective to impart to the dielectric composite a dielectric constant that varies by less than 5% over a temperature range of 25° C. to 300° C., with an applied alternating electric field having a frequency of $10^4$ Hz and a maximum operating electric field strength of at least 250 megavolt per meter; and where the organic polymer is crosslinked divinyltetramethyldisiloxane-bis(benzocyclobutene) having the structure (2):

(2)

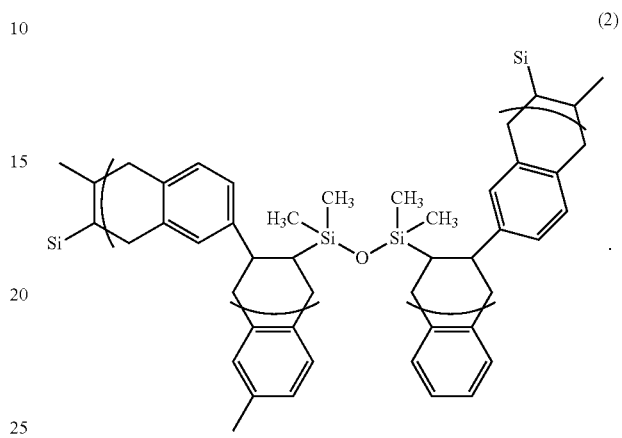

16. The capacitor of claim 15, wherein the dielectric filler is exfoliated boron nitride and/or exfoliated hexagonal boron nitride.

17. The capacitor of claim 15, wherein the dielectric composite has a concentration of boron nitride nanosheets in an amount of about 10% by volume.

* * * * *